(12) United States Patent
Fujita

(10) Patent No.: US 8,787,083 B2
(45) Date of Patent: Jul. 22, 2014

(54) MEMORY CIRCUIT

(75) Inventor: Masashi Fujita, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 349 days.

(21) Appl. No.: 13/365,999

(22) Filed: Feb. 3, 2012

(65) Prior Publication Data

US 2012/0206956 A1    Aug. 16, 2012

(30) Foreign Application Priority Data

Feb. 10, 2011  (JP) .................................. 2011-027114
May 20, 2011  (JP) .................................. 2011-113252

(51) Int. Cl.

| | | |
|---|---|---|
| G11C 11/34 | (2006.01) | |
| G11C 14/00 | (2006.01) | |
| G11C 7/00 | (2006.01) | |
| G11C 5/00 | (2006.01) | |
| G11C 5/06 | (2006.01) | |
| H01L 29/788 | (2006.01) | |
| H01L 29/792 | (2006.01) | |

(52) U.S. Cl.
CPC ............. *G11C 11/34* (2013.01); *G11C 14/00* (2013.01); *G11C 7/00* (2013.01); *G11C 5/005* (2013.01); *G11C 5/06* (2013.01); *H01L 29/788* (2013.01); *H01L 29/792* (2013.01)
USPC .......... 365/185.08; 365/72; 365/154

(58) Field of Classification Search
CPC .......... G11C 11/34; G11C 14/00; G11C 7/00; G11C 5/005; G11C 5/06; H01L 29/788; H01L 29/792

USPC .............. 365/185.08, 72, 154, 189.11, 191
See application file for complete search history.

(56) References Cited

U.S. PATENT DOCUMENTS

| 5,218,607 A | 6/1993 | Saito et al. |
|---|---|---|
| 5,731,856 A | 3/1998 | Kim et al. |

(Continued)

FOREIGN PATENT DOCUMENTS

| EP | 0 404 061 A2 | 12/1990 |
|---|---|---|
| EP | 1 737 044 A1 | 12/2006 |

(Continued)

OTHER PUBLICATIONS

Toshio Kamiya et al.; "Carrier Transport Properties and Electronic Structures of Amorphous Oxide Semiconductors: The present status"; Solid State Physics; Sep. 1, 2009; pp. 621-633; vol. 44, No. 9; Agne Gijutsu Center (w/full English language translation).

(Continued)

*Primary Examiner* — Toan Le
(74) *Attorney, Agent, or Firm* — Fish & Richardson P.C.

(57) ABSTRACT

While the supply of power is stopped, a data signal that has been held in a volatile memory section can be held in a nonvolatile memory section. In the nonvolatile memory section, a transistor having an extremely low off-state current allows a data signal to be held in the capacitor for a long period of time. Thus, the nonvolatile memory section can hold the logic state even while the supply of power is stopped. When the supply of power is started again, the data signal that has been held in the capacitor while the supply of power has been stopped is set at such a potential that malfunction does not occur by turning on the reset circuit.

21 Claims, 33 Drawing Sheets

(56) References Cited

U.S. PATENT DOCUMENTS

| | | | |
|---|---|---|---|
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,559,220 B2* | 10/2013 | Yamazaki et al. | 365/184 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0019460 A1* | 1/2007 | Kang et al. | 365/145 |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0175096 A1* | 7/2009 | Kitazaki et al. | 365/189.11 |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0176348 A1* | 7/2011 | Yamazaki et al. | 365/72 |

FOREIGN PATENT DOCUMENTS

| | | |
|---|---|---|
| EP | 2 226 847 A2 | 9/2010 |
| JP | 58-205226 A | 11/1983 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-027419 A | 2/1991 |
| JP | 05-251705 A | 9/1993 |
| JP | 08-264794 A | 10/1996 |
| JP | 10-078836 A | 3/1998 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Sanghun Jeon et al.; "180nm Gate Length Amorphous InGaZnO Thin Film Transistor for High Density Image Sensor Applications"; IEDM 10: Technical Digest of International Electron Devices Meeting; Dec. 6, 2010; pp. 504-507.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for Amoled Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

(56) References Cited

OTHER PUBLICATIONS

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancles in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MoO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] At Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMCLD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure." NIRIM Newsletter, Mar. 1995, vol. 150, pp. 1-4 with English translation.

Nakamura, M et al., "The phase relations in the In2O3-Ga2ZnO4-ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

(56) References Cited

OTHER PUBLICATIONS

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVQA AMOLED Display Using In-Ga-Zn-Oxide TFTs With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652

Sakata, J et al., "Development of 4.0-In. AMOLED Display With Driver Circuit Using Amorphous In-Ga-Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous Gizo (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of Igzo Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

* cited by examiner

FIG. 18A
FIG. 18B
FIG. 18C
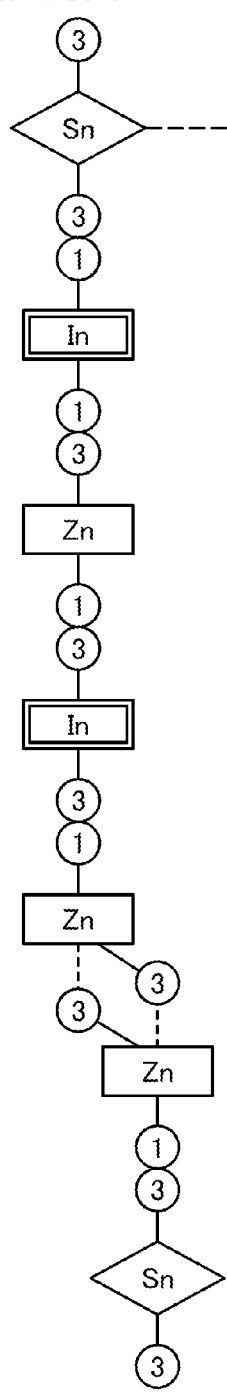
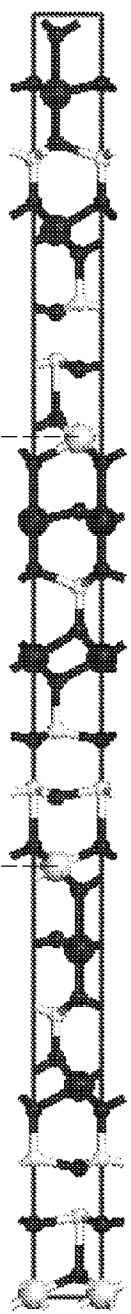
- In
- Sn
- Zn
- O

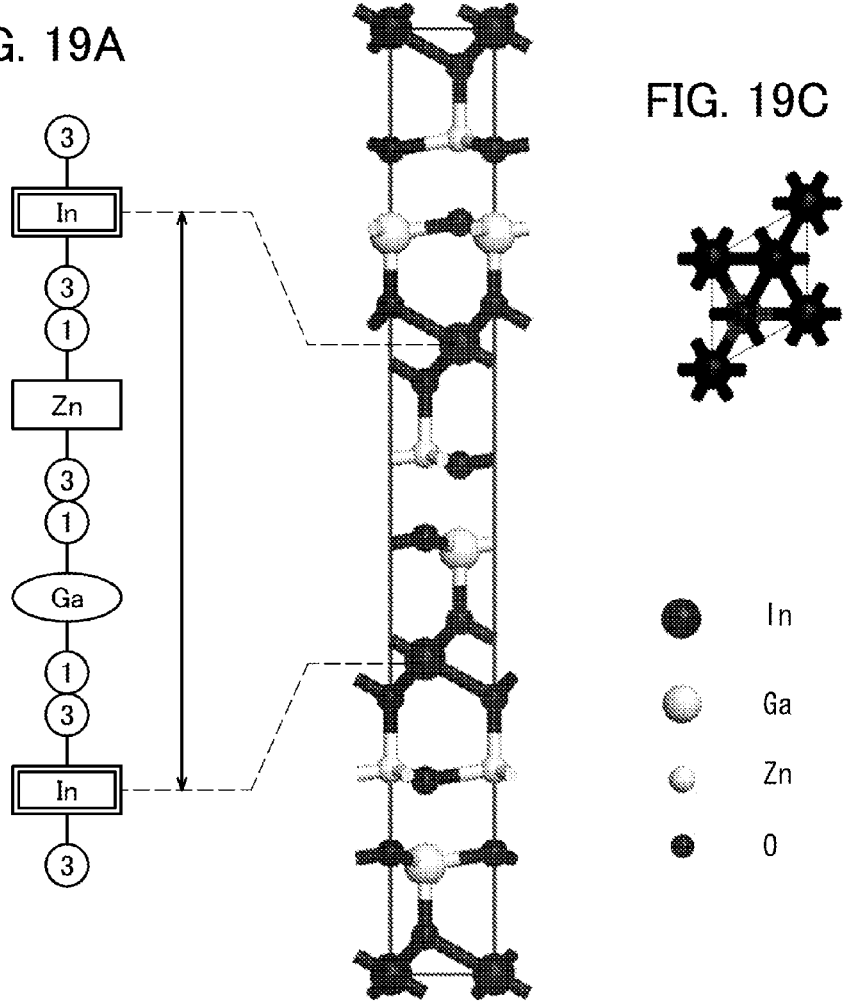

MEMORY CIRCUIT

BACKGROUND OF THE INVENTION

1. Field of the Invention

The present invention relates to a memory circuit in a signal processing unit, in which the logic state is not erased after the power is turned off.

2. Description of the Related Art

Signal processing units such as central processing units (CPUs) vary in structure depending on the intended use. A signal processing unit generally has a main memory for storing data or program and other memory circuits such as a register and a cache memory. A register has a function of temporarily holding a data signal for carrying out arithmetic processing, holding a program execution state, or the like. Meanwhile, a cache memory, which is located between an arithmetic unit and a main memory, is provided to reduce low-speed access to the main memory and speed up the arithmetic processing.

In a memory circuit in a signal processing unit, such as a register or a cache memory, input of a data signal needs to be performed at higher speed than in a main memory. For this reason, in general, a flip-flop or the like is used as a register, and a static random access memory (SRAM) or the like is used as a cache memory. In other words, such a register, a cache memory, or the like is a volatile memory circuit which loses a data signal after the supply of power is stopped.

In order to achieve low power consumption, a method in which the supply of power to a signal processing unit is temporarily stopped while input/output of data signal is not conducted has been suggested (see Patent Document 1, for example). In the method in Patent Document 1, a nonvolatile memory circuit is located in the periphery of a volatile memory circuit such as a register or a cache memory, and the data is temporarily stored in the nonvolatile memory circuit. Thus, the register, the cache memory, or the like in the signal processing unit stores a data signal even while the supply of power is stopped.

In the case where the supply of power to a signal processing unit is stopped for a long time, a data signal in a volatile memory circuit is transferred to an external memory circuit such as a hard disk or a flash memory before the supply of power is stopped, so that the data signal can be prevented from being lost.

REFERENCE

Patent Document

[Patent Document 1] Japanese Published Patent Application No. H10-078836

SUMMARY OF THE INVENTION

The method in which a data signal that has been held in a volatile memory circuit is held in a nonvolatile memory circuit located in the periphery of the volatile memory circuit while the supply of power is stopped involves a complicated process of manufacturing the signal processing unit because the nonvolatile memory circuit is a magnetic memory element or a ferroelectric memory element in many cases.

With the method in which a data signal that has been held in the volatile memory circuit is held in the external memory circuit while the supply of power is stopped, it takes a long time for sending back the data signal from the external memory circuit to the volatile memory circuit. Therefore, backing up a data signal to the external memory circuit is not suitable for the case where the supply of power is stopped for a short time for low power consumption.

In view of the above-described problems, it is an object of one embodiment of the present invention to provide a memory circuit of a signal processing unit which does not involve a complicated manufacturing process and has low power consumption, especially to provide a signal processing circuit having low power consumption achieved by stopping the supply of power for a short time.

An object of one embodiment of the present invention is to provide particularly a memory circuit in a signal processing unit, in which a data signal held while the supply of power is stopped for a short time is set to a potential that does not cause malfunction after the supply of power is started again.

According to one embodiment of the present invention, while the supply of power to the memory circuit is stopped, a data signal that has been held in a memory section which is a volatile memory (hereinafter called volatile memory section) can be held in a memory section which is a nonvolatile memory (hereinafter called a nonvolatile memory section). In the nonvolatile memory section, a transistor whose channel is formed in an oxide semiconductor layer allows a data signal to be held in the capacitor for a long period of time. Thus, the nonvolatile memory section can hold the logic state of the data signal even while the supply of power is stopped. When the supply of power is started again, the data signal that has been held in the capacitor while the supply of power has been stopped is set at such a potential that malfunction does not occur by turning on the reset circuit.

One embodiment of the present invention is a memory circuit of a signal processing unit, including a volatile memory section and a nonvolatile memory section. The nonvolatile memory section includes a first transistor and a second transistor having a gate electrically connected to one of a source and a drain of the first transistor. A data signal supposed to be held in the volatile memory section is, while the volatile memory section stops operating, held between the one of the source and the drain of the first transistor and the gate of the second transistor. The other of the source and the drain of the first transistor is connected to a reset circuit conducting a reset operation whereby a potential between the one of the source and the drain of the first transistor and the gate of the second transistor is made to be at the same level as a low supply potential.

One embodiment of the present invention is a memory circuit of a signal processing unit, including a volatile memory section and a nonvolatile memory section. The nonvolatile memory section includes a first transistor and a second transistor having a gate electrically connected to one of a source and a drain of the first transistor. A data signal supposed to be held in the volatile memory section is, while the volatile memory section stops operating, held between the one of the source and the drain of the first transistor and the gate of the second transistor holds. The other of the source and the drain of the first transistor is connected to a reset circuit conducting a reset operation whereby a potential between the one of the source and the drain of the first transistor and the gate of the second transistor is made to be at the same level as a low supply potential. The other of the source and the drain of the first transistor is connected to a switching circuit configured to break electrical continuity between an input terminal of the nonvolatile memory section and the other of the source and the drain of the first transistor during the reset operation.

One embodiment of the present invention is a memory circuit of a signal processing unit, including a volatile memory section and a nonvolatile memory section. The nonvolatile memory section includes a first transistor and a second transistor having a gate electrically connected to one of a source and a drain of the first transistor. A data signal supposed to be held in the volatile memory section is, while the volatile memory section stops operating, held between the one of the source and the drain of the first transistor and the gate of the second transistor holds. The other of the source and the drain of the first transistor is connected to a reset circuit conducting, with the help of a first control signal and a second control signal, a reset operation whereby a potential between the one of the source and the drain of the first transistor and the gate of the second transistor is made to be at the same level as a low supply potential.

One embodiment of the present invention is a memory circuit of a signal processing unit, including a volatile memory section and a nonvolatile memory section. The nonvolatile memory section includes a first transistor whose channel is formed in a semiconductor layer containing an oxide semiconductor, and a second transistor having a gate electrically connected to one of a source and a drain of the first transistor. A data signal supposed to be held in the volatile memory section is, while the volatile memory section stops operating, held between the one of the source and the drain of the first transistor and the gate of the second transistor holds. The other of the source and the drain of the first transistor is connected to a reset circuit conducting, with the help of a first control signal and a second control signal, a reset operation whereby a potential between the one of the source and the drain of the first transistor and the gate of the second transistor is made to be at the same level as a low supply potential. The other of the source and the drain of the first transistor is connected to a switching circuit configured to broke electrical continuity between an input terminal of the nonvolatile memory section and the other of the source and the drain of the first transistor during the reset operation.

In one embodiment of the present invention, the switching circuit may include a logic circuit supplied with the first control signal and the second control signal, and an analog switch turned on or off by the logic circuit.

In one embodiment of the present invention, the reset circuit may include a logic circuit supplied with the first control signal and the second control signal, and an analog switch turned on or off by the logic circuit.

In one embodiment of the present invention, the memory circuit may include a selector circuit configured to selectively store the data signal in the volatile memory section or the nonvolatile memory section, and the selector circuit may include a logic circuit supplied with the first control signal and the second control signal, and an analog switch configured to turn on or off the volatile memory section or the nonvolatile memory section selected by the logic circuit.

In one embodiment of the present invention, the first transistor may be a transistor whose channel is formed in a semiconductor layer containing an oxide semiconductor.

In one embodiment of the present invention, the second transistor may be a transistor whose channel is formed in a silicon layer or a silicon substrate.

In one embodiment of the present invention, the second transistor may form a layered structure with the first transistor.

In one embodiment of the present invention, power consumption can be reduced without a complicated manufacturing process. In one embodiment of the present invention, power consumption can be reduced by stopping the supply of power for a short time.

In one embodiment of the present invention, the data signal that has been held while the supply of power is stopped for a short time can be set at such a potential that malfunction does not occur by turning on the reset circuit. This reduces degradation of the transistor due to the fact that the data signal is held in the capacitor.

BRIEF DESCRIPTION OF THE DRAWINGS

FIGS. 18A to 18C are diagrams showing the structure of an oxide semiconductor material according to one embodiment of the present invention.
FIGS. 19A to 19C are diagrams showing the structure of an oxide semiconductor material according to one embodiment of the present invention.

DETAILED DESCRIPTION OF THE INVENTION

Figure 1A:
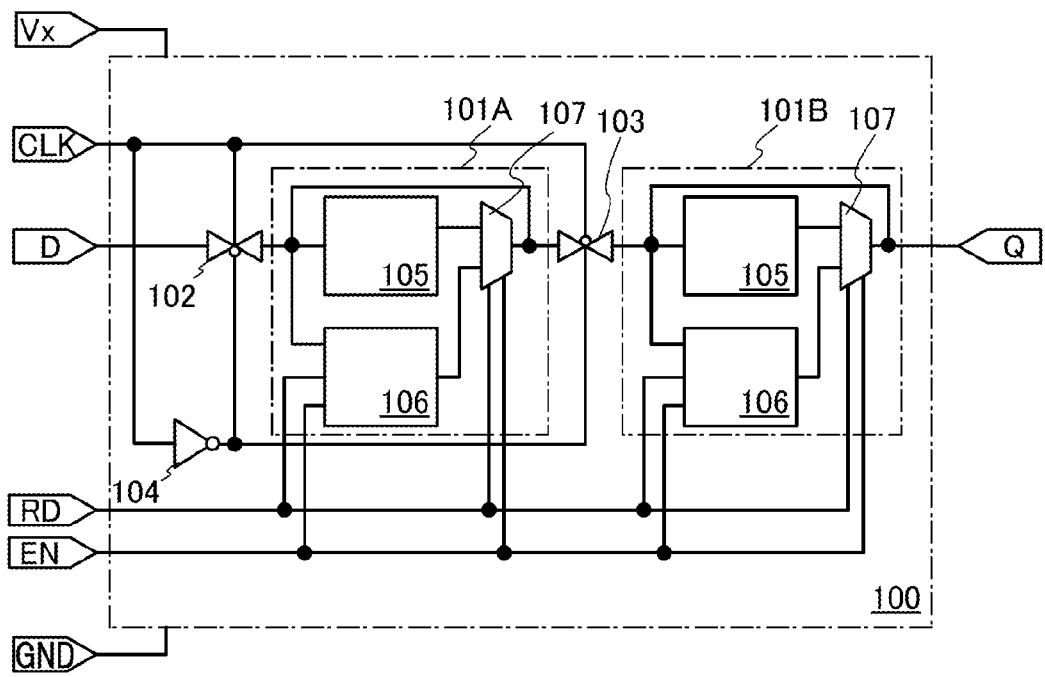
FIGS. 1A and 1B are circuit diagrams of a memory circuit and a nonvolatile memory section, respectively.

Embodiments of the present invention will be described below with reference to the drawings. Note that the structures of the present invention can be implemented in various different ways. It will be readily appreciated by those skilled in the art that modes and details of the embodiments can be modified in various ways without departing from the spirit and scope of the present invention. The present invention therefore should not be construed as being limited to the description of the embodiments.

Note that in the structures of the present invention described below, reference numerals denoting the same portions are used in common in different drawings.

Note that, the size, layer thickness, signal waveform, and region of each object shown in the drawings and the like of the embodiments are exaggerated for simplicity in some cases. Therefore, each object is not necessarily in such scales.

Note that the description that explicitly states "A and B are connected to each other" is intended for the case where A and B are electrically connected to each other; the case where A and B are functionally connected to each other; the case where A and B are directly connected to each other; and the like.

Note that, in this specification, the terms "first", "second", "third", to "N(N is a natural number)" are used only for preventing confusion between components, and thus do not limit numbers.

Embodiment 1

The signal processing unit includes one or more memory circuits that store a data signal of one-bit or multi-bit data. This embodiment describes the configuration of the memory circuit in the signal processing unit.

Note that examples of the signal processing unit according to the preset invention include large scale integrated circuits (LSIs) such as CPUs, microprocessors, image processing circuits, digital signal processors (DSPs), and field programmable gate arrays (FPGAs).

FIG. 1A is an example of a block diagram of a memory circuit. A memory circuit 100 in FIG. 1A includes a first memory 101A, a second memory 101B, a first analog switch 102, a second analog switch 103, and an inverter circuit 104 (also called phase inverter circuit). The first memory 101A and the second memory 101B each include a volatile memory section 105, a nonvolatile memory section 106, and a selector circuit 107.

Power supply potential Vx for supplying high supply potential VDD, and ground potential GND serving as low supply potential VSS are applied to each circuit in the memory circuit 100 in FIG. 1A. The memory circuit 100 is supplied with a data signal D to be stored in the first memory 101A and the second memory 101B; a first control signal EN and a second control signal RD for controlling the nonvolatile memory section 106 and the selector circuit; and a clock signal CLK for controlling the first analog switch 102, the second analog switch 103, and the volatile memory section 105. In the memory circuit 100, the inverter circuit 104 generates an inverted clock signal based on the supplied clock signal CLK, which is used to control the first analog switch 102, the second analog switch 103, and the volatile memory section 105. The memory circuit 100 is also supplied with an initialization signal RES (not shown) for initializing the volatile memory section 105.

Note that initializing the volatile memory section 105 with the initialization signal RES refers to putting in advance the volatile memory section 105 in a predetermined stored state to prevent malfunction due to the initial requirement of power source voltage.

FIG. 1A shows a signal output from the volatile memory section 105. In FIG. 1A shows, as an example, an output signal Q.

The volatile memory sections 105 in the first memory 101A and the second memory 101B shown in FIG. 1A include, for example, flip-flop circuits. Note that the flip-flop circuits in the volatile memory sections 105 may be of another type. The volatile memory section 105 can hold a data signal only while power is supplied. In other words, the volatile memory section 105 cannot hold a data signal without the supply of power.

Figure 2A:
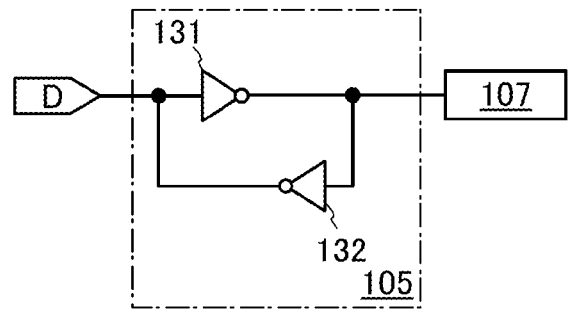
FIGS. 2A to 2C are circuit diagrams of volatile memories.
Figure 2B:
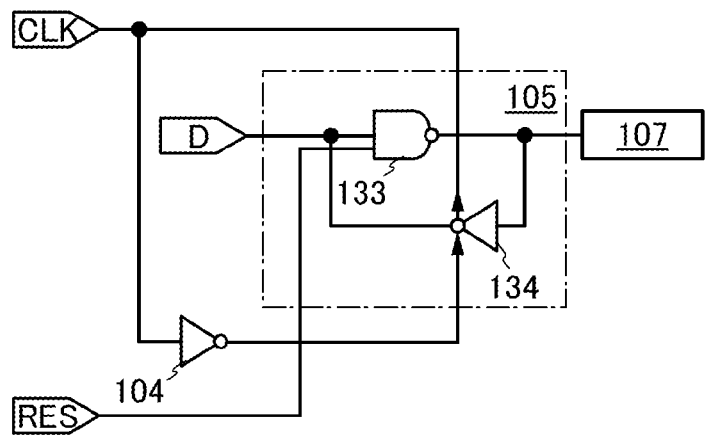
Figure 2C:
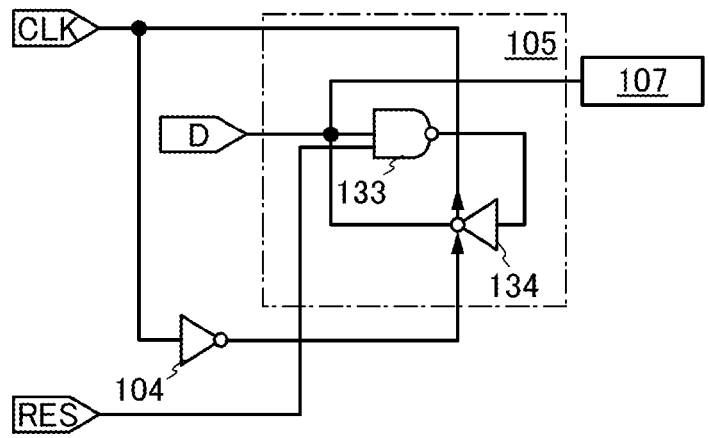

FIGS. 2A to 2C show examples of the circuit configuration of the volatile memory section 105. The volatile memory section 105 in FIG. 2A includes a first inverter circuit 131 and a second inverter circuit 132. The data signal D is supplied to the first inverter circuit 131 in the volatile memory section 105 through the first analog switch 102. The output of the held data signal D is controlled by the selector circuit 107. The held data signal D is held by a feedback loop formed by the first inverter circuit 131 and the second inverter circuit 132.

In this embodiment, the inputs of the volatile memory section 105 and the nonvolatile memory section 106 are connected to the first analog switch 102 (or the second analog switch 103) which supplies the data signal D to the volatile memory section 105 and the nonvolatile memory section 106. Seeing the figures describing this embodiment, the data signal D is input to the inputs of the volatile memory section 105 and the nonvolatile memory section 106. Naturally, the inputs of the volatile memory section 105 and the nonvolatile memory section 106 are connected to the first analog switch 102 (or the second analog switch 103) as shown in FIG. 1A.

The volatile memory section 105 in FIG. 2B includes a NAND circuit 133 and a clocked inverter circuit 134. In an example of a circuit configuration of the volatile memory section 105 in FIG. 2B, the data signal D is held by a feedback loop formed by the NAND circuit 133 and the clocked inverter circuit 134 as in FIG. 2A. In the volatile memory section 105 in FIG. 2B, when the initialization signal RES is made to be an H signal having a potential based on the high supply potential VDD, the NAND circuit 133 serves as an inverter circuit. In the volatile memory section 105 in FIG. 2B, when the initialization signal RES is made to be an L signal having a potential based on the low supply potential VSS, the output potential of the NAND circuit 133 is made to be a fixed potential (H signal), so that the data signal held in the volatile memory section 105 is initialized. Although the volatile memory section 105 and the selector circuit 107 are connected to each other at the output of the NAND circuit 133 in FIG. 2B, the volatile memory section 105 and the selector circuit 107 may be connected to each other at the input of the NAND circuit 133 as shown in FIG. 2C.

Although not particularly shown in FIGS. 2A to 2C, the volatile memory section 105 is supplied with the power supply potential Vx for supplying the high supply potential VDD and the ground potential GND serving as a low supply potential VSS.

The nonvolatile memory section 106 in the memory circuit 100 in FIG. 1A includes a transistor whose channel is formed in an oxide semiconductor layer. Unlike the volatile memory section 105, the nonvolatile memory section 106 can hold a data signal even without the supply of power, by storing charges with the transistor. Thus, unlike the volatile memory section 105, the nonvolatile memory section 106 can hold a data signal even while without the supply of power.

FIG. 1A shows signals input to the nonvolatile memory section 106. FIG. 1A shows, as an example, the data signal D, the first control signal EN, and the second control signal RD. The nonvolatile memory section 106 is also supplied with the power supply potential Vx for supplying the high supply potential VDD and the ground potential GND serving as the low supply potential VSS.

Figure 1B:
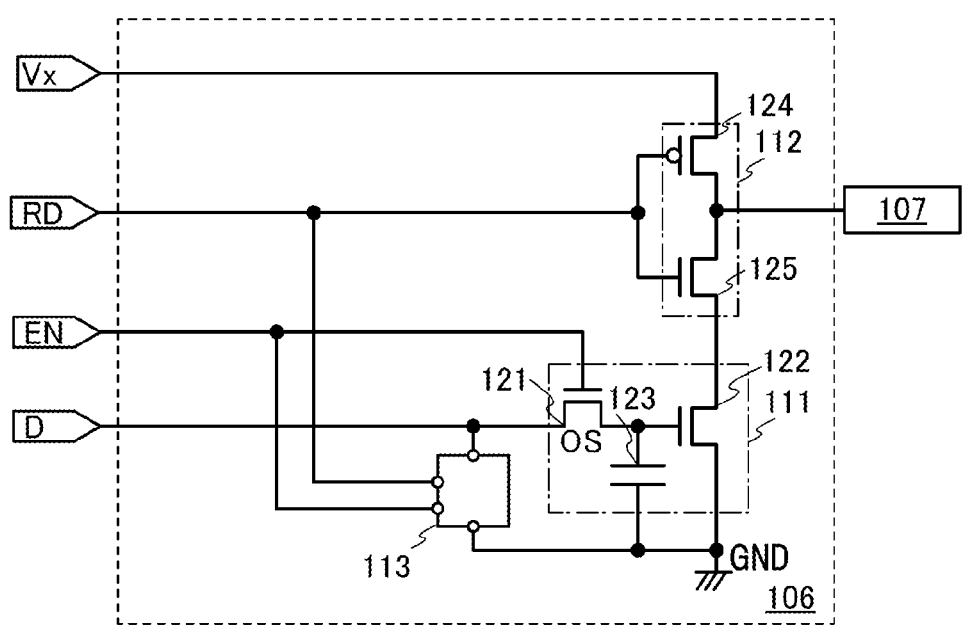

FIG. 1B is a circuit diagram of the nonvolatile memory section 106 according to one embodiment of the present invention. The nonvolatile memory section 106 includes a memory circuit 111, an inverted output circuit 112, and a reset circuit 113.

The memory circuit 111 in FIG. 1B includes a first transistor 121, a second transistor 122, and a capacitor 123. One of a source and a drain of the first transistor 121 is connected to a gate of the second transistor 122. One of the source and the drain of the first transistor 121 is connected to one electrode of the first capacitor 123. A gate of the first transistor 121 is connected to wiring carrying the first control signal EN. The other of the source and the drain of the first transistor 121 is connected to wiring carrying the data signal D. Note that the node of the first transistor 121, the second transistor 122, and the capacitor 123 is hereinafter called "memory node".

The first transistor 121 has a channel in an oxide semiconductor layer. Note that the first transistor 121 is represented by OS in the figure so that it is recognized as being a transistor whose channel is formed in an oxide semiconductor layer.

The second transistor 122 in FIG. 1B is an element serving as a switch. FIG. 1B shows the case where a transistor of one conductivity type (e.g., an n-channel transistor) is used as the second transistor 122. Here, one terminal of a switch corresponds to one of a source and a drain of a transistor, while the other terminal of the switch corresponds to the other one of the source and the drain of the transistor. The switch is turned on or off in accordance with the potential of the data signal held at the gate of the transistor.

Note that the capacitor 123 can be omitted by positively using, for example, capacitance between the gate of the second transistor 122 and the other one of the source and the drain of the first transistor 121.

The inverted output circuit 112 in FIG. 1B includes a third transistor 124 and a fourth transistor 125. One of a source and a drain of the third transistor 124 is connected to wiring carrying the power supply potential Vx. A gate of the third transistor 124 is connected to wiring carrying the second control signal RD. The other of the source and the drain of the third transistor 124 is connected to one electrode of a source and a drain of the fourth transistor 125. A gate of the fourth transistor 125 is connected to wiring carrying the second control signal RD. The other of the source and the drain of the fourth transistor 125 is connected to one of a source and a drain of the second transistor 122. Note that the other of the source and the drain of the second transistor 122 is connected to wiring carrying the ground potential GND. Note that a node of the third transistor 124 and the fourth transistor 125 is connected to the selector circuit 107.

The third transistor 124 in FIG. 1B serves as a switch. The third transistor 124 is, for example, a transistor of one conductivity type (e.g., a p-channel transistor). The fourth transistor 125 in FIG. 1B serves as a switch. The fourth transistor 125 is, for example, a transistor of one conductivity type (e.g., an n-channel transistor). Note that the third transistor 124 and the fourth transistor 125 are of different conductivity types so that they are alternately turned on or off. In other words, the inverted output circuit 112 inverts the logic state of the memory node in accordance with the logic state (H or L) of the second control signal RD and outputs the inverted signal to the selector circuit 107. Specifically, when the second control signal RD is an L signal, an H signal is output to the selector circuit 107 regardless of the signal (H or L signal) held in the memory node. When the second control signal RD is an H signal, an L signal is output to the selector circuit 107 if the memory node holds an H signal. When the second control signal RD is an H signal, an H signal is output to the selector circuit 107 as in the previous state if the memory node holds an L signal.

Note that in the nonvolatile memory section 106, the potential of a data signal that can be held in the capacitor 123 is applied to the gate of the second transistor 122. Consequently, after the supply of power to the memory circuit 100 is started again, the data signal that can be held in the capacitor 123 can be converted while the fourth transistor 125 is turned on and read from the nonvolatile memory section 106. Thus, the original signal can be read with accuracy even if a potential corresponding to the data signal that can be held in the capacitor 123 slightly fluctuates.

In FIG. 1B, among the transistors used in the nonvolatile memory section 106, the transistors other than the first transistor 121 can be transistors whose channel is formed in a layer or substrate of a semiconductor other than an oxide semiconductor, e.g., transistors whose channel is formed in a silicon layer or silicon substrate. Alternatively, the nonvolatile memory section 106 may include, in addition to the first transistor 121, a transistor whose channel is formed in an oxide semiconductor layer and the other transistors whose channel is formed in a layer or substrate of a semiconductor other than an oxide semiconductor.

The oxide semiconductor used preferably contains at least indium (In) or zinc (Zn), more preferably both In and Zn. It is preferable that the oxide semiconductor further contain gallium (Ga), tin (Sn), hafnium (Hf), or aluminum (Al) serving as a stabilizer for reducing variations in the electric characteristics between the transistors containing the oxide semiconductor.

Alternatively, the oxide semiconductor used may contain one or more of the following lanthanoid elements serving as stabilizers: lantern (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu).

The oxide semiconductor is, for example, an indium oxide; a tin oxide; a zinc oxide; a binary metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a ternary metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a quaternary metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, an In—Ga—Zn-based oxide, for example, refers to an oxide mainly containing In, Ga, and Zn, and there is no limitation on the ratio among In, Ga, and Zn. The In—Ga—Zn-based oxide may contain a metal element other than In, Ga, and Zn.

The oxide semiconductor may be a material represented by the formula $InMO_3(ZnO)_m$, where m>0 and m is not an integer. Note that M represents one or more of the following metal elements: Ga, Fe, Mn, and Co. The oxide semiconductor may be a material represented by the formula $In_3SnO_5(ZnO)_n$, where n>0 and n is an integer.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any oxide having a composition close to this can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any oxide having a composition close to this may be used.

However, the oxide semiconductor is not limited to those described above, and a material which has an appropriate composition may be used in accordance with required semiconductor characteristics (e.g., mobility, threshold voltage, and variation). In addition, in order to obtain the required semiconductor characteristics, it is preferable to optimize the carrier concentration, the impurity concentration, the defect density, the atomic ratio of a metal element to oxygen, the interatomic distance, the density, etc.

For example, it is relatively easy to obtain high mobility with an In—Sn—Z-based oxide. However, it is possible to obtain high mobility even with an In—Ga—Zn-based oxide by reducing the defect density in a bulk.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation.

$$(a-A)^2+(b-B)^2+(c-C)^2 \leq r^2$$

The variable r is 0.05, for example. The same applies to other oxides.

The oxide semiconductor may be either single crystal or non-single-crystal. In the latter case, the oxide semiconductor may be either amorphous or polycrystalline. The oxide semiconductor may be either an amorphous material containing a crystalline part or a non-amorphous material.

It is relatively easy to provide an amorphous oxide semiconductor with a flat surface. Therefore, a transistor containing an amorphous oxide semiconductor causes less interface scattering and achieves relatively high mobility with relative ease.

A crystalline oxide semiconductor causes fewer defects in the bulk and, if provided with a flatter surface, can achieve higher mobility than that of an amorphous oxide semiconductor. The oxide semiconductor is preferably formed over a flat surface to have a flatter surface. Specifically, the oxide semiconductor is formed over a surface with an average surface roughness (Ra) of 1 nm or less, preferably less than or equal to 0.3 nm, more preferably less than or equal to 0.1 nm.

Note that $R_a$ is obtained by three-dimension expansion of center line average roughness that is defined by JIS B 0601 so as to be applied to a plane. The $R_a$ can be expressed as an "average value of the absolute values of deviations from a reference surface to a specific surface" and is defined by the following formula.

$$Ra = \frac{1}{S_0}\int_{y_2}^{y_1}\int_{x_2}^{x_1}|f(x,y)-Z_0|\,dx\,dy$$

In the above formula, $S_0$ represents an area of a plane to be measured (a rectangular region which is defined by four points represented by the coordinates $(x_1, y_1)$, $(x_1, y_2)$, $(x_2, y_1)$, and $(x_2, y_2)$), and $Z_0$ represents an average height of the plane to be measured. Ra can be measured using an atomic force microscope (AFM).

In a transistor whose channel is formed in an oxide semiconductor layer which is highly purified by drastic removal of hydrogen contained in the oxide semiconductor layer, the off-state current density can be 100 zA/μm or less, preferably 10 zA/μm or less, more preferably 1 zA/μm or less. For this reason, the off-state current of the transistor is much lower than that of a transistor including crystalline silicon. Thus, while the first transistor 121 is in the off state, the potential of the memory node, that is, the potential of the gate of the second transistor 122 can be held for a long period of time.

Note that in this specification, off-state current refers to current flowing between the source and the drain of a transistor which is in the off state (off). In the case of an n-channel transistor (whose threshold voltage is, for example, about 0 to 2 V), off-state current refers to current flowing between the source and the drain when negative voltage is applied between the gate and the source.

Note that a material that can achieve the off-state current characteristics equivalent to those of the oxide semiconductor material, such as a wide gap material like silicon carbide (specifically, a semiconductor material whose energy gap Eg is larger than 3 eV), may be used instead of an oxide semiconductor material. A MEMS switch, for example, may be used instead of a transistor to break connection between wirings, which achieves long-time retention of charge in the memory node.

The reset circuit 113 in FIG. 1B includes a logic circuit controlled by the first control signal EN and the second control signal RD, and a switch for connecting the other of the source and the drain of the first transistor 121 to wiring GND carrying the low supply potential VSS. The reset circuit 113 is used for a reset operation in which an L signal based on the low supply potential VSS is applied to the memory node, whose potential is based on the data signal, that is, the gate of the second transistor 122 at a predetermined timing determined by the logic circuit.

Note that the reset operation refers to an operation in which switches in the first transistor 121 and the reset circuit 113 are turned on to apply an L signal based on the low supply potential VSS to the memory node, that is, the gate of the second transistor 122 at a potential.

Note that the logic circuit in the reset circuit 113 provides the timing of when the first transistor 121 is turned on to supply the data signal on the first control signal EN to the memory node, as well as the timing of when the first transistor 121 and the switch in the reset circuit 113 are turned on by the first control signal EN and the second control signal RD. In other words, the reset circuit 113 forces an L signal based on the supply potential VSS to be applied to the memory node by supplying the data signal to the memory node to turn on the first transistor 121 and simultaneously turning on the switch in the reset circuit 113 and the first transistor 121.

In the nonvolatile memory section 106 according to one embodiment of the present invention, in particular, the reset circuit 113 allows the data signal stored in the nonvolatile memory section 106 to be initialized, for example, when the volatile memory section 105 restarts operation. The reset circuit 113 forces an L signal to be applied to the memory node in the nonvolatile memory section 106, thereby avoiding degradation of the first transistor 121 which occurs if voltage is kept applied between the gate and the source or drain of the first transistor 121 while the memory node keeps holding an H signal. In other words, the reset circuit 113 forces an L signal to be applied to the memory node in the nonvolatile memory section 106, thereby removing the potential difference between the gate and the source or drain of the first transistor 121.

Figure 3:
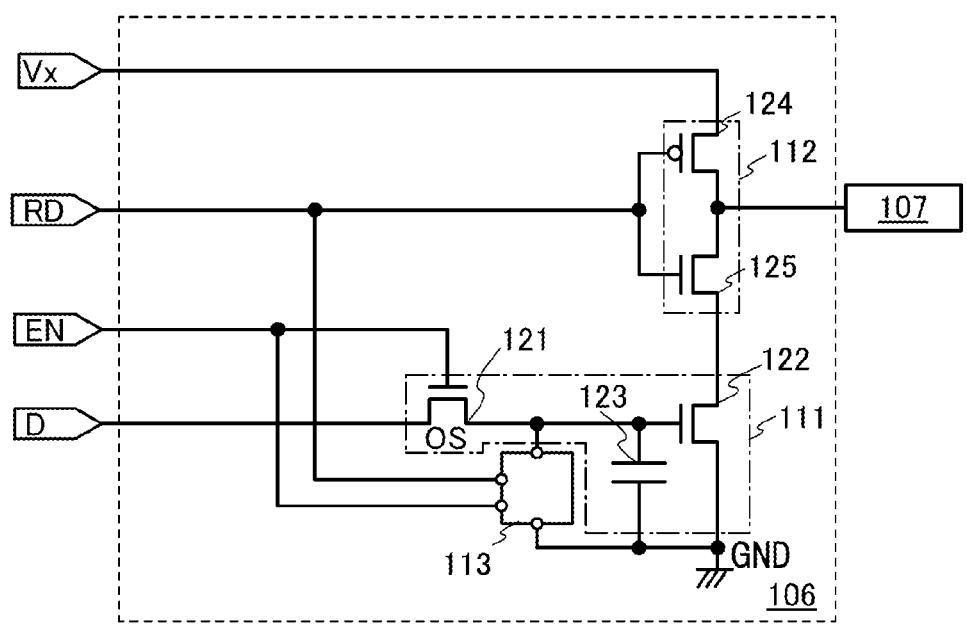
FIG. 3 is a circuit diagram of a nonvolatile memory section.

Note that the reset circuit 113 is configured to allow the data signal in the memory node to be an L signal. Therefore, as shown in FIG. 3, the reset circuit 113 may be directly connected to the memory node. In this case, the switch in the nonvolatile memory section 106 is preferably a transistor containing an oxide semiconductor.

Figure 5:
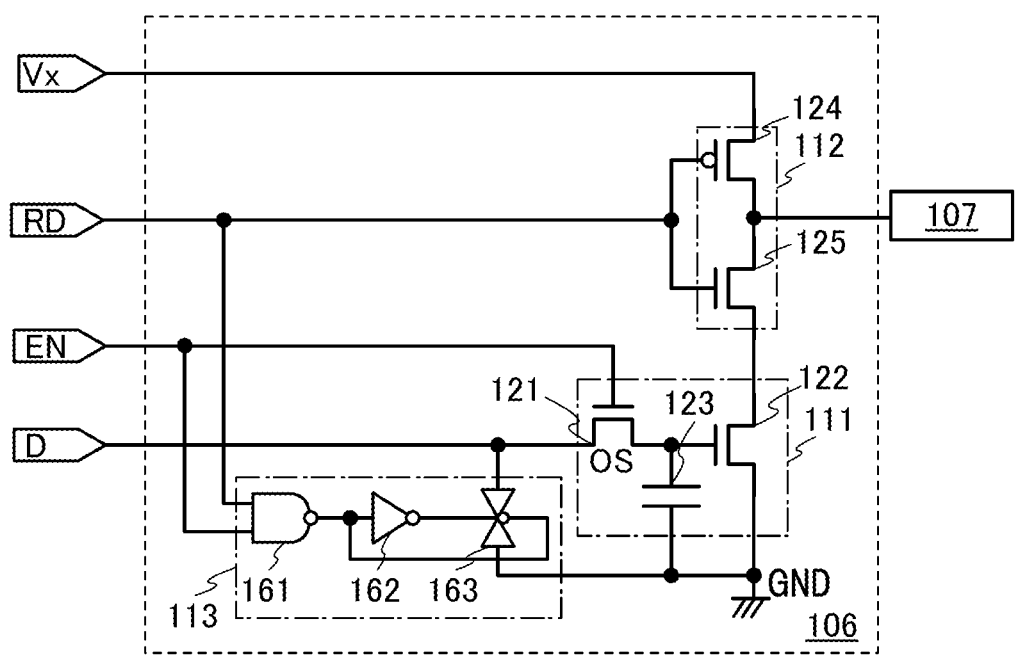
FIG. 5 is a circuit diagram of a nonvolatile memory section.

FIG. 5 shows a specific circuit configuration of the reset circuit 113 shown in FIG. 1B. In FIG. 5, the reset circuit 113 shown as an example includes a NAND circuit 161, an inverter circuit 162, and an analog switch 163.

The NAND circuit 161 generates a signal based on the first control signal EN and the second control signal RD. The generated signal is used to selectively turn on the analog switch 163. In the specific example shown in FIG. 5, the NAND circuit 161 outputs an L signal if the first control signal EN and the second control signal RD are H signals. If the NAND circuit 161 outputs an L signal, the analog switch 163 can be turned on in the case shown in the circuit configuration of FIG. 5.

In the specific example shown in FIG. 5, the NAND circuit 161 outputs an H signal if the first control signal EN and the second control signal RD are in other logic states. If the NAND circuit 161 outputs an H signal, the analog switch 163 can be turned off in the case shown in the circuit configuration of FIG. 5. Note that the NAND circuit 161, the inverter circuit 162, and the analog switch 163 can be replaced with other circuits as appropriate as long as they operate in the same manner.

Although here, the analog switch 163 is shown as the switch used in the reset circuit 113, an n-channel transistor may be used as the switch used in the reset circuit 113 instead.

Each selector circuit 107 in the first memory 101A and the second memory 101B shown in FIG. 1A selects the volatile memory section 105 or the nonvolatile memory section 106 according to the first control signal EN and the second control signal RD to store the data signal D supplied to the first memory 101A or the second memory 101B. Note that the first control signal EN and the second control signal RD are supplied to the logic circuit to produce corresponding output signals that turn on or off the switch.

Figure 4:
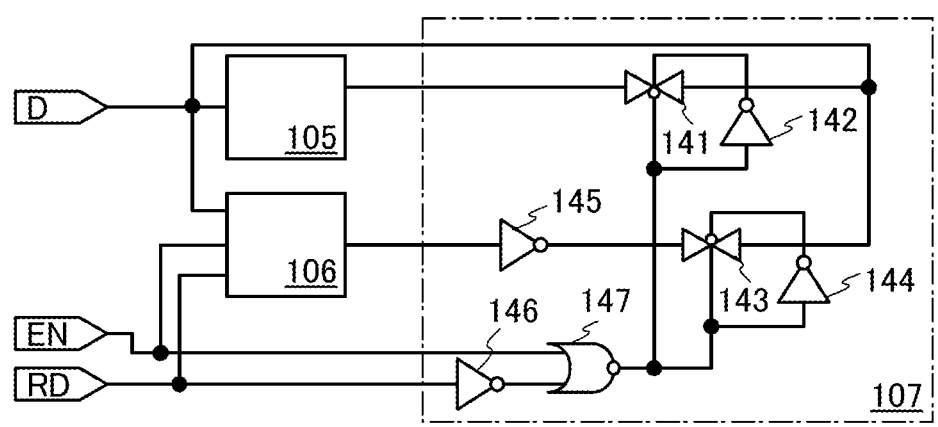
FIG. 4 is a circuit diagram of a selector circuit.

FIG. 4 shows an example of the circuit configuration of the selector circuit 107. The selector circuit 107 in FIG. 4 includes a first analog switch 141, a first inverter circuit 142, a second analog switch 143, a second inverter circuit 144, a third inverter circuit 145, a fourth inverter circuit 146, and a NOR circuit 147.

The first analog switch 141 in the selector circuit 107 is used to turn on a feedback loop formed by the inverter circuits in the volatile memory section 105. The second analog switch 143 in the selector circuit 107 is used to supply a data signal to the feedback loop formed by the inverter circuits in the volatile memory section 105. This data signal has been supplied from the inverted output circuit 112 in the nonvolatile memory section 106 and then inverted by the third inverter circuit 145 to be brought in the same logic state as before being supplied to the nonvolatile memory section 106.

The fourth inverter circuit 146 and the NOR circuit 147 generates a signal based on the first control signal EN and the second control signal RD. The generated signal is used to selectively turn on the first analog switch 141 or the second analog switch 143. In the specific example shown in FIG. 4, the NOR circuit 147 outputs an H signal if the first control signal EN is an L signal and the second control signal RD is an H signal. If the NOR circuit 147 outputs an H signal, the first analog switch 141 can be turned off and the second analog switch 143 can be turned on in the case shown in the circuit configuration of FIG. 4.

In the specific example shown in FIG. 4, the NOR circuit 147 outputs an L signal if the first control signal EN and the second control signal RD are in other logic states. If the NOR circuit 147 outputs an L signal, the first analog switch 141 can be turned on and the second analog switch 143 can be turned off in the case shown in the circuit configuration of FIG. 4. Note that the fourth inverter circuit 146 and the NOR circuit 147 can be replaced with other circuits as appropriate as long as they operate in the same manner.

Although not particularly shown in FIG. 4, the selector circuit 107 is supplied with the power supply potential Vx for supplying the high supply potential VDD and the ground potential GND serving as the low supply potential VSS.

Figure 6:
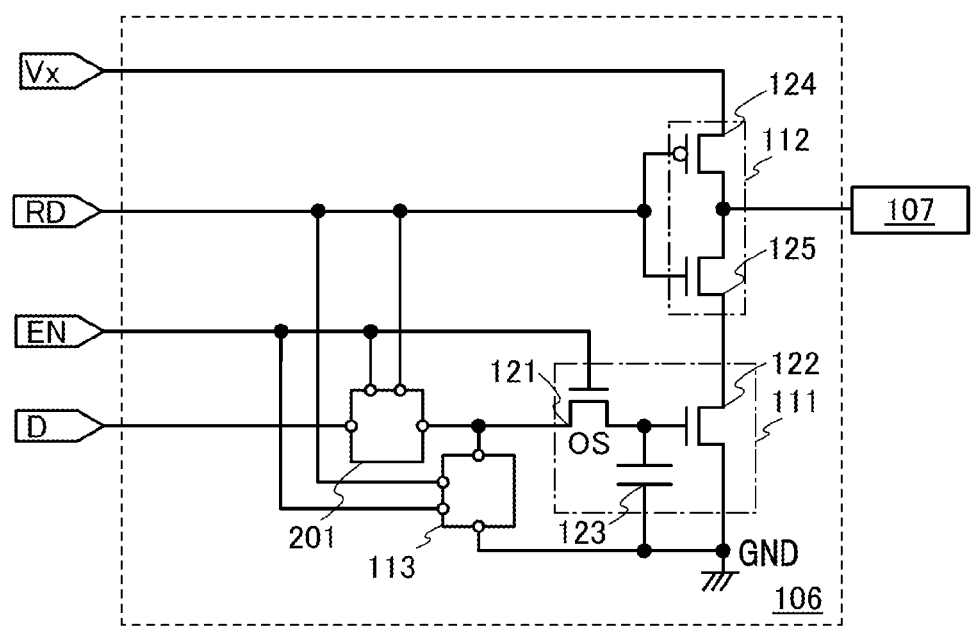
FIG. 6 is a circuit diagram of a nonvolatile memory section.

In this embodiment, the nonvolatile memory section 106 preferably includes the reset circuit 113 as well as a switching circuit 201 shown in FIG. 6. Specifically, the switching circuit 201 is placed between the other of the source and the drain of the first transistor 121 and an input terminal of the nonvolatile memory section 106.

Note that the input terminal of the nonvolatile memory section 106 refers to a node on the path of the data signal supplied to the nonvolatile memory section 106 through the first analog switch 102 (or the second analog switch 103). In other words, the switching circuit 201 is placed on the path between the first analog switch 102 and the first transistor 121 except between the first analog switch 102 and the volatile memory section 105.

The switching circuit 201 in FIG. 6 is used to prevent current due to the data signal D held in the memory node from flowing into the connection point between the nonvolatile memory section 106 and the volatile memory section 105 when the first transistor 121 and the reset circuit 113 are turned on and an L signal is applied to the memory node. Therefore, the switching circuit 201 includes a control circuit for establishing electrical continuity between the other of the source and the drain of the first transistor 121 and the input terminal of the nonvolatile memory section 106 in the period during which the first transistor 121 is turned on so that the memory node stores potential due to the data signal, and breaking this electrical continuity in the other period.

Figure 7:
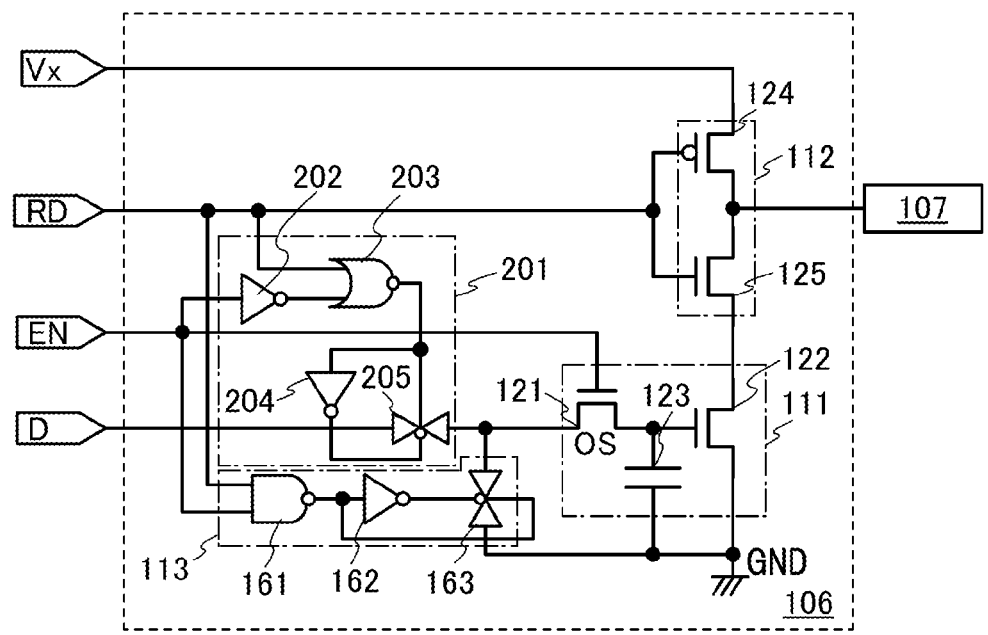
FIG. 7 is a circuit diagram of a nonvolatile memory section.

FIG. 7 shows the specific structure of the switching circuit 201. An example of the switching circuit 201 shown in FIG. 7 includes a first inverter circuit 202, a NOR circuit 203, a second inverter circuit 204, and an analog switch 205.

The NOR circuit 203 generates a signal based on the first control signal EN and the second control signal RD. The generated signal is used to selectively turn on the analog switch 205. In the specific example shown in FIG. 7, the NOR circuit 203 outputs an H signal if the first control signal EN is an H signal and the second control signal RD is an L signal. If the NOR circuit 203 outputs an H signal, the analog switch 205 can be turned on in the case shown in the circuit configuration of FIG. 7.

In the specific example shown in FIG. 7, the NOR circuit 203 outputs an L signal if the first control signal EN and the second control signal RD are in other logic states. If the NOR circuit 203 outputs an L signal, the analog switch 205 can be turned off in the case shown in the circuit configuration of FIG. 7. Note that the first inverter circuit 202, the NOR circuit 203, the second inverter circuit 204, and the analog switch 205 can be replaced with other circuits as appropriate as long as they operate in the same manner.

The foregoing has described the circuits in the memory circuit 100.

A description will be given below of a method for driving the memory circuit 100 in which, while the data signal is held, the supply of power is stopped and started again to reduce power consumption, and the above-stated reset circuit forces an L signal to be applied to the memory node in the memory circuit 111 to reduce degradation of the first transistor 121.

Figure 8:
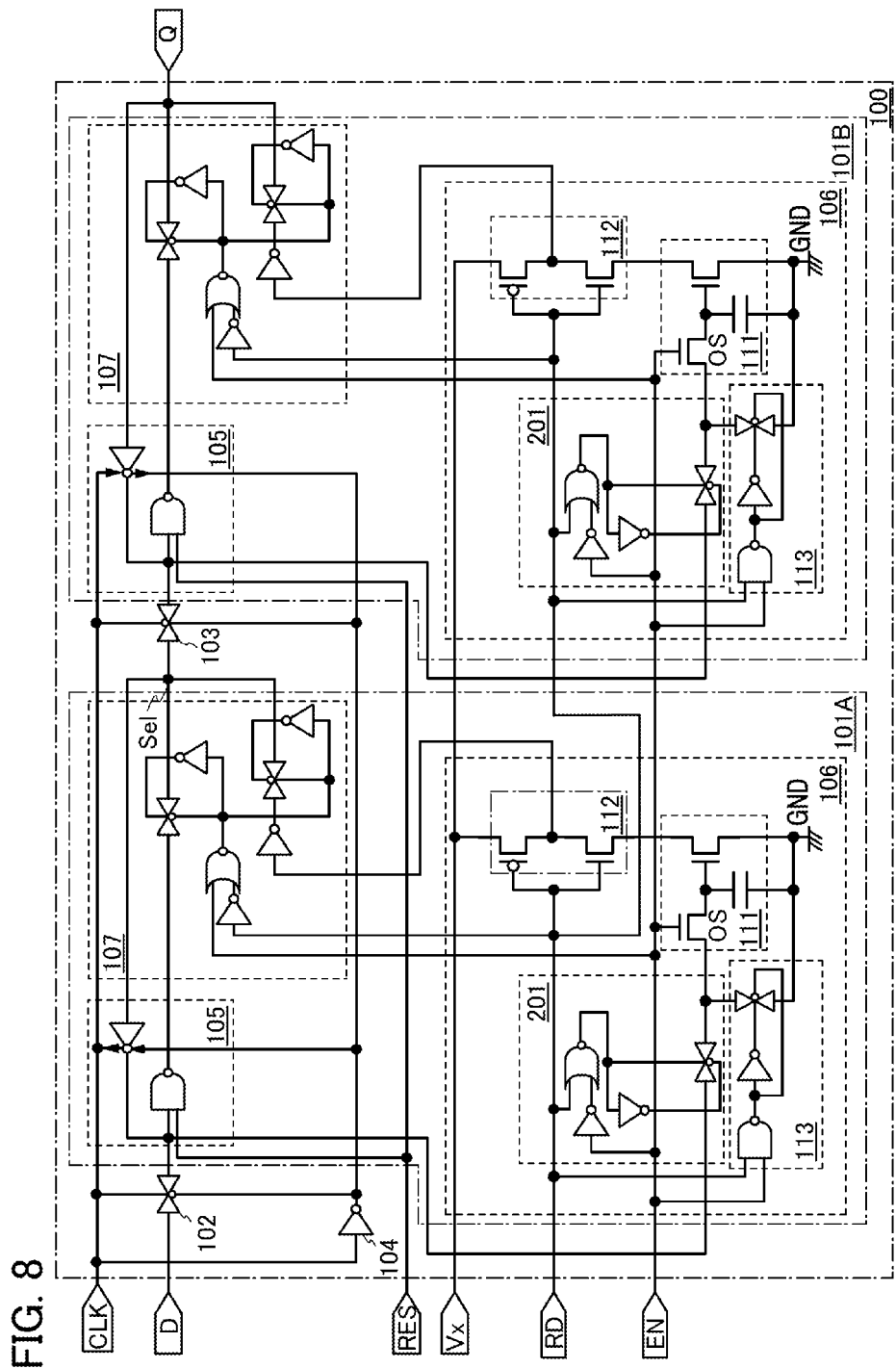
FIG. 8 is a circuit diagram of a memory circuit.
Figure 9:
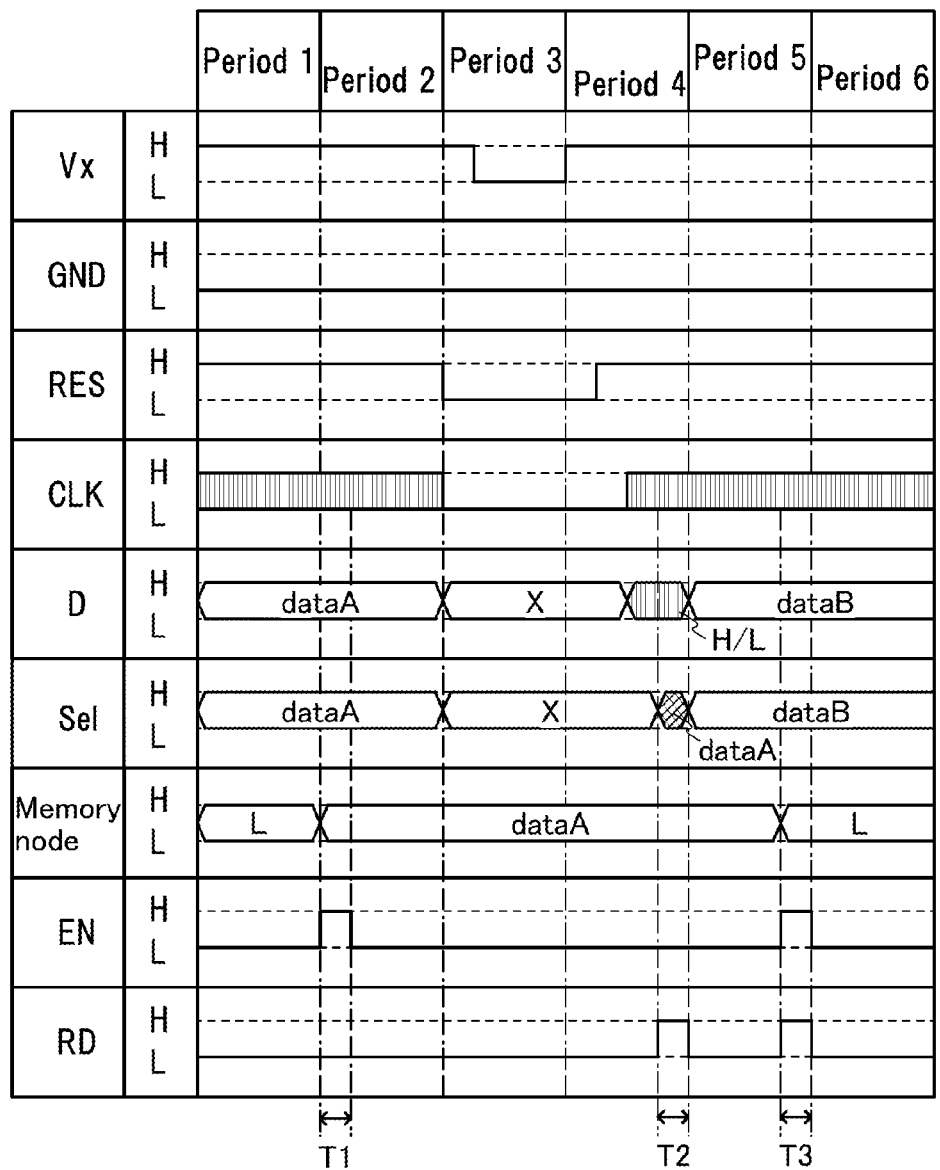
FIG. 9 is a timing diagram showing the operation of the memory circuit.

FIG. 8 is a circuit diagram of the memory circuit in FIG. 1A employing the circuit configurations of the volatile memory section 105, the selector circuit 107, and the nonvolatile memory section 106 including the reset circuit and the switching circuit that have been described with reference to FIG. 2B, FIG. 4, and FIG. 7. FIG. 9 is a timing diagram showing the operation of the memory circuit in FIG. 8. A description will be given below of a method for driving the memory circuit 100, especially for driving the first memory 101A in the memory circuit 100, with reference to the timing diagram. Note that the second memory 101B in the memory circuit 100 can be driven by the same method. In FIG. 8, a node for the feedback loop in the volatile memory section 105, which corresponds to the output of the selector circuit 107, is represented by "Sel".

In the timing diagram of FIG. 9, Vx, GND, RES, CLK, D, Sel, memory node, EN, and RD correspond to the potentials of the above-stated input and output signals and the node, respectively. The timing diagram of FIG. 9 shows a plurality of periods (periods 1 to 6) for the description of a plurality of states of the first memory 101A in the memory circuit 100.

Note that the potentials of the above-stated input and output signals and the node can be denoted by an H signal and an L signal, which are represented respectively by H and L in the figure.

The operation of the first memory 101A in the period 1 in FIG. 9 will be described. The period 1 is a normal operation period in which a data signal D is stored in the volatile memory section 105 and the nonvolatile memory section 106 does not participate in the memory of the data signal D. In the period 1, Vx is made to be an H signal to supply power to the circuits in the memory circuit 100. In the first memory 101A, the volatile memory section 105 is allowed to store the data signal D by applying an L signal to the first control signal EN and the second control signal RD. In the period 1, the volatile memory section 105 stores dataA serving as the data signal D and is refreshed by rewriting dataA therein in synchronism with the clock signal CLK. In the period 1, Sel in the selector circuit 107 is allowed to hold dataA by turning on the analog switch connected to the volatile memory section 105. Although dataA held in Sel is exactly an inverted signal of dataA from the first analog switch 102, it is represented by dataA below. In the period 1, the initialization signal RES is an H signal. In the period 1, an L signal is applied to the memory node as a result of the operation of the reset circuit in the previous period.

The operation in the period 2 in FIG. 9 will be described. The period 2 is a backup preparation period for storing the data signal D in the nonvolatile memory section 106 before the supply of power is stopped. In the period 2, there is a period in which the first control signal EN is an H signal and the second control signal RD is an L signal (which is represented by T1 in FIG. 9). In this period, the analog switch 205 and the first transistor 121 in the switching circuit 201 in the nonvolatile memory section 106 are turned on, so that dataA is stored on the memory node. Once stored on the memory node, dataA continues to be stored on the memory node even when the first control signal EN and the second control signal RD are made to be L signals. In the backup preparation period, as in the normal operation period, the volatile memory section 105 is refreshed by rewriting dataA therein with the help of the input and output signals.

The operation in the period 3 in FIG. 9 will be described. The period 3 is a power-off period in which the supply of power is stopped. In the period 3, Vx is made to be an L signal to stop the supply of power to the circuits in the memory circuit 100. In the period 3, power is not supplied to the volatile memory section 105, so that dataA in the volatile memory section 105 is erased (such erasure is represented by X in FIG. 9). As well as dataA in the volatile memory section 105, dataA stored on Sel is erased (such erasure is represented by X in FIG. 9). During the period 3, the input of the clock signal CLK is kept as an L signal to prevent the volatile memory section 105 from operating, and at the same time, the initialization signal RES is also kept as an L signal. Malfunction can be reduced by making Vx be an L signal after applying an L signal to the clock signal CLK and the initialization signal RES. In the period 3, an L signal is applied to the first control signal EN and the second control signal RD to prevent the memory circuit 100 from operating.

The operation in the period 4 in FIG. 9 will be described. The period 4 is a data signal reset period in which the supply of power is started again, and the data signal backed up to the nonvolatile memory section 106, dataA, is sent to the volatile memory section 105. In the period 4, Vx is made to be an H signal to supply power to the circuits in the memory circuit 100 again. The initialization signal RES is then made to be an H signal so that the clock signal oscillates. While the clock signal oscillates in the period 4, the data signal D is held at a fixed potential of H or L signal (such a potential is represented by H/L in FIG. 9). In the period 4, there is a period in which the first control signal EN is an L signal and the second control signal RD is an H signal (which is represented by T2 in FIG. 9). Hence, dataA in the memory node is selected by the selector circuit 107, so that dataA is stored on Sel and sent to the volatile memory section 105.

The operation in the period 5 in FIG. 9 will be described. The period 5 is a reset period. In this period, the data signal dataA held at the memory node, which does not hinder the operation of the volatile memory section 105 but is a cause of degradation of the first transistor in the nonvolatile memory section 106, is made to be an L signal by reset operation. In the period 5, there is a period in which the first control signal EN is an H signal and the second control signal RD is an H signal (which is represented by T3 in FIG. 9). Consequently, the data signal data A held at the memory node becomes an L signal. Thus, degradation of the first transistor can be reduced. The switching circuit 201 is used to prevent current based on the ground potential GND at the memory node from flowing into a connection point of the nonvolatile memory section 106 and the volatile memory section 105 because of reset operation in the reset period. The analog switch in the switching circuit 201 is off during the reset period. Consequently, malfunction of the volatile memory section 105 can be reduced. In the reset period, the volatile memory section 105 can operate in the same way as in the normal operation period. In the case shown in FIG. 9, the volatile memory section 105 is refreshed by rewriting a new data signal, dataB different from dataA, therein in synchronism with the clock signal CLK.

The period 6 is a normal operation period, as the period 1. In the period 6, as in the period 5, the volatile memory section 105 is refreshed by rewriting the data signal dataB therein in synchronism with the clock signal CLK.

The foregoing has described the method for driving the memory circuit.

According to the present invention, while the supply of power to the memory circuit is stopped, a data signal that has been held in the volatile memory section can be held in the memory node in the nonvolatile memory section.

A transistor whose channel is formed in an oxide semiconductor layer has extremely low off-state current. For example, the off-state current of a transistor whose channel is formed in an oxide semiconductor layer is much lower than that of a transistor whose channel is formed in crystalline silicon. Therefore, the use of a transistor whose channel is formed in an oxide semiconductor layer as the first transistor allows a signal in the first capacitor to be held for a long period of time even while the supply of power to the memory circuit stopped. Thus, the memory circuit can hold content (a data signal) even while the supply of power is stopped.

By using this memory circuit as a memory circuit such as a register or a cache memory included in a signal processing unit, a data signal can be prevented from being lost due to the cessation of the supply of power. In addition, after the supply of power is started again, the memory circuit can return to the same state as before the cessation of the supply of power in a short time. Consequently, in either the whole signal processing unit or one or more logic circuits in the signal processing unit, the supply of power can be stopped for a short time. Thus, a signal processing unit with low power consumption and a method for driving this signal processing unit can be provided.

In particular, in this embodiment, the data signal that has been held in the memory node while the supply of power is stopped can be set at the potential of an L signal which does not cause malfunction by turning on the reset circuit. This reduces degradation of the transistor due to the fact that the data signal is held in the memory node. Further, in this embodiment, the switching circuit is used, so that during the reset operation, current based on the data signal held at the memory node can be prevented from flowing into the connecting point between the nonvolatile memory section and the volatile memory section. Thus, malfunction in the volatile memory section can be reduced.

This embodiment can be implemented in appropriate combination with any of the other embodiments.

This embodiment describes a structure using a plurality of memory circuits each having the same structure as the memory circuit according to Embodiment 1.

Figure 10A:
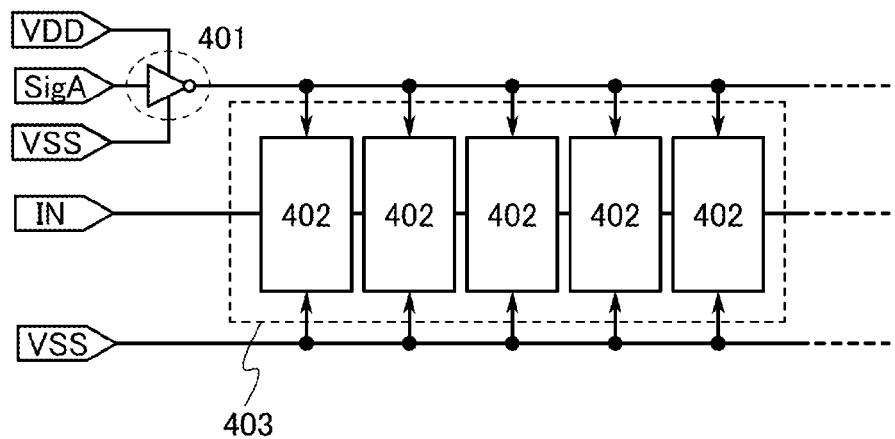
FIGS. 10A and 10B are diagrams showing the structure of the memory circuit.

FIG. 10A shows an example of the structure of a memory circuit according to Embodiment 2. The memory circuit shown in FIG. 10A includes an inverter circuit 401 to which the high supply potential VDD and the low supply potential VSS are applied, and a memory circuit group 403 including a plurality of memory circuits 402. Specifically, the memory circuit 100 according to Embodiment 1 can be used as each memory circuit 402. The high supply potential VDD or the low supply potential VSS is applied via the inverter circuit 401 to each memory circuit 402 included in the memory circuit group 403. In addition, the potential of the signal IN and the low supply potential VSS are applied to each memory circuit 402 included in the memory circuit group 403.

In FIG. 10A, the potential to be output from the inverter circuit 401 is switched between the high supply potential VDD and the low supply potential VSS by the control signal SigA.

Figure 10B:
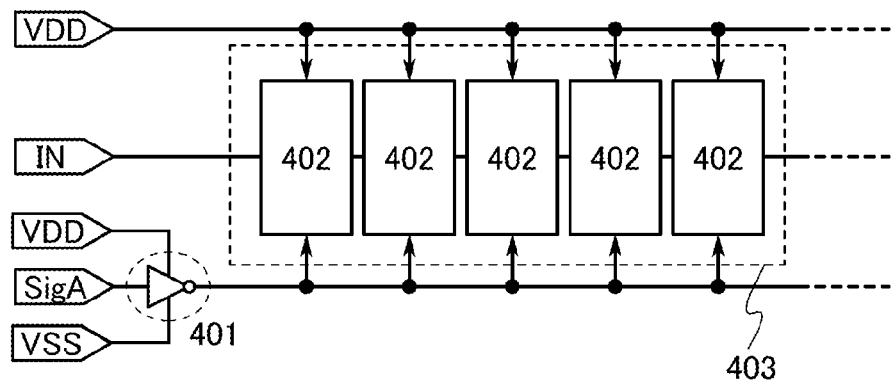

In FIG. 10A, the application of the high supply potential VDD or the low supply potential VSS to each memory circuit 402 included in the memory circuit group 403 is controlled on the high supply potential VDD side with the help of the inverter circuit 401. Alternatively, the application of the high supply potential VDD or the low supply potential VSS may be controlled on the low supply potential VSS side with the help of the inverter circuit 401. FIG. 10B shows an example of a memory circuit in which each memory circuit 402 included in the memory circuit group 403 is supplied with the high supply potential VDD or the low supply potential VSS via the inverter circuit 401. The application of the high supply potential VDD or the low supply potential VSS can be controlled on the low supply potential VSS side in each memory circuit 402 included in the memory circuit group 403 with the help of the inverter circuit 401.

This embodiment can be implemented in appropriate combination with the above embodiment.

This embodiment describes the structure of a signal processing unit including the memory circuit described in Embodiment 1.

Figure 11:
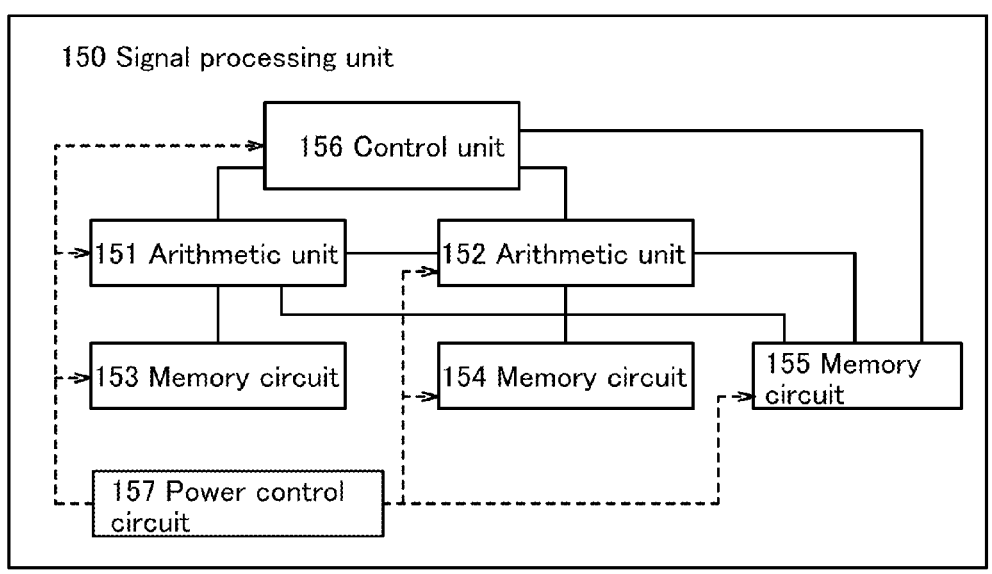
FIG. 11 is a block diagram of a signal processing unit.

FIG. 11 illustrates an example of the signal processing unit according to an embodiment of the present invention. The signal processing unit includes at least one or more arithmetic units and one or more memory circuits. Specifically, a signal processing unit 150 illustrated in FIG. 11 includes an arithmetic unit 151, an arithmetic unit 152, a memory circuit 153, a memory circuit 154, a memory circuit 155, a control unit 156, and a power control circuit 157.

The arithmetic units 151 and 152 each include, as well as a logic circuit which carries out simple logic arithmetic processing, an adder, a multiplier, and various arithmetic units. The memory circuit 153 functions as a register for temporarily holding a data signal when the arithmetic processing is carried out in the arithmetic unit 151. The memory circuit 154 functions as a register for temporarily holding a data signal when the arithmetic processing is carried out in the arithmetic unit 152.

In addition, the memory circuit 155 can be used as a main memory and can store a program executed by the control unit 156 as a data signal or can store a data signal from the arithmetic unit 151 and the arithmetic unit 152.

The control unit 156 is a circuit which collectively controls operations of the arithmetic unit 151, the arithmetic unit 152, the memory circuit 153, the memory circuit 154, and the memory circuit 155 included in the signal processing unit 150. Note that in FIG. 11, a structure in which the control unit 156 is provided in the signal processing unit 150 as a part thereof is illustrated, but the control unit 156 may be provided outside the signal processing unit 150.

By using the memory circuit described in Embodiment 1 for the memory circuit 153, the memory circuit 154, and the memory circuit 155, a data signal can be held even when the supply of power to the memory circuit 153, the memory circuit 154, and the memory circuit 155 is stopped. In the above manner, the supply of power to the entire signal processing unit 150 can be stopped, so that power consumption can be suppressed. Alternatively, the supply of power to one or more the memory circuit 153, the memory circuit 154, and the memory circuit 155 can be stopped, so that power consumed by the signal processing unit 150 can be suppressed.

After the supply of power is restarted, the memory circuit can return to the same state as before the cessation of the supply of power in a short time.

The supply of power to the control circuit or the arithmetic unit which transmits/receives a data signal to/from the memory circuit may be stopped in response to the cessation of the supply of power to the memory circuit. For example, when the arithmetic unit 151 and the memory circuit 153 do not operate, the supply of power to the arithmetic unit 151 and the memory circuit 153 may be stopped.

In addition, the power control circuit 157 controls the magnitude of the power supply voltage supplied to the arithmetic unit 151, the arithmetic unit 152, the memory circuit 153, the memory circuit 154, the memory circuit 155, and the control unit 156 included in the signal processing unit 150. In the case where the supply of power is stopped, the supply of power is stopped either by the power control circuit 157 or by the arithmetic unit 151, the arithmetic unit 152, the memory circuit 153, the memory circuit 154, the memory circuit 155, and the control unit 156.

A memory circuit which functions as a cache memory may be provided between the memory circuit 155 that is a main memory and each of the arithmetic unit 151, the arithmetic unit 152, and the control unit 156. By providing the cache memory, low-speed access to the main memory can be reduced and the speed of the signal processing such as arithmetic processing can be higher. By using the above-described memory circuit in the memory circuit functioning as a cache memory, power consumption of the signal processing unit 150 can be made low. After the supply of power is restarted, the memory circuit can return to the same state as before the cessation of the supply of power in a short time.

This embodiment can be implemented in appropriate combination with any of the above embodiments.

This embodiment describes the configuration of a CPU, which is a kind of signal processing units according to one embodiment of the present invention.

Figure 12:
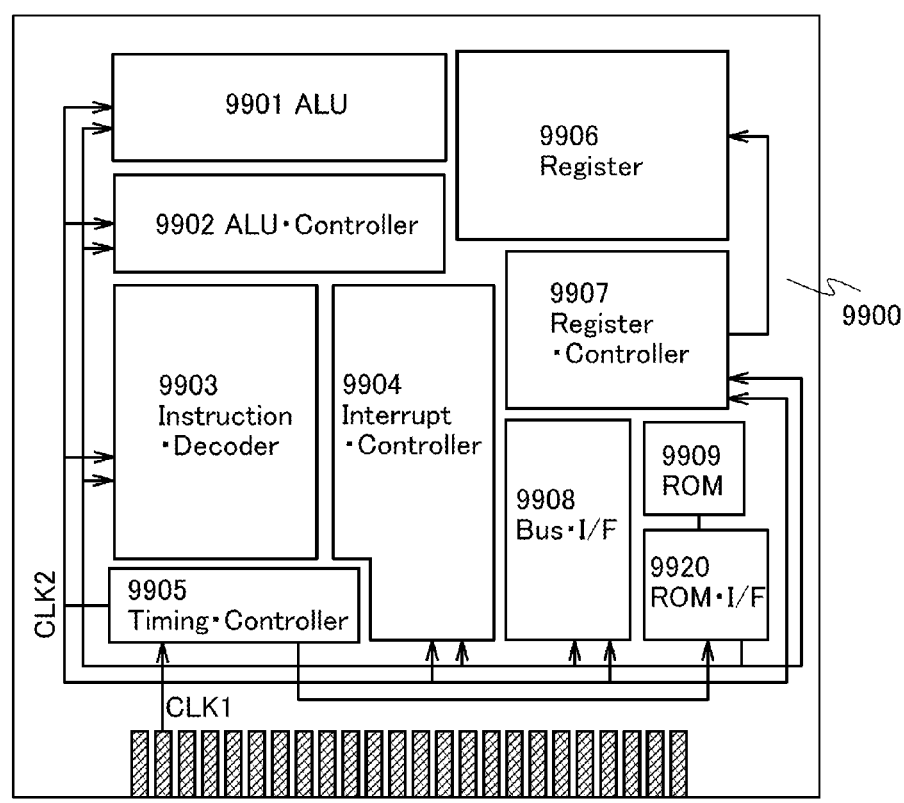
FIG. 12 is a block diagram of a CPU including the memory circuit.

FIG. 12 illustrates the configuration of the CPU according to this embodiment.

The CPU illustrated in FIG. 12 mainly includes an arithmetic logic unit (ALU) 9901, an ALU controller 9902, an instruction decoder 9903, an interrupt controller 9904, a timing controller 9905, a register 9906, a register controller 9907, a bus interface (Bus I/F) 9908, a rewritable ROM 9909, and a ROM interface (ROM I/F) 9920, over a substrate 9900. Further, the ROM 9909 and the ROM I/F 9920 may be provided over different chips. Naturally, the CPU illustrated in FIG. 12 is only an example with a simplified configuration, and an actual CPU may vary in configuration depending on its application.

An instruction which is input to the CPU through the Bus I/F 9908 is input to the instruction decoder 9903 and decoded therein, and then, input to the ALU controller 9902, the interrupt controller 9904, the register controller 9907, and the timing controller 9905.

The ALU controller 9902, the interrupt controller 9904, the register controller 9907, and the timing controller 9905 conduct control operations in accordance with the decoded instruction. Specifically, the ALU controller 9902 generates signals for controlling the drive of the ALU 9901. While the CPU is executing a program, the interrupt controller 9904 determines an interrupt request from an external input/output device or a peripheral circuit on the basis of its priority or a mask state, and processes the request. The register controller 9907 generates an address of the register 9906, and reads/writes a data signal from/to the register 9906 in accordance with the state of the CPU.

The timing controller 9905 generates signals for controlling a drive timing of the ALU 9901, the ALU controller 9902, the instruction decoder 9903, the interrupt controller 9904, and the register controller 9907. For example, the timing controller 9905 is provided with an internal clock generator for generating an internal clock signal CLK2 on the basis of a reference clock signal CLK1, and supplies the clock signal CLK2 to the above circuits.

In the CPU according to this embodiment, a memory circuit having the structure described in any of the above embodiments is provided in the register 9906. The register controller 9907 determines in accordance with instruction from the ALU 9901 whether a data signal is to be held in the volatile memory section 105 or in the nonvolatile memory section 106 in the memory circuit in the register 9906. When the register controller 9907 determines that a data signal is to be held in the volatile memory section 105, power is supplied to the memory circuit in the register 9906. When the register controller 9907 determines that a data signal is to be held in the nonvolatile memory section 106, the supply of power to the memory circuit in the register 9906 can be stopped.

Thus, even in the case where the operation of the CPU is temporarily stopped and the supply of power is stopped, a data signal can be held and power consumption can be reduced. Specifically, for example, the operation of the CPU can be stopped while the user of a personal computer does not input a data signal to an input device such as a keyboard, so that the power consumption can be reduced.

Although the example of the CPU is described in this embodiment, the signal processing unit of the present invention is not limited to the CPU and can be used in an LSI such as a microprocessor, an image processing circuit, a digital signal processor (DSP), or a field programmable gate array (FPGA).

This embodiment can be implemented in appropriate combination with any of the above embodiments.

This embodiment describes a method for manufacturing the memory circuit 100, specifically, the second transistor 122 whose channel is formed in silicon, the first transistor 121 whose channel is formed in an oxide semiconductor layer, and the capacitor 123 in the nonvolatile memory section 106 in FIG. 1B.

Figure 13A:
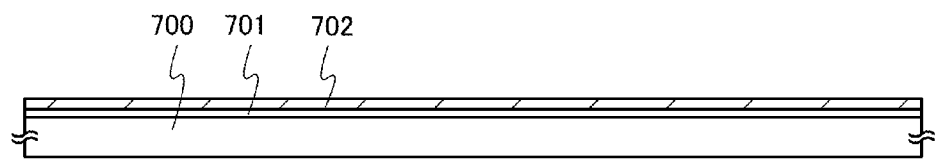
FIGS. 13A to 13D are diagrams showing a process for manufacturing the memory circuit.

As illustrated in FIG. 13A, an insulating film 701 and a semiconductor film 702 that has been separated from a single crystal semiconductor substrate are formed over a substrate 700.

Although there is no particular limitation on a material which can be used as the substrate 700, the material needs to have at least heat resistance high enough to withstand the subsequent heat treatment. For example, a glass substrate formed by a fusion process or a float process, a quartz substrate, a semiconductor substrate, a ceramic substrate, or the like can be used as the substrate 700. In the case where the temperature for the subsequent heat treatment is high, a glass substrate whose strain point is greater than or equal to 730° C. is preferably used as the glass substrate.

This embodiment now describes a method for forming the second transistor 122, in which the semiconductor film 702 is supposed to be composed of single crystal silicon. Note that a specific example of a method for forming the single crystal semiconductor film 702 is briefly described. First, an ion beam including ions which are accelerated by an electric field enters a bond substrate which is the single crystal semiconductor substrate and an embrittlement layer which is made fragile by local disorder of the crystal structure is formed in a region at a certain depth from a surface of the bond substrate. The depth at which the embrittlement layer is formed can be adjusted by the acceleration energy of the ion beam and the angle at which the ion beam enters. Then, the bond substrate and the substrate 700 which is provided with the insulating film 701 are attached to each other so that the insulating film 701 is provided therebetween. After the bond substrate and the substrate 700 overlap with each other, a pressure of approximately 1 N/cm$^2$ to 500 N/cm$^2$, preferably 11 N/cm$^2$ to 20 N/cm$^2$ is applied to part of the bond substrate and part of the substrate 700 so that the substrates are attached to each other. When the pressure is applied, bonding between the bond substrate and the insulating film 701 starts from the parts, which results in bonding of the entire surface where the bond substrate and the insulating film 701 are in close contact with each other. Subsequently, heat treatment is performed, so that microvoids that exist in the fragile layer are combined and the microvoids increase in volume. Consequently, a single crystal semiconductor film which is part of the bond substrate is separated from the bond substrate along the embrittlement layer. The heat treatment is performed at temperatures not exceeding the strain point of the substrate 700. Then, the single crystal semiconductor film is processed into a desired shape by etching or the like to form the semiconductor film 702.

In order to control the threshold voltage, an impurity element producing p-type conductivity, such as boron, aluminum, or gallium, or an impurity element producing n-type conductivity, such as phosphorus or arsenic, may be added to the semiconductor film 702. An impurity element for controlling the threshold voltage may be added to the semiconductor film which is not patterned or may be added to the patterned semiconductor film 702. Alternatively, the impurity element for controlling the threshold voltage may be added to the bond substrate. Alternatively, the impurity element may be added to the bond substrate in order to roughly control the threshold voltage, and the impurity element may be further added to the semiconductor film which is not patterned or the patterned semiconductor film 702 in order to finely control the threshold voltage.

Although this embodiment describes the case where a single crystal semiconductor film is used, the present invention is not limited to this. For example, a polycrystalline, microcrystalline, or amorphous semiconductor film which is formed over the insulating film 701 by vapor deposition may be used. Alternatively, the semiconductor film may be crystallized by a known technique. Examples of known crystallization technique include laser crystallization using a laser beam, and crystallization with a catalytic element. Alternatively, crystallization with a catalytic element and laser crystallization may be combined. When a heat-resistant substrate such as a quartz substrate is used, crystallization combined with thermal crystallization with an electrically heated oven, lamp annealing crystallization with infrared light, crystallization with a catalytic element, or high-temperature annealing at approximately 950° C., may be used.

Figure 13B:
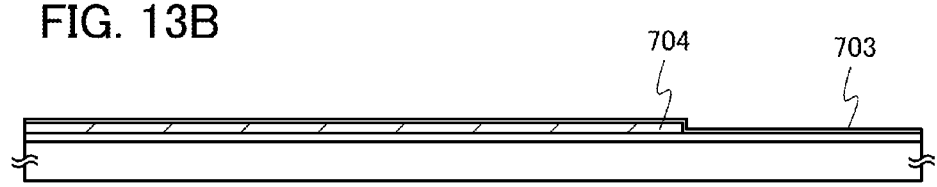

Next, as shown in FIG. 13B, a semiconductor layer 704 is formed based on the semiconductor film 702. Then, a gate insulating film 703 is formed over the semiconductor layer 704.

The gate insulating film 703 can be a single layer or a stack of layers containing silicon oxide, silicon nitride oxide, silicon oxynitride, silicon nitride, hafnium oxide, aluminum oxide, tantalum oxide, yttrium oxide, hafnium silicate (HfSi$_x$O$_y$, (x>0, y>0)), hafnium silicate (HfSi$_x$O$_y$ (x>0, y>0)) to which nitrogen is added, hafnium aluminate (HfAl$_x$O$_y$, (x>0, y>0)) to which nitrogen is added, or the like by, for example, plasma CVD or sputtering.

Note that, in this specification, an oxynitride refers to a material containing a larger amount of oxygen than that of nitrogen, and a nitride oxide compound refers to a material containing a larger amount of nitrogen than that of oxygen.

The thickness of the gate insulating film 703 can be, for example, greater than or equal to 1 nm and less than or equal to 100 nm, preferably greater than or equal to 10 nm and less than or equal to 50 nm. In this embodiment, a single-layer insulating film containing silicon oxide is used as the gate insulating film 703 by plasma CVD.

Figure 13C:
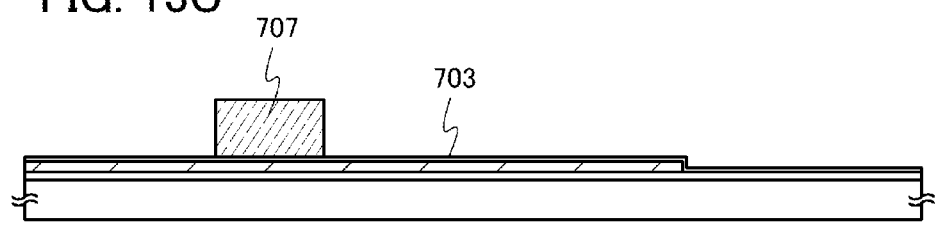

Then, a gate electrode 707 is formed as shown in FIG. 13C.

To form the gate electrode 707, a conductive film is formed and then is processed (patterned) into a predetermined shape. The conductive film can be formed by CVD, sputtering, vapor deposition, spin coating, or the like. The conductive film is composed of tantalum (Ta), tungsten (W), titanium (Ti), molybdenum (Mo), aluminum (Al), copper (Cu), chromium (Cr), niobium (Nb), or the like. Alternatively, the conductive film may be composed of an alloy mainly of any of these metals, or a compound of any of these metals. Alternatively, the conductive film may be composed of a semiconductor such as polycrystalline silicon doped with an impurity element such as phosphorus which imparts conductivity to the semiconductor film.

Although the gate electrode 707 and the conductive film 708 are composed of a single-layer conductive film in this embodiment, this embodiment is not limited to this structure. The gate electrode 707 and the conductive film 708 may be a stack of a plurality of conductive films.

An example of the combination of two conductive films is a stack of a tantalum nitride or tantalum layer overlaid by a tungsten layer. Other examples of the combination of two conductive films include the combination of tungsten nitride and tungsten, the combination of molybdenum nitride and molybdenum, the combination of aluminum and tantalum, and the combination of aluminum and titanium. Since tungsten and tantalum nitride have high heat resistance, a heat treatment aimed at thermal activation can be performed in the subsequent steps after forming the two conductive films. Other examples of the combination of the two conductive films include the combination of nickel silicide and silicon doped with an impurity element producing n-type conductivity, and the combination of tungsten silicide and silicon doped with an impurity element producing n-type conductivity.

In the case where a stack of three conductive films is used, the stack is preferably composed of a molybdenum film, an aluminum film, and a molybdenum film.

The gate electrode 707 can be a light-transmitting oxide conductive film of indium oxide, indium oxide and tin oxide, indium oxide and zinc oxide, zinc oxide, zinc aluminum oxide, zinc aluminum oxynitride, zinc gallium oxide, or the like.

Alternatively, the gate electrode 707 may be selectively formed by a droplet discharge method without a mask. A droplet discharge method refers to a method for forming a predetermined pattern by discharge or ejection of a droplet containing a predetermined composition from an orifice, and includes an inkjet method in its category.

In addition, the gate electrode 707 may be formed by the following process. A conductive film is formed and then is etched by inductively coupled plasma (ICP) etching under appropriately controlled conditions (e.g., the amount of electric power applied to a coiled electrode layer, the amount of electric power applied to an electrode layer on the substrate side, and the electrode temperature on the substrate side) to be tapered in a desired shape. The taper angle and the like can be adjusted also by the shape of a mask. Note that the etching gas can be, as appropriate, a chlorine-based gas such as chlorine, boron chloride, silicon chloride, or carbon tetrachloride; a fluorine-based gas such as carbon tetrafluoride, sulfur fluoride, or nitrogen fluoride; or oxygen.

Figure 13D:
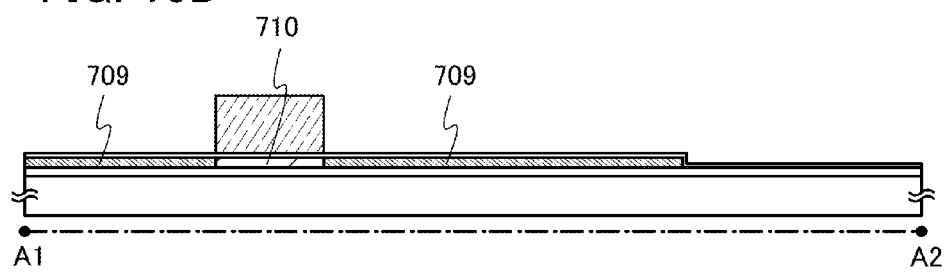

Next, as illustrated in FIG. 13D, by adding an impurity element producing one conductivity to the semiconductor layer 704 with the gate electrode 707 used as a mask, a channel formation region 710 overlapping with the gate electrode 707, and a pair of impurity regions 709 between which the channel formation region 710 is provided are formed in the semiconductor layer 704.

This embodiment takes the case where an impurity element producing p-type conductivity (e.g., boron) is added to the semiconductor layer 704, as an example.

Figure 14A:
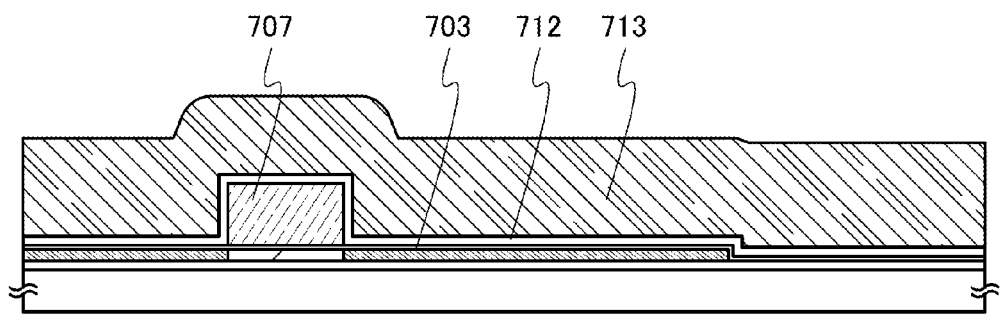
FIGS. 14A to 14C are diagrams showing the process for manufacturing the memory circuit.

Next, as illustrated in FIG. 14A, insulating films 712 and 713 are formed so as to cover the gate insulating film 703 and the gate electrode 707. Specifically, an inorganic insulating film of silicon oxide, silicon nitride, silicon nitride oxide, silicon oxynitride, aluminum nitride, aluminum nitride oxide, or the like can be used as the insulating films 712 and 713. The insulating films 712 and 713 are preferably composed of a low dielectric constant (low-k) material to sufficiently reduce capacitance due to overlapping electrodes or wires. Note that a porous insulating film containing such a material may be used as the insulating films 712 and 713. Because the porous insulating film has lower dielectric constant than a dense insulating layer, parasitic capacitance due to electrodes or wires can be further reduced.

This embodiment describes the case where silicon oxynitride is used for the insulating film 712 and silicon nitride oxide is used for the insulating film 713, as an example. Although this embodiment describes the case where the insulating films 712 and 713 are formed over the gate electrode 707 and the conductive film 708 as an example, in one embodiment of the present invention, either a single insulating film or a stack of three or more insulating films may be formed over the gate electrode 707 and the conductive film 708.

Figure 14B:
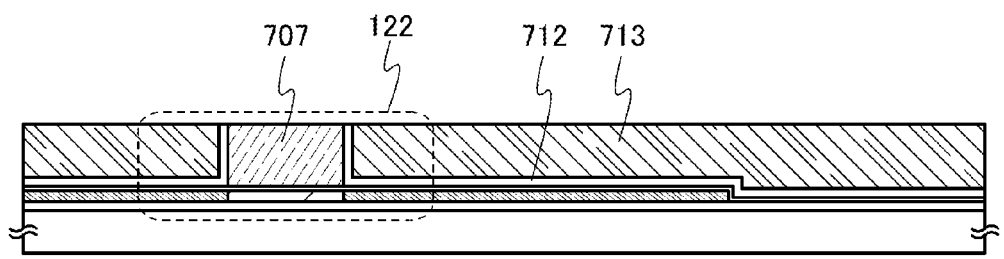

Next, as illustrated in FIG. 14B, the insulating film 713 is subjected to CMP (chemical mechanical polishing) or etching to planarize the exposed upper surfaces of the gate electrode 707 and the conductive film 708. Note that in order to improve the characteristics of a first transistor 121 subsequently formed, a surface of the insulating film 713 is preferably made as flat as possible.

The transistor 122 can be formed by the above process.

Figure 14C:
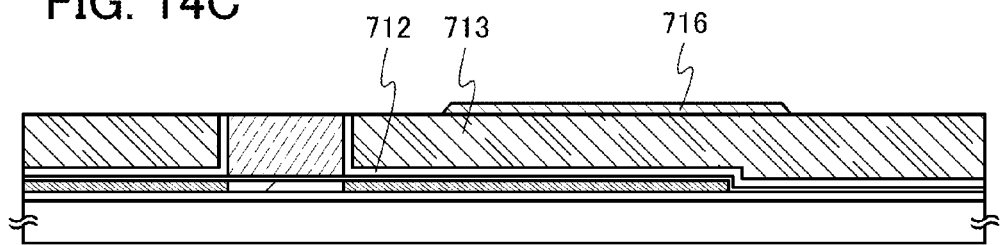

Next, a method for manufacturing the first transistor 121 is described. First, as illustrated in FIG. 14C, an oxide semiconductor layer 716 is formed over the insulating film 712 or the insulating film 713.

The oxide semiconductor layer 716 can be formed by processing an oxide semiconductor film formed over the insulating film 713 into a desired shape. The thickness of the oxide semiconductor film is greater than or equal to 2 nm and less than or equal to 200 nm, preferably greater than or equal to 3 nm and less than or equal to 50 nm, more preferably greater than or equal to 3 nm and less than or equal to 20 nm.

The oxide semiconductor film is deposited by sputtering with an oxide semiconductor target. The oxide semiconductor film can be formed by sputtering in a rare gas (e.g., argon) atmosphere, an oxygen atmosphere, or a mixed atmosphere of a rare gas (e.g., argon) and oxygen.

Note that before the oxide semiconductor film is deposited by sputtering, dust attached to the surface of the insulating film 713 is preferably removed by reverse sputtering in which an argon gas is introduced and plasma is generated. The reverse sputtering refers to a method in which a voltage is applied to a substrate by using an RF power source in an argon atmosphere to generate plasma in the vicinity of the substrate to modify a surface without application of voltage to a target. Note that instead of an argon atmosphere, a nitrogen atmosphere, a helium atmosphere, or the like may be used. Alternatively, an argon atmosphere to which oxygen, nitrous oxide, or the like is added may be used. Alternatively, an argon atmosphere to which chlorine, carbon tetrafluoride, or the like is added may be used.

As the oxide semiconductor film, any of the following metal oxides can be used: a quaternary metal oxide such as an In—Sn—Ga—Zn-based oxide; a ternary metal oxide such as an In—Ga—Zn-based oxide, an In—Sn—Zn-based oxide, an In—Al—Zn-based oxide, a Sn—Ga—Zn-based oxide, an Al—Ga—Zn-based oxide, and a Sn—Al—Zn-based oxide; a binary metal oxide such as an In—Zn-based oxide, a Sn—Zn-based oxide, an Al—Zn-based oxide, a Zn—Mg-based oxide, a Sn—Mg-based oxide, an In—Mg-based oxide, and an In—Ga-based oxide; an indium oxide; a tin oxide; a zinc oxide; and the like.

Note that the use of an In—Sn—Zn-based oxide semiconductor can increase the mobility of the transistor. Further, the use of an In—Sn—Zn-based oxide semiconductor allows the threshold voltage of the transistor to be stably controlled. In the case where an In—Sn—Zn-based oxide semiconductor is used, a target may have a composition ratio of In:Sn:Zn=1:2:2, In:Sn:Zn=2:1:3, In:Sn:Zn=1:1:1, or In:Sn:Zn=20:45:35 in an atomic ratio, for example.

In this embodiment, as the oxide semiconductor film, an In—Ga—Zn-based oxide semiconductor thin film with a thickness of 30 nm, which is obtained by sputtering using a target including indium (In), gallium (Ga), and zinc (Zn), is used. The target has a composition ratio, for example, of In:Ga:Zn=1:1:0.5, In:Ga:Zn=1:1:1, or In:Ga:Zn=1:1:2. The filling rate of the target including In, Ga, and Zn ranges from 90% to 100%, preferably from 95% to 100%. The target with high filling rate enables the deposited oxide semiconductor film to be dense.

In this embodiment, the oxide semiconductor film is formed in such a manner that the substrate is held in a treatment chamber kept at reduced pressure, a sputtering gas from which hydrogen and moisture are removed is introduced into the treatment chamber while remaining moisture therein is removed, and the above target is used. The substrate temperature may range from 100° C. to 600° C., preferably from 200° C. to 400° C. for the deposition. By depositing the oxide semiconductor film while heating the substrate, the concentration of impurities contained in the deposited oxide semiconductor film can be reduced. In addition, damage by sputtering can be reduced. In order to remove residual moisture in the treatment chamber, an entrapment vacuum pump is preferably used. A cryopump, an ion pump, or a titanium sublimation pump, for example, is preferably used. The evacuation unit may be a turbo pump provided with a cold trap. In the treatment chamber which is evacuated with the cryopump, for example, a hydrogen atom, a compound containing a hydrogen atom, such as water ($H_2O$), (preferably, also a compound containing a carbon atom), and the like are removed, so that the concentration of impurities contained in the oxide semiconductor film deposited in the treatment chamber can be reduced.

As one example of the deposition condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulsed direct-current (DC) power supply is preferable because dust generated in deposition can be reduced and the film thickness can be made uniform.

Moreover, when the leakage rate of the treatment chamber of the sputtering apparatus is set to lower than or equal to $1\times10^{-10}$ Pa·m$^3$/second, entry of impurities such as an alkali metal or hydride into the oxide semiconductor film that is being formed by sputtering can be reduced. Further, with the use of an entrapment vacuum pump as an exhaustion system, counter flow of impurities, such as alkali metal, hydrogen atoms, hydrogen molecules, water, a hydroxyl group, or hydride, from the exhaustion system can be reduced.

When the purity of the target is set to 99.99% or higher, alkali metal, hydrogen atoms, hydrogen molecules, water, a hydroxyl group, hydride, or the like mixed to the oxide semiconductor film can be reduced. In addition, when the target is used, the concentration of alkali metal such as lithium, sodium, or potassium can be reduced in the oxide semiconductor film.

Note that in order that hydrogen, a hydroxyl group, and moisture be contained in the oxide semiconductor film as little as possible, it is preferable that an impurity such as hydrogen or moisture that is adsorbed on the substrate 700 be eliminated and exhausted by preheating of the substrate 700 over which the insulating films 712 and 713 are formed in a preheating chamber of a sputtering apparatus, as pretreatment for deposition. The temperature for the preheating is higher than or equal to 100° C. and lower than or equal to 400° C., preferably higher than or equal to 150° C. and lower than or equal to 300° C. As an evacuation means, a cryopump is preferably provided in the preheating chamber. Note that this preheating treatment can be omitted. This preheating may be similarly performed on the substrate 700 over which conductive films 719 and 720 are formed before the deposition of a gate insulating film 721.

Note that etching for forming the oxide semiconductor layer 716 may be dry etching, wet etching, or both dry etching and wet etching. As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate RIE (reactive ion etching) method or an ICP (inductively coupled plasma) etching method can be used. In order to etch the film to have a desired shape, the etching conditions (e.g., the amount of electric power applied to a coiled electrode, the amount of electric power applied to an electrode on the substrate side, and the electrode temperature on the substrate side) are adjusted as appropriate.

As an etchant used for the wet etching, a mixed solution of phosphoric acid, acetic acid, and nitric acid, or organic acid such as citric acid or oxalic acid can be used. In this embodiment, ITO-07N (produced by KANTO CHEMICAL CO., INC.) is used.

A resist mask used for forming the oxide semiconductor layer 716 may be formed by an inkjet method. Formation of the resist mask by an inkjet method needs no photomask; thus, manufacturing cost can be reduced.

Note that it is preferable that reverse sputtering be performed before the formation of a conductive film in a subsequent step so that a resist residue and the like that attaches onto surfaces of the oxide semiconductor layer 716 and the insulating films 712 and 713 are removed.

Note that the oxide semiconductor film deposited by sputtering or the like contains a large amount of moisture or hydrogen (including a hydroxyl group) as an impurity in some cases. Moisture or hydrogen easily forms donor levels and thus serves as an impurity in the oxide semiconductor. In one embodiment of the present invention, in order to reduce impurities such as moisture or hydrogen in the oxide semiconductor film (dehydration or dehydrogenation), the oxide semiconductor layer 716 is preferably subjected to heat treatment in a reduced pressure atmosphere, an inert gas atmosphere of nitrogen, a rare gas, or the like, an oxygen gas atmosphere, or an ultra dry air atmosphere (the moisture amount is 20 ppm (−55° C. by conversion into a dew point) or less, preferably 1 ppm or less, further preferably 10 ppb or less, in the case where the measurement is performed by a dew point meter in a cavity ring down laser spectroscopy (CRDS) method).

By subjection the island-shaped oxide semiconductor layer 716 to heat treatment, moisture or hydrogen in the oxide semiconductor layer 716 can be eliminated. Specifically, heat treatment may be performed at a temperature higher than or equal to 250° C. and lower than or equal to 750° C., preferably higher than or equal to 400° C. and lower than the strain point of a substrate. For example, heat treatment may be performed at 500° C. for approximately three minutes to six minutes. When RTA is used for the heat treatment, dehydration or dehydrogenation can be performed in a short time; thus, treatment can be performed even at a temperature higher than the strain point of a glass substrate.

In this embodiment, an electrical furnace that is one of heat treatment apparatuses is used.

Note that the heat treatment apparatus is not limited to an electric furnace, and may have a device for heating an object by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, like nitrogen or a rare gas such as argon is used.

In the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably greater than or equal to 6 N (99.9999%), more preferably greater than or equal to 7 N (99.99999%) (i.e., the impurity concentration is less than or equal to 1 ppm, preferably less than or equal to 0.1 ppm).

Note that it has been pointed out that an oxide semiconductor is insensitive to impurities, there is no problem when a considerable amount of metal impurities is contained in the film, and therefore, soda-lime glass which contains a large amount of alkali metal such as sodium and is inexpensive can also be used (Kamiya, Nomura, and Hosono, "Engineering application of solid state physics: Carrier transport properties and electronic structures of amorphous oxide semiconductors: the present status", *KOTAI BUTSURI (SOLID STATE*

PHYSICS), 2009, Vol. 44, pp. 621-633). But such consideration is not appropriate. Alkali metal is not an element included in an oxide semiconductor, and therefore, is an impurity. Also, alkaline earth metal is impurity in the case where alkaline earth metal is not included in an oxide semiconductor. Alkali metal, in particular, Na becomes Na+ when an insulating film in contact with the oxide semiconductor layer is an oxide and Na diffuses into the insulating layer. In addition, in the oxide semiconductor layer, Na cuts or enters a bond between metal and oxygen which are included in an oxide semiconductor. As a result, for example, deterioration of characteristics of the transistor, such as a normally-on state of the transistor due to shift of a threshold voltage in the negative direction, or reduction in mobility, occurs. In addition, variation in characteristics also occurs. Such deterioration of characteristics of the transistor and variation in characteristics due to the impurity remarkably appear when the hydrogen concentration in the oxide semiconductor layer is very low. Therefore, when the hydrogen concentration in the oxide semiconductor layer is less than or equal to $1\times10^{18}$ atoms/cm$^3$, preferably less than or equal to $1\times10^{17}$ atoms/cm$^3$, the concentration of the above impurity is preferably reduced. Specifically, a measurement value of a Na concentration by secondary ion mass spectrometry is preferably less than or equal to $5\times10^{16}$ atoms/cm$^3$, more preferably less than or equal to $1\times10^{16}$ atoms/cm$^3$, still more preferably less than or equal to $1\times10^{15}$ atoms/cm$^3$. In a similar manner, a measurement value of a Li concentration is preferably less than or equal to $5\times10^{15}$ atoms/cm$^3$, more preferably less than or equal to $1\times10^{15}$ atoms/cm$^3$. In a similar manner, a measurement value of a K concentration is preferably less than or equal to $5\times10^{15}$ atoms/cm$^3$, more preferably less than or equal to $1\times10^{15}$ atoms/cm$^3$.

Through the above steps, the concentration of hydrogen in the oxide semiconductor layer can be reduced and the oxide semiconductor layer can be purified. Thus, the oxide semiconductor layer can be stabilized. In addition, the heat treatment at a temperature of lower than or equal to the glass transition temperature makes it possible to form an oxide semiconductor layer with a wide bandgap and a very low carrier density due to hydrogen. Therefore, the transistor can be manufactured using a large-sized substrate, so that the productivity can be increased. In addition, with the purified oxide semiconductor layer in which the hydrogen concentration is reduced, a transistor with high withstand voltage and a very low off-state current can be manufactured. The above heat treatment can be performed at any time after the oxide semiconductor layer is formed.

Note that the oxide semiconductor layer may be either amorphous or crystalline. The crystalline oxide semiconductor layer is preferably composed of an oxide having c-axis alignment (also called c-axis aligned crystal (CAAC)) to offer the advantage of high reliability of the transistor.

Specifically, a CAAC is a non-single-crystal semiconductor that has a triangular, hexagonal, equilateral triangular, or regular hexagonal atomic arrangement when seen from a direction perpendicular to an a-b plane. Moreover, the CAAC has a phase in which metal atoms are layered when seen from the direction perpendicular to the c-axis direction or a phase in which metal atoms and oxygen atoms are layered when seen from the direction perpendicular to the c-axis direction.

In a CAAC, metal atoms and oxygen atoms are bonded in an orderly manner in comparison with a totally amorphous oxide semiconductor. That is to say, in the case where an oxide semiconductor is totally amorphous, the coordination numbers might vary between various metal atoms, but the coordination numbers of metal atoms are almost the same as each other in the CAAC. Therefore, microscopic defects of oxygen can be reduced and instability and moving of charge that are due to attachment and detachment of hydrogen atoms (including hydrogen ions) or alkali metal atoms can be reduced.

For this reason, a transistor containing an oxide semiconductor film composed of a CAAC, so that the amount of shift of the threshold voltage of the transistor, which occurs after light irradiation and a bias-temperature (BT) stress test are performed on the transistor, can be reduced. Consequently, a transistor having stable electric characteristics can be formed.

An oxide semiconductor film composed of a CAAC can also be formed by sputtering. In order to obtain a CAAC by sputtering, it is important that hexagonal crystals be formed in the initial stage of deposition of an oxide semiconductor film and other crystals grow on the hexagonal crystals serving as seed crystals. To achieve this, it is preferable that the distance between the target and the substrate be long (e.g., 150 mm to 200 mm) and the substrate heating temperature be 100° C. to 500° C., more preferably 200° C. to 400° C., still more preferably 250° C. to 300° C.

The proportion of oxygen gas in atmosphere is preferably set high when an oxide semiconductor film composed of a CAAC is deposited by sputtering. For sputtering in an argon-oxygen gas mixture, for example, the proportion of oxygen gas is preferably set 30% or more, more preferably 40% or more. This is because supply of oxygen from atmosphere promotes the crystallization of the CAAC.

When an oxide semiconductor film composed of a CAAC is deposited by sputtering, a substrate over which the oxide semiconductor film is deposited is heated preferably to 150° C. or more, more preferably to 170° C. or more. This is because the higher the substrate temperature, the more the crystallization of the CAAC is promoted.

After being subjected to heat treatment in a nitrogen atmosphere or in vacuum, the oxide semiconductor film composed of a CAAC is preferably subjected to heat treatment in an oxygen atmosphere or a gas mixture of oxygen and another gas. This is because oxygen deficiency due to the former heat treatment can be corrected by supply of oxygen from atmosphere in the latter heat treatment.

A film surface on which the oxide semiconductor film composed of a CAAC (deposition surface) is deposited is preferably flat. This is because irregularity of the deposition surface provides grain boundaries in the oxide semiconductor film composed of a CAAC because the c-axis approximately perpendicular to the deposition surface exists in the oxide semiconductor film composed of a CAAC. For this reason, the deposition surface is preferably subjected to planarization such as chemical mechanical polishing (CMP) before the oxide semiconductor film composed of a CAAC is formed. The average roughness of the deposition surface is preferably 0.5 nm or less, more preferably 0.3 nm or less.

Figure 15A:
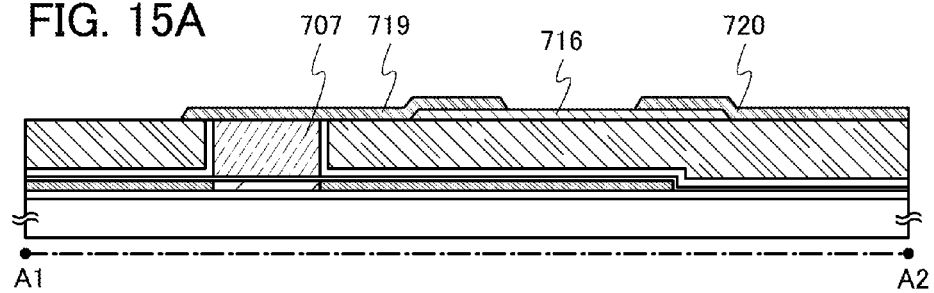
FIGS. 15A to 15C are diagrams showing the process for manufacturing the memory circuit.

Then, as illustrated in FIG. 15A, the conductive film 719 which is in contact with the gate electrode 707 and the oxide semiconductor layer 716, and the conductive film 720 which is in contact with the oxide semiconductor layer 716 are formed. The conductive films 719 and 720 function as a source and drain electrodes.

Specifically, the conductive films 719 and 720 can be formed in such a manner that a conductive film is formed so as to cover the gate electrode 707 and the insulating film 713 by sputtering or a vacuum vapor deposition method and then is processed (patterned) into a predetermined shape.

As the conductive film which serves as the conductive films 719 and 720, any of the following materials can be used: an element selected from aluminum, chromium, copper, tantalum, titanium, molybdenum, or tungsten; an alloy including any of these elements; an alloy film containing the above elements in combination; and the like. Alternatively, a structure may be employed in which a film of a refractory metal such as chromium, tantalum, titanium, molybdenum, or tungsten is stacked over or below a metal film of aluminum or copper. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used.

Further, the conductive film which serves as the conductive films 719 and 720 may have a single-layer structure or a layered structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in that order, and the like can be given. A Cu—Mg—Al alloy, a Mo—Ti alloy, Ti, and Mo have high adhesiveness with an oxide film. Therefore, for the conductive films 719 and 720, a layered structure is employed in which a conductive film containing a Cu—Mg—Al alloy, a Mo—Ti alloy, Ti, or Mo is used for the lower layer and a conductive film containing Cu is used for the upper layer; thus, the adhesiveness between an insulating film which is an oxide film and the conductive films 719 and 720 can be increased.

For the conductive film which serves as the conductive films 719 and 720, a conductive metal oxide may be used. As the conductive metal oxide, indium oxide, tin oxide, zinc oxide, indium oxide and tin oxide, indium oxide and zinc oxide, or the conductive metal oxide material containing silicon or silicon oxide can be used.

In the case where heat treatment is performed after formation of the conductive film, the conductive film preferably has heat resistance enough to withstand the heat treatment.

Note that each material and etching conditions are adjusted as appropriate so that the oxide semiconductor layer 716 is not removed as much as possible at the time of etching the conductive film. Depending on the etching conditions, an exposed portion of the oxide semiconductor layer 716 is partly etched, so that a groove (a depression portion) is formed in some cases.

In this embodiment, a titanium film is used for the conductive film. Therefore, wet etching can be selectively performed on the conductive film using a solution (an ammonia hydrogen peroxide mixture) containing ammonia and hydrogen peroxide water. As the ammonia hydrogen peroxide mixture, specifically, a solution in which hydrogen peroxide water of 31 wt %, ammonia water of 28 wt %, and water are mixed at a volume ratio of 5:2:2 is used. Alternatively, dry etching may be performed on the conductive film with the use of a gas containing chlorine ($Cl_2$), boron chloride ($BCl_3$), or the like.

In order to reduce the number of photomasks and steps in a photolithography step, etching may be performed with the use of a resist mask composed of a multi-tone mask which is a light-exposure mask through which light is transmitted so as to have a plurality of intensities. A resist mask composed of a multi-tone mask has a plurality of thicknesses and can be changed in shape by etching; thus, the resist mask can be used in a plurality of etching processes for processing films into different patterns. Therefore, a resist mask corresponding to at least two kinds or more of different patterns can be formed by one multi-tone mask. Thus, the number of light-exposure masks can be reduced and the number of corresponding photolithography steps can be also reduced, so that simplification of a process can be realized.

Further, an oxide conductive film functioning as a source region and a drain region may be provided between the oxide semiconductor layer 716 and the conductive films 719 and 720 functioning as source and drain electrodes. The material of the oxide conductive film preferably contains zinc oxide as a component and preferably does not contain indium oxide. For such an oxide conductive film, zinc oxide, zinc aluminum oxide, zinc aluminum oxynitride, gallium zinc oxide, or the like can be used.

For example, in the case where the oxide conductive film is formed, patterning for forming the oxide conductive film and patterning for forming the conductive films 719 and 720 may be performed concurrently.

With provision of the oxide conductive film functioning as a source region and a drain region, resistance between the oxide semiconductor layer 716 and the conductive films 719 and 720 can be lowered, so that the transistor can operate at high speed. In addition, with provision of the oxide conductive film functioning as a source region and a drain region, the withstand voltage of the transistor can be increased.

Next, plasma treatment may be performed using a gas such as $N_2O$, $N_2$, or Ar. By this plasma treatment, water or the like adhering to an exposed surface of the oxide semiconductor layer is removed. Plasma treatment may be performed using a mixture gas of oxygen and argon as well.

Figure 15B:
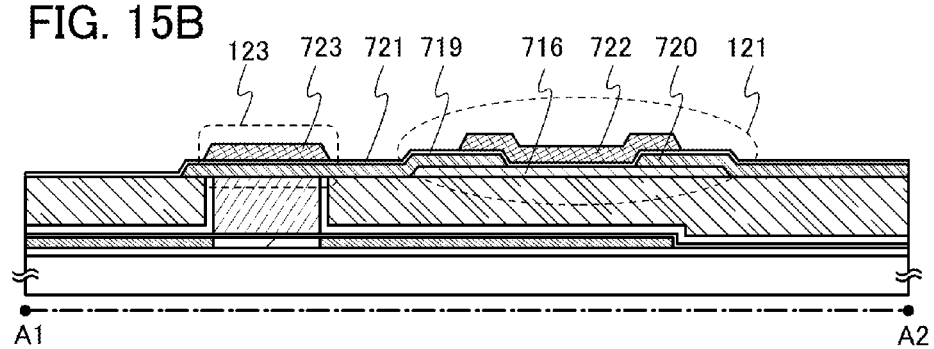

After the plasma treatment, as illustrated in FIG. 15B, the gate insulating film 721 is formed so as to cover the conductive films 719 and 720 and the oxide semiconductor layer 716. Then, a gate electrode 722 is formed over the gate insulating film 721 so as to overlap with the oxide semiconductor layer 716, and a conductive film 723 is formed over the conductive film 719 so as to overlap with the conductive film 719.

The gate insulating film 721 can be composed of a material and a layered structure which are similar to those of the gate insulating film 703. Note that the gate insulating film 721 preferably includes impurities such as moisture or hydrogen as little as possible, and the gate insulating film 721 may be composed of a single-layer insulating film or a plurality of insulating films stacked. When hydrogen is contained in the gate insulating film 721, hydrogen enters the oxide semiconductor layer 716 or oxygen in the oxide semiconductor layer 716 is extracted by hydrogen, so that the oxide semiconductor layer 716 has lower resistance (n-type conductivity); thus, a parasitic channel might be formed. Thus, it is important that a deposition method in which hydrogen is not used be employed in order to form the gate insulating film 721 containing hydrogen as little as possible. A material having a high barrier property is preferably used for the gate insulating film 721. As the insulating film having a high barrier property, a silicon nitride film, a silicon nitride oxide film, an aluminum nitride film, an aluminum nitride oxide film, or the like can be used, for example. When a plurality of insulating films stacked are used, an insulating film having low proportion of nitrogen such as a silicon oxide film or a silicon oxynitride film is formed on a side which is closer to the oxide semiconductor layer 716 than the insulating film having a high barrier property. Then, the insulating film having a high barrier property is formed so as to overlap with the conductive films 719 and 720 and the oxide semiconductor layer 716 with the insulating film having low proportion of nitrogen sandwiched therebetween. When the insulating film having a high barrier property is used, impurities such as moisture or hydrogen can be prevented from entering the oxide semiconductor layer 716, the gate insulating film 721, or the interface between the oxide semiconductor layer 716 and another insulating film and the vicinity thereof. In addition, the insulating film having low proportion of nitrogen, such as a silicon oxide film or a silicon oxynitride film, is formed so as to be in contact with the oxide semiconductor layer 716, so that the insulating film having a high barrier property can be prevented from being in direct contact with the oxide semiconductor layer 716.

In this embodiment, the gate insulating film 721 with a structure in which a silicon nitride film with a thickness of 100 nm formed by sputtering is stacked over a silicon oxide film with a thickness of 200 nm formed by sputtering is formed. The substrate temperature at deposition may be higher than or equal to room temperature and lower than or equal to 300° C. and in this embodiment, is 100° C.

After the gate insulating film 721 is formed, heat treatment may be performed. The heat treatment is performed in a nitrogen atmosphere, ultra-dry air, or a rare gas (e.g., argon or helium) atmosphere preferably at a temperature higher than or equal to 200° C. and lower than or equal to 400° C., for example, higher than or equal to 250° C. and lower than or equal to 350° C. It is preferable that the water content in the gas be 20 ppm or less, preferably 1 ppm or less, further preferably 10 ppb or less. In this embodiment, for example, heat treatment is performed at 250° C. in a nitrogen atmosphere for one hour. Alternatively, RTA treatment for a short time at a high temperature may be performed before the formation of the conductive films 719 and 720 in a manner similar to that of the heat treatment performed on the oxide semiconductor film for reduction of moisture or hydrogen. Even when oxygen defects are generated in the oxide semiconductor layer 716 by the heat treatment performed on the oxide semiconductor layer 716 by performing heat treatment after provision of the gate insulating film 721 containing oxygen, oxygen is supplied to the oxide semiconductor layer 716 from the gate insulating film 721. By the supply of oxygen to the oxide semiconductor layer 716, oxygen defects that serve as donors can be reduced in the oxide semiconductor layer 716 and the stoichiometric composition can be satisfied. As a result, the oxide semiconductor layer 716 can be substantially intrinsic and variation in electrical characteristics of the transistor due to oxygen defects can be reduced; thus, electrical characteristics can be improved. The timing of this heat treatment is not particularly limited as long as it is after the formation of the gate insulating film 721. When this heat treatment serves as heat treatment in another step (e.g., heat treatment at the time of formation of a resin film or heat treatment for lowering the resistance of a transparent conductive film), the oxide semiconductor layer 716 can be made to be substantially intrinsic without the increase in the number of steps.

Alternatively, the oxygen defects that serve as donors in the oxide semiconductor layer 716 may be reduced by subjecting the oxide semiconductor layer 716 to heat treatment in an oxygen atmosphere so that oxygen is added to the oxide semiconductor. The heat treatment is performed, for example, at a temperature higher than or equal to 100° C. and lower than 350° C., preferably higher than or equal to 150° C. and lower than 250° C. It is preferable that an oxygen gas used for the heat treatment under an oxygen atmosphere do not include water, hydrogen, or the like. Alternatively, the purity of the oxygen gas which is introduced into the heat treatment apparatus is preferably greater than or equal to 6N (99.9999%) or more, further preferably greater than or equal to 7N (99.99999%) (that is, the impurity concentration in the oxygen gas is less than or equal to 1 ppm, preferably less than or equal to 0.1 ppm).

Alternatively, oxygen may be added to the oxide semiconductor layer 716 by an ion implantation method, an ion doping method, or the like so that oxygen defects that serve as donors are reduced. For example, oxygen made to be plasma with a microwave of 2.45 GHz may be added to the oxide semiconductor layer 716.

The gate electrode 722 and the conductive film 723 can be formed in such a manner that a conductive film is formed over the gate insulating film 721 and then is patterned. The gate electrode 722 and the conductive film 723 can be composed of the same material as that of the gate electrode 707 and the conductive films 719 and 720 and have the same layered structure as that of the gate electrode 707 and the conductive films 719 and 720.

The thickness of each of the gate electrode 722 and the conductive film 723 is 10 nm to 400 nm, preferably 100 nm to 200 nm. In this embodiment, after a conductive film with a thickness of 150 nm for the gate electrode is formed by sputtering using a tungsten target, the conductive film is processed (patterned) into a desired shape by etching, so that the gate electrode 722 and the conductive film 723 are formed. Note that a resist mask may be formed by an inkjet method. Formation of the resist mask by an inkjet method needs no photomask; thus, manufacturing cost can be reduced.

Through the above steps, the first transistor 121 is formed.

Note that a portion where the conductive film 719 and the conductive film 723 overlap with each other with the gate insulating film 721 provided therebetween corresponds to a capacitor 123.

Although the first transistor 121 is described as a single-gate transistor, a dual-gate or multi-gate transistor including a plurality of channel formation regions can be formed when a plurality of gate electrodes which are electrically connected are included when needed.

Note that an insulating film which is in contact with the oxide semiconductor layer 716 (in this embodiment, corresponding to the gate insulating film 721) may be composed of an insulating material containing an element that belongs to Group 13 and oxygen. By using such an insulating material containing a Group 13 element for the insulating film in contact with the oxide semiconductor layer, an interface with the oxide semiconductor layer can keep a favorable state.

An insulating material containing a Group 13 element refers to an insulating material containing one or more elements that belong to Group 13. As the insulating material containing a Group 13 element, a gallium oxide, an aluminum oxide, an aluminum gallium oxide, a gallium aluminum oxide, and the like are given. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, in the case of forming an insulating film in contact with an oxide semiconductor layer containing gallium, a material including gallium oxide may be used as an insulating film, so that favorable characteristics can be kept at the interface between the oxide semiconductor layer and the insulating film. When the oxide semiconductor layer and the insulating film containing gallium oxide are provided in contact with each other, pileup of hydrogen at the interface between the oxide semiconductor layer and the insulating film can be reduced, for example. Note that a similar effect can be obtained in the case where an element in the same group as a constituent element of the oxide semiconductor is used in an insulating film. For example, it is effective to form an insulating film with the use of a material including aluminum oxide. Note that aluminum oxide has a property of not easily transmitting water. Thus, it is preferable to use a material including aluminum oxide in terms of preventing entry of water to the oxide semiconductor layer.

The insulating film which is in contact with the oxide semiconductor layer 716 preferably contains oxygen in a proportion higher than that in the stoichiometric composition, by heat treatment in an oxygen atmosphere or oxygen doping. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed by ion implantation or ion doping.

For example, in the case where the insulating film which is in contact with the oxide semiconductor layer 716 is composed of gallium oxide, the composition of gallium oxide can be set to be $Ga_2O_X$ ($X=3+\alpha$, $0<\alpha<1$) by heat treatment in an oxygen atmosphere or oxygen doping.

In the case where the insulating film which is in contact with the oxide semiconductor layer 716 is composed of aluminum oxide, the composition of aluminum oxide can be set to be $Al_2O_X$ ($X=3+\alpha$, $0<\alpha<1$) by heat treatment in an oxygen atmosphere or oxygen doping.

In the case where the insulating film which is in contact with the oxide semiconductor layer 716 is composed of gallium aluminum oxide (aluminum gallium oxide), the composition of gallium aluminum oxide (aluminum gallium oxide) can be set to be $Ga_XAl_{2-X}O_{3+\alpha}$ ($0<X<2$, $0<\alpha<1$) by heat treatment in an oxygen atmosphere or oxygen doping.

By oxygen doping, an insulating film which includes a region where the proportion of oxygen is higher than that in the stoichiometric composition can be formed. When the insulating film including such a region is in contact with the oxide semiconductor layer, oxygen that exists excessively in the insulating film is supplied to the oxide semiconductor layer, and oxygen deficiency in the oxide semiconductor layer or at the interface between the oxide semiconductor layer and the insulating film is reduced. Thus, the oxide semiconductor layer can be formed to an intrinsic or substantially intrinsic oxide semiconductor.

The oxide semiconductor layer, in which oxygen deficiency has been reduced by supplying excessive oxygen in the insulating film to the oxide semiconductor layer, is a highly purified oxide semiconductor layer in which hydrogen concentration is sufficiently reduced and defect level in the energy gap due to oxygen deficiency is reduced by sufficient supply of oxygen. Consequently, the oxide semiconductor layer carrier can be an oxide semiconductor layer in which carrier concentration is extremely low, which enables the transistor to have an extremely low off-state current. When such a transistor having an extremely low off-state current is used as the first transistor according to the above embodiment, the first transistor can be considered substantially as an insulator when turned off. This means, when such a transistor is used as the first transistor 121 and the second transistor 111_2, a reduction in the potential of a first data holding point D_HOLD1 can be kept to an extremely low level. This reduces fluctuations in the potential of the first data holding point D_HOLD1 while the supply of power is stopped, preventing the stored data from being lost.

The insulating film including a region where the proportion of oxygen is higher than that in the stoichiometric composition may be applied to either the insulating film placed on an upper side of the oxide semiconductor layer or the insulating film placed on a lower side of the oxide semiconductor layer of the insulating films which are in contact with the oxide semiconductor layer 716; however, it is preferable to apply such an insulating film to both the insulating films which are in contact with the oxide semiconductor layer 716. The above effect can be enhanced with a structure where the oxide semiconductor layer 716 is provided between the insulating films each including a region where the proportion of oxygen is higher than that in the stoichiometric composition, which are used as the insulating films in contact with the oxide semiconductor layer 716 and positioned on the upper side and the lower side of the oxide semiconductor layer 716.

The insulating films on the upper side and the lower side of the oxide semiconductor layer 716 may contain the same constituent element or different constituent elements. For example, the insulating films on the upper side and the lower side may be both composed of gallium oxide whose composition is $Ga_2O_x$ ($x=3+\alpha$, $0<\alpha<1$). Alternatively, one of the insulating films on the upper side and the lower side may be composed of $Ga_2O_x$ ($x=3+\alpha$, $0<\alpha<1$) and the other may be composed of aluminum oxide whose composition is $Al_2O_x$ ($x=3+\alpha$, $0<\alpha<1$).

The insulating film which is in contact with the oxide semiconductor layer 716 may be formed by a stack of insulating films each including a region where the proportion of oxygen is higher than that in the stoichiometric composition. For example, the insulating film on the upper side of the oxide semiconductor layer 716 may be formed as follows: gallium oxide whose composition is $Ga_2O_X$ ($X=3+\alpha$, $0<\alpha<1$) is formed and gallium aluminum oxide (aluminum gallium oxide) whose composition is $Ga_XAl_{2-X}O_{3+\alpha}$ ($0<X<2$, $0<\alpha<1$) may be formed thereover. Note that the insulating film on the lower side of the oxide semiconductor layer 716 may be formed by a stack of insulating films each including a region where the proportion of oxygen is higher than that in the stoichiometric composition. Alternatively, both the insulating films on the upper side and the lower side of the oxide semiconductor layer 716 may be formed by a stack of insulating films each including a region where the proportion of oxygen is higher than that in the stoichiometric composition.

Figure 15C:
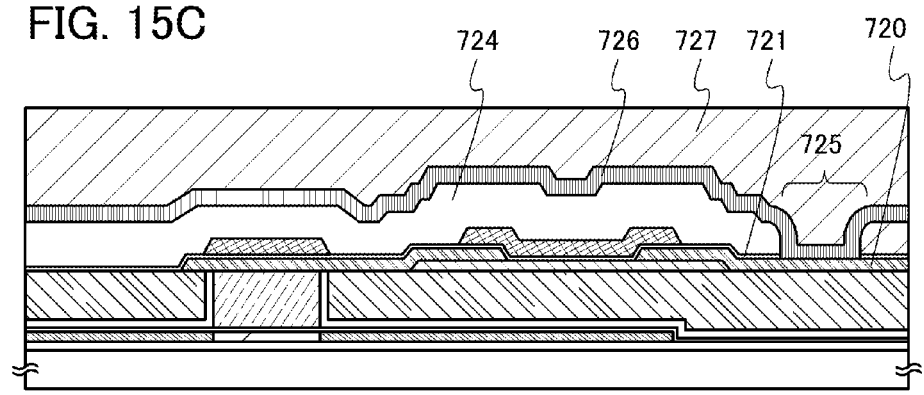

Next, as illustrated in FIG. 15C, an insulating film 724 is formed so as to cover the gate insulating film 721, and the gate electrode 722. The insulating film 724 can be formed by PVD, CVD, or the like. The insulating film 724 can be composed of a material including an inorganic insulating material such as silicon oxide, silicon oxynitride, silicon nitride, hafnium oxide, gallium oxide, or aluminum oxide. Note that for the insulating film 724, a material with a low dielectric constant or a structure with a low dielectric constant (e.g., a porous structure) is preferably used. When the dielectric constant of the insulating film 724 is lowered, parasitic capacitance generated between wirings or electrodes can be reduced, which results in higher speed operation. Note that although the insulating film 724 has a single-layer structure in this embodiment, one embodiment of the present invention is not limited to this structure. The insulating film 724 may have a layered structure of two or more layers.

Next, an opening 725 is formed in the gate insulating film 721 and the insulating film 724, so that part of the conductive film 720 is exposed. After that, a wiring 726 which is in contact with the conductive film 720 through the opening 725 is formed over the insulating film 724.

A conductive film is formed by PVD or CVD and then is patterned, so that the wiring 726 is formed. As the material of the conductive film, an element selected from aluminum, chromium, copper, tantalum, titanium, molybdenum, or tungsten; an alloy containing any of these elements as a component; or the like can be used. A material including one of manganese, magnesium, zirconium, beryllium, neodymium, and scandium or a combination of any of these elements may be used.

Specifically, for example, it is possible to employ a method in which a thin titanium film (with a thickness of about 5 nm) is formed in a region including the opening of the insulating film 724 by a PVD method and then, an aluminum film is formed so as to be embedded in the opening 725. Here, the titanium film formed by a PVD method has a function of reducing an oxide film (e.g., a native oxide film) formed on a surface over which the titanium film is formed, to decrease the contact resistance with the lower electrode or the like (here, the conductive film 720). In addition, hillock of aluminum film can be prevented. A copper film may be formed by a plating method after the formation of the barrier film of titanium, titanium nitride, or the like.

The conductive film 720 is made in contact with the wiring 726 in the following process. After the conductive film 720 is formed, an opening is formed in the gate insulating film 721 and the insulating film 724. Then, the wiring 726 is formed.

Next, an insulating film 727 is formed so as to cover the wiring 726. Through the series of steps, the semiconductor memory circuit can be manufactured.

Note that in the manufacturing method, the conductive films 719 and 720 functioning as source and drain electrodes are formed after the formation of the oxide semiconductor layer 716. Thus, as illustrated in FIG. 15B, in the first transistor 121 obtained by the manufacturing method, the conductive films 719 and 720 are formed over the oxide semiconductor layer 716. However, in the first transistor 121, the conductive films functioning as source and drain electrodes may be formed below the oxide semiconductor layer 716, that is, between the oxide semiconductor layer 716 and the insulating films 712 and 713.

Figure 16:
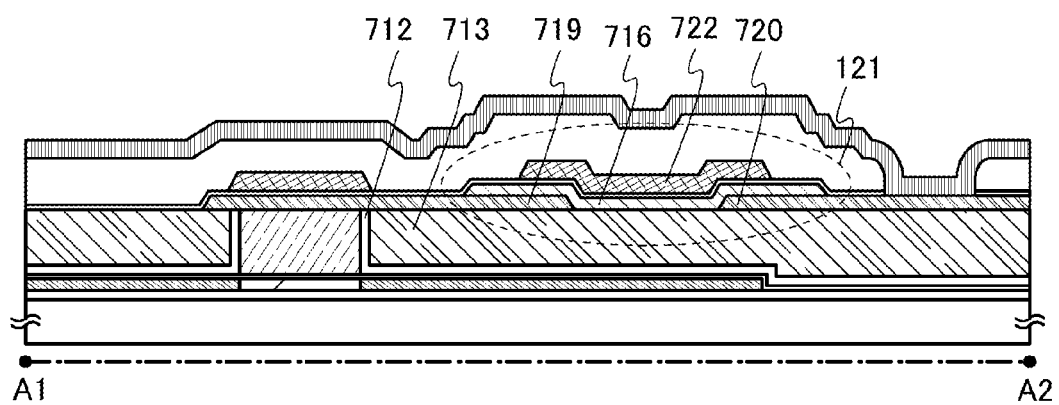
FIG. 16 is a cross-sectional view of the memory circuit.

FIG. 16 illustrates a cross-sectional view of a memory cell at the time when the conductive films 719 and 720 functioning as source and drain electrodes are provided between the oxide semiconductor layer 716 and the insulating films 712 and 713. The first transistor 121 illustrated in FIG. 16 can be obtained in such a manner that the conductive films 719 and 720 are formed after the formation of the insulating film 713, and then, the oxide semiconductor layer 716 is formed.

This embodiment can be implemented in appropriate combination with any of the above embodiments.

In this embodiment, the oxide used for the oxide semiconductor layer in Embodiment 5 will be described. The oxide includes a crystal with c-axis alignment (also referred to as C-Axis Aligned Crystal (CAAC)), which has a triangular or hexagonal atomic arrangement when seen from the direction of an a-b plane, a surface, or an interface. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, an oxide including CAAC means a non-single crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 17A to 17E, FIGS. 18A to 18C, and FIGS. 19A to 19C. In FIGS. 17A to 17E, FIGS. 18A to 18C, and FIGS. 19A to 19C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane).

Figure 17A:
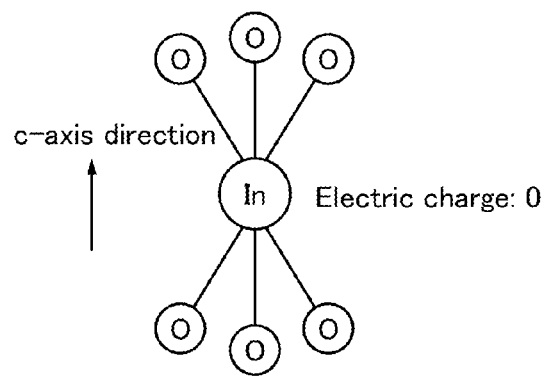
FIGS. 17A to 17E are diagrams showing the structure of an oxide semiconductor material according to one embodiment of the present invention.

FIG. 17A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 17A is actually an octahedral structure, but is illustrated as a planar structure for simplicity. Note that three tetracoordinate O atoms exist in each of an upper half and a lower half in FIG. 17A. In the small group illustrated in FIG. 17A, electric charge is 0.

Figure 17D:
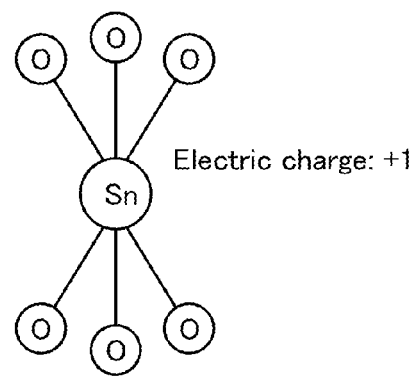
Figure 17B:
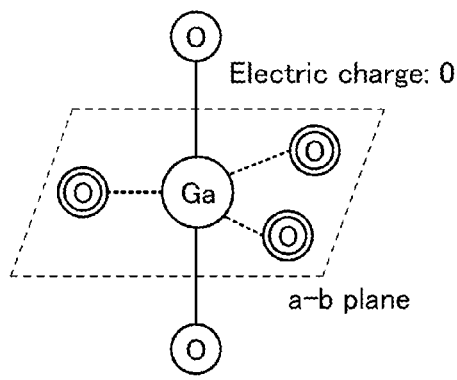

FIG. 17B illustrates a structure including one pentacoordinate Ga atom, three tricoordinate oxygen (hereinafter referred to as tricoordinate 0) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 17B. An In atom can also have the structure illustrated in FIG. 17B because an In atom can have five ligands. In the small group illustrated in FIG. 17B, electric charge is 0.

Figure 17E:
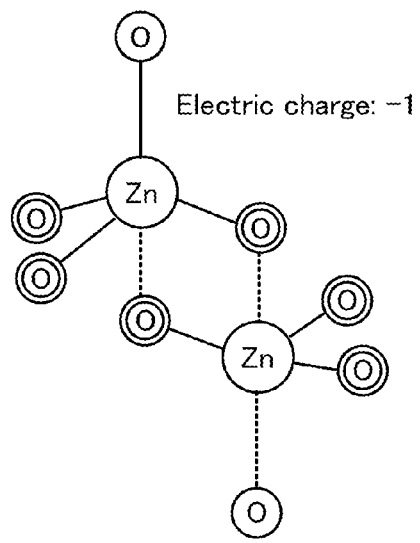
Figure 17C:
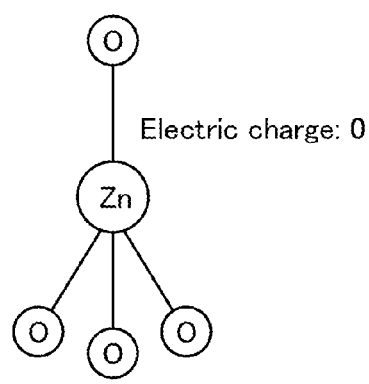

FIG. 17C illustrates a structure including one tetracoordinate Zn atom and four tetracoordinate O atoms proximate to the Zn atom. In FIG. 17C, one tetracoordinate O atom exists in an upper half and three tetracoordinate O atoms exist in a lower half In the small group illustrated in FIG. 17C, electric charge is 0.

FIG. 17D illustrates a structure including one hexacoordinate Sn atom and six tetracoordinate O atoms proximate to the Sn atom. In FIG. 17D, three tetracoordinate O atoms exist in each of an upper half and a lower half In the small group illustrated in FIG. 17D, electric charge is +1.

FIG. 17E illustrates a small group including two Zn atoms. In FIG. 17E, one tetracoordinate O atom exists in each of an upper half and a lower half In the small group illustrated in FIG. 17E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the In atom each have three proximate In atoms in the downward direction, and the three O atoms in the lower half each have three proximate In atoms in the upward direction. The one O atom in the upper half with respect to the Ga atom has one proximate Ga atom in the downward direction, and the one O atom in the lower half has one proximate Ga atom in the upward direction. The one O atom in the upper half with respect to the Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Therefore, when the sum of the number of tetracoordinate O atoms above a metal atom and the number of tetracoordinate O atoms below another metal atom is 4, the two kinds of small groups including the metal atoms can be bonded. This is because in the case, for example, where the hexacoordinate metal (In or Sn) atom is bonded through three tetracoordinate O atoms in the upper half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 18A illustrates a model of a medium group included in a layered structure of an In—Sn—Zn—O-based material. FIG. 18B illustrates a large group including three medium groups. Note that FIG. 18C illustrates an atomic arrangement in the case where the layered structure in FIG. 18B is observed from the c-axis direction.

In FIG. 18A, a tricoordinate O atom is omitted for simplicity, and a tetracoordinate O atoms are illustrated by a circle; the number in the circle shows the number of tetracoordinate O atoms. For example, three tetracoordinate O atoms existing in each of an upper half and a lower half with respect to a Sn atom is denoted by circled 3. Similarly, in FIG. 18A, one tetracoordinate O atom existing in each of an upper half and a lower half with respect to an In atom is denoted by circled 1. FIG. 18A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 18A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 17E can be given. For example, with one small group including two Zn atoms, electric charge of one small group including a Sn atom can be cancelled, so that the total electric charge of the layered structure can be 0.

When the large group illustrated in FIG. 18B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number). It is preferable that m is large because as m increases, the crystallinity of the In—Sn—Zn—O-based crystal is increased.

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

As an example, FIG. 19A illustrates a model of a medium group included in a layered structure of an In—Ga—Zn—O-based material.

In the medium group included in the layered structure of the In—Ga—Zn—O-based material in FIG. 19A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

FIG. 19B illustrates a large group including three medium groups. Note that FIG. 19C illustrates an atomic arrangement in the case where the layered structure in FIG. 19B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 19A but also a medium group in which the arrangement of the In atom, the Ga atom, and the Zn atom is different from that in FIG. 19A.

In this embodiment, the characteristics of a transistor will be described.

The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility $\mu$ can be expressed as the following formula.

$$\mu = \mu_0 \exp\left(-\frac{E}{kT}\right)$$

Here, E represents the height of the potential barrier, k represents the Boltzmann constant, and T represents the absolute temperature. When the potential barrier is assumed to be attributed to a defect, the height E of the potential barrier can be expressed as the following formula according to the Levinson model.

$$E = \frac{e^2 N^2}{8\varepsilon n} = \frac{e^3 N^2 t}{8\varepsilon C_{ox} V_g}$$

Here, e represents the elementary charge, N represents the average defect density per unit area in a channel, $\varepsilon$ represents the permittivity of the semiconductor, n represents the number of carriers per unit area in the channel, $C_{ox}$ represents the capacitance per unit area, $V_g$ represents the gate voltage, and t represents the thickness of the channel. Note that in the case where the thickness of the semiconductor layer is less than or equal to 30 nm, the thickness of the channel may be regarded as being the same as the thickness of the semiconductor layer. The drain current $I_d$ in a linear region can be expressed as the following formula.

$$I_d = \frac{W \mu V_g V_d C_{ox}}{L} \exp\left(-\frac{E}{kT}\right)$$

Here, L represents the channel length and W represents the channel width, and L and W are each 10 p.m. Further, $V_d$ represents the drain voltage. When dividing both sides of the above equation by $V_g$ and then taking logarithms of both sides, the following formula can be obtained.

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8kT\varepsilon C_{ox} V_g}$$

The right side of Formula 5 is a function of $V_g$. From the formula, it is found that the defect density N can be obtained from the slope of a line in which $\ln(I_d/V_g)$ is the ordinate and $1/V_g$ is the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1 \times 10^{12}/\text{cm}^2$.

On the basis of the defect density obtained in this manner, $\mu_0$ can be calculated to be 120 cm²/Vs from Formula 2 and Formula 3. The measured mobility of an In—Sn—Zn oxide including a defect is approximately 35 cm²/Vs. However, assuming that no defect exists inside the semiconductor and at the interface between the semiconductor and an insulating film, the mobility $\mu_0$ of the oxide semiconductor is expected to be 120 cm²/Vs.

Note that even when no defect exists inside a semiconductor, scattering at the interface between a channel and a gate insulating film adversely affects the transport property of the transistor. In other words, the mobility $\mu_1$ at a position that is distance x away from the interface between the channel and the gate insulating film can be expressed as the following formula.

$$\frac{1}{\mu_1} = \frac{1}{\mu_0} + \frac{D}{B} \exp\left(-\frac{x}{l}\right)$$

Here, D represents the electric field in the gate direction, and B and G are constants. B and G can be obtained from actual measurement results; according to the above measurement results, B is 4.75×10⁷ cm/s and G is 10 nm (the depth to which the influence of interface scattering reaches). When D is increased (i.e., when the gate voltage is increased), the second term of Formula 6 is increased and accordingly the mobility $\mu_1$ is decreased.

Figure 20:
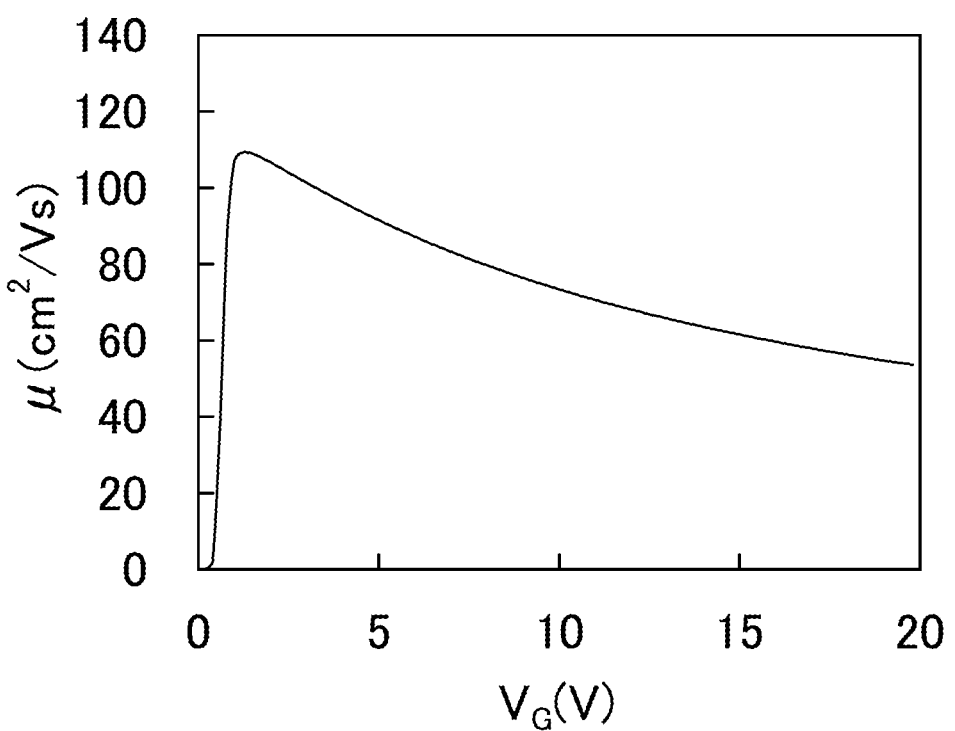
FIG. 20 is a graph showing the gate voltage dependence of mobility obtained by calculation.

FIG. 20 shows calculation results of the mobility $\mu_2$ of a transistor whose channel is formed using an ideal oxide semiconductor without a defect inside the semiconductor. For the calculation, device simulation software Sentaurus Device manufactured by Synopsys, Inc. was used, and the band gap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating film was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 20, the mobility has a peak of 100 cm²/Vs or more at a gate voltage that is a little over 1 V, and is decreased as the gate voltage becomes higher because the influence of interface scattering is increased. Note that in order to reduce interface scattering, it is desirable that a surface of the semiconductor layer be flat at the atomic level (atomic layer flatness).

Calculation results of characteristics of minute transistors which are manufactured using an oxide semiconductor having such a mobility are shown in FIGS. 21A to 21C, FIGS. 22A to 22C, and FIGS. 23A to 23C. FIGS. 24A and 24B illustrate cross-sectional structures of the transistors used for the calculation. The transistors illustrated in FIGS. 24A and 24B each include a semiconductor region 1103a and a semiconductor region 1103c which have $n^+$-type conductivity in an oxide semiconductor layer. The resistivities of the semiconductor region 1103a and the semiconductor region 1103c are $2 \times 10^{-3}$ Ωcm.

The transistor illustrated in FIG. 24A is formed over a base insulating layer 1101 and an embedded insulator 1102 which is embedded in the base insulating layer 1101 and formed of aluminum oxide. The transistor includes the semiconductor region 1103a, the semiconductor region 1103c, an intrinsic semiconductor region 1103b serving as a channel formation region therebetween, and a gate 1105. The width of the gate 1105 is 33 nm.

A gate insulating film 1104 is formed between the gate 1105 and the semiconductor region 1103b. In addition, a sidewall insulator 1106a and a sidewall insulator 1106b are formed on both side surfaces of the gate 1105, and an insulator 1107 is formed over the gate 1105 so as to prevent a short circuit between the gate 1105 and another wiring. The sidewall insulator has a width of 5 nm. A source 1108a and a drain 1108b are provided in contact with the semiconductor region 1103a and the semiconductor region 1103c, respectively. Note that the channel width of this transistor is 40 nm.

The transistor of FIG. 24B is the same as the transistor of FIG. 24A in that it is formed over the base insulating layer 1101 and the embedded insulator 1102 formed of aluminum oxide and that it includes the semiconductor region 1103a, the semiconductor region 1103c, the intrinsic semiconductor region 1103b provided therebetween, the gate 1105 having a width of 33 nm, the gate insulating film 1104, the sidewall insulator 1106a, the sidewall insulator 1106b, the insulator 1107, the source 1108a, and the drain 1108b.

The transistor illustrated in FIG. 24A is different from the transistor illustrated in FIG. 24B in the conductivity type of semiconductor regions under the sidewall insulator 1106a and the sidewall insulator 1106b. In the transistor illustrated in FIG. 24A, the semiconductor regions under the sidewall insulator 1106a and the sidewall insulator 1106b are part of the semiconductor region 1103a having $n^+$-type conductivity and part of the semiconductor region 1103c having $n^+$-type conductivity, whereas in the transistor illustrated in FIG. 24B, the semiconductor regions under the sidewall insulator 1106a and the sidewall insulator 1106b are part of the intrinsic semiconductor region 1103b. In other words, a region having a width of $L_{off}$ which overlaps with neither the semiconductor region 1103a (the semiconductor region 1103c) nor the gate 1105 is provided. This region is called an offset region, and the width $L_{off}$ is called an offset length. As is seen from the drawing, the offset length is equal to the width of the sidewall insulator 1106a (the sidewall insulator 1106b).

Figure 21A:
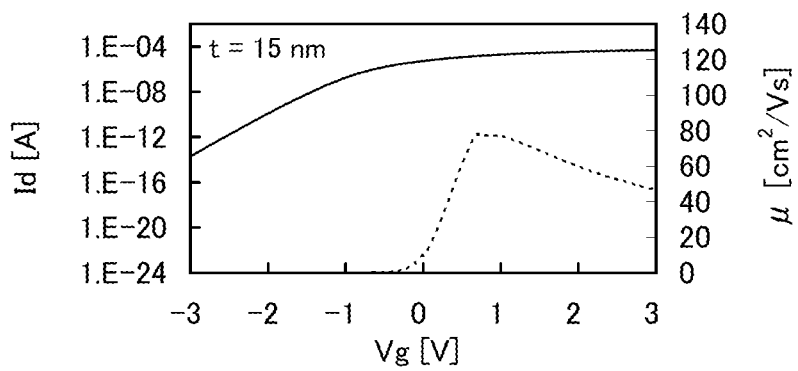
FIGS. 21A to 21C are graphs showing the gate voltage dependence of drain current and mobility obtained by calculation.
Figure 21B:
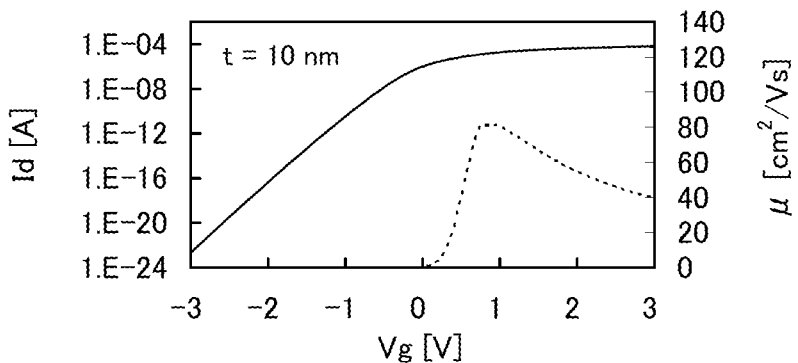
Figure 21C:
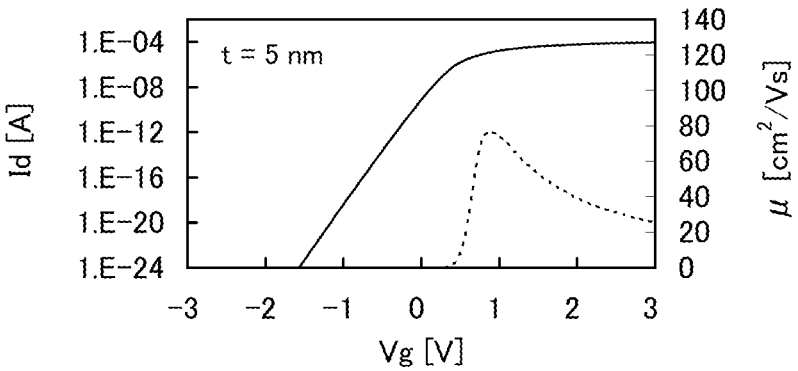

The other parameters used in calculation are as described above. For the calculation, device simulation software Sentaurus Device manufactured by Synopsys, Inc. was used. FIGS. 21A to 21C show the gate voltage ($V_g$: a potential difference between the gate and the source) dependence of the drain current ($I_d$, a solid line) and the mobility (μ, a dotted line) of the transistor having the structure illustrated in FIG. 24A. The drain current $I_d$ is obtained by calculation under the assumption that the drain voltage (a potential difference between the drain and the source) is +1 V and the mobility μ is obtained by calculation under the assumption that the drain voltage is +0.1 V.

FIG. 21A shows the gate voltage dependence of the transistor in the case where the thickness of the gate insulating film is 15 nm, FIG. 21B shows that of the transistor in the case where the thickness of the gate insulating film is 10 nm, and FIG. 21C shows that of the transistor in the case where the thickness of the gate insulating film is 5 nm. As the gate insulating film is thinner, the drain current $I_d$ (off-state current) particularly in an off state is significantly decreased. In contrast, there is no noticeable change in the peak value of the mobility u μ and the drain current $I_d$ in an on state (on-state current). The graphs show that the drain current exceeds 10 μA, which is required in a memory element and the like, at a gate voltage of around 1 V.

Figure 22A:
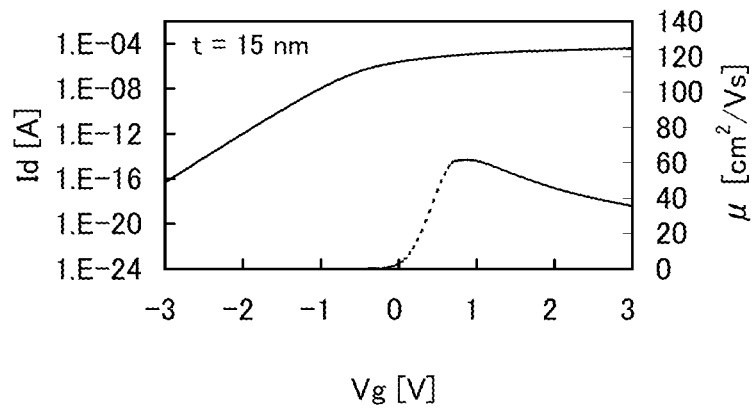
FIGS. 22A to 22C are graphs showing the gate voltage dependence of drain current and mobility obtained by calculation.
Figure 22B:
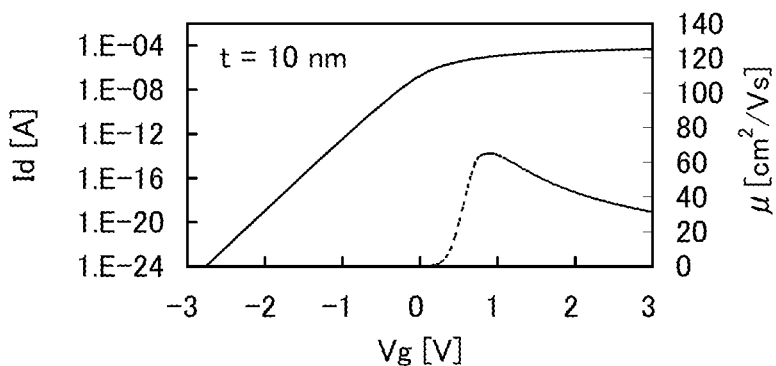
Figure 22C:
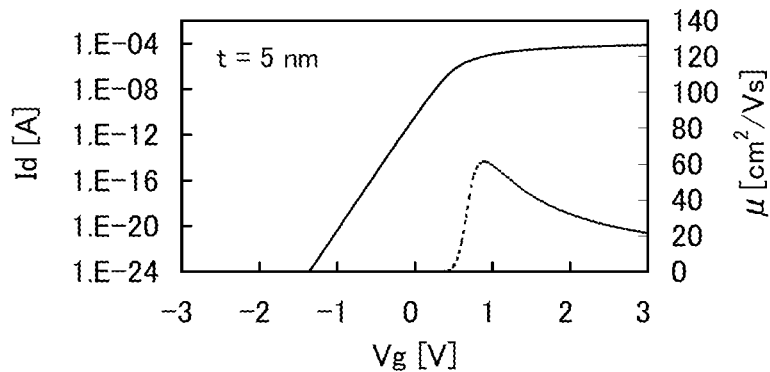

FIGS. 22A to 22C show the gate voltage $V_g$ dependence of the drain current $I_d$ (a solid line) and the mobility μ (a dotted line) of the transistor having the structure illustrated in FIG. 24B where the offset length $L_{off}$ is 5 nm. The drain current $I_d$ is obtained by calculation under the assumption that the drain voltage is +1 V and the mobility μ is obtained by calculation under the assumption that the drain voltage is +0.1 V. FIG. 22A shows the gate voltage dependence of the transistor in the case where the thickness of the gate insulating film is 15 nm, FIG. 22B shows that of the transistor in the case where the thickness of the gate insulating film is 10 nm, and FIG. 22C shows that of the transistor in the case where the thickness of the gate insulating film is 5 nm.

Figure 23A:
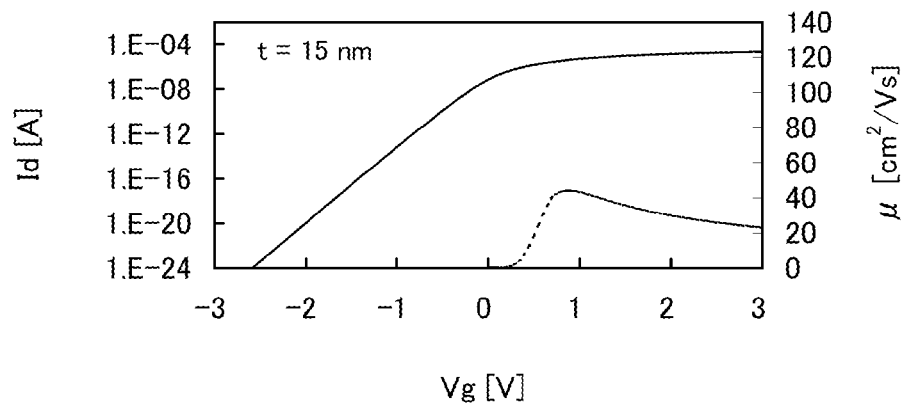
FIGS. 23A to 23C are graphs showing the gate voltage dependence of drain current and mobility obtained by calculation.
Figure 23B:
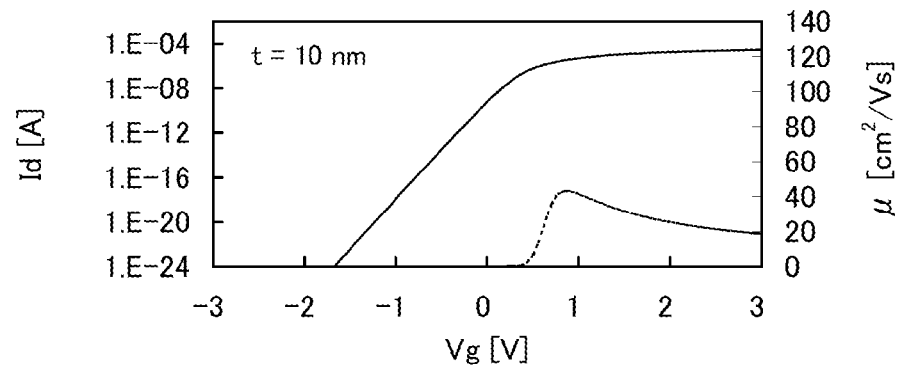
Figure 23C:
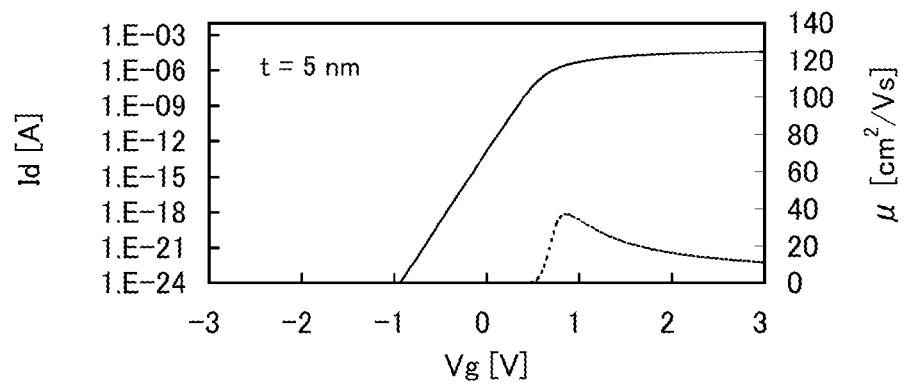
Figure 24A:
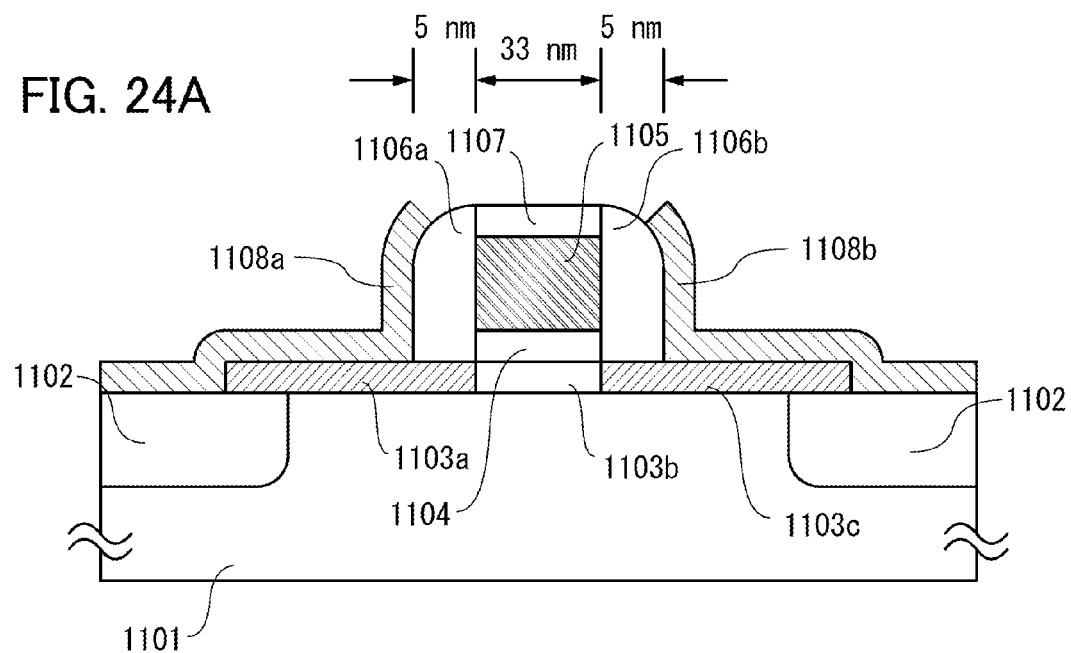
FIGS. 24A and 24B are diagrams showing the cross-sectional structure of a transistor used for calculation.
Figure 24B:
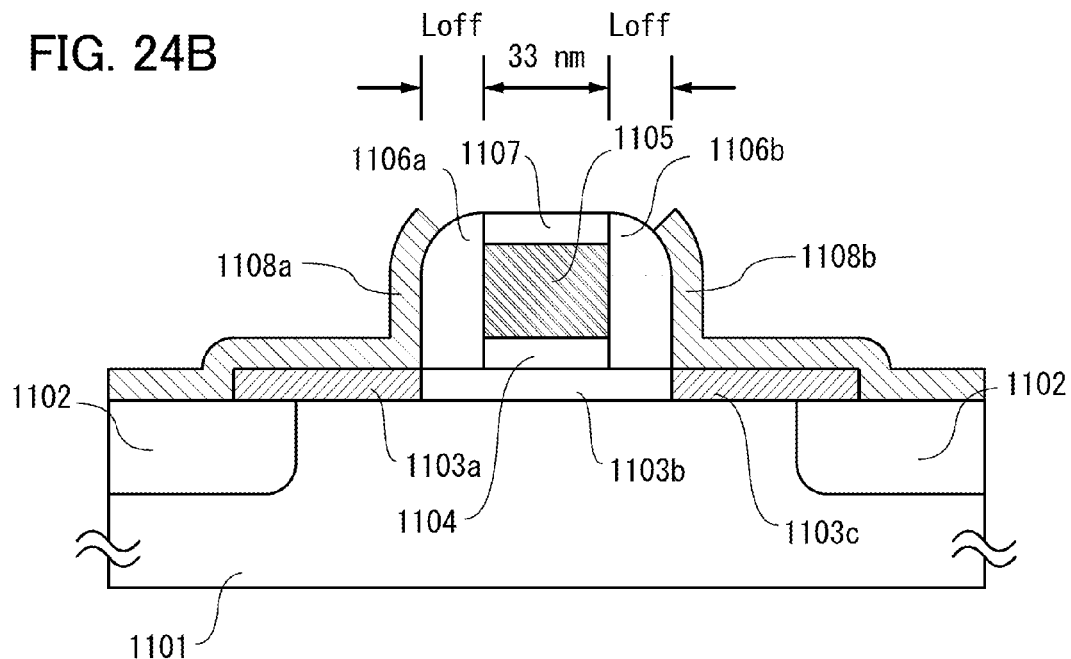

Further, FIGS. 23A to 23C show the gate voltage dependence of the drain current $I_d$ (a solid line) and the mobility μ (a dotted line) of the transistor having the structure illustrated in FIG. 24B where the offset length $L_{off}$ is 15 nm. The drain current $I_d$ is obtained by calculation under the assumption that the drain voltage is +1 V and the mobility μ is obtained by calculation under the assumption that the drain voltage is +0.1 V. FIG. 23A shows the gate voltage dependence of the transistor in the case where the thickness of the gate insulating film is 15 nm, FIG. 23B shows that of the transistor in the case where the thickness of the gate insulating film is 10 nm, and FIG. 23C shows that of the transistor in the case where the thickness of the gate insulating film is 5 nm.

In either of the structures, as the gate insulating film is thinner, the off-state current is significantly decreased, whereas no noticeable change arises in the peak value of the mobility μ and the on-state current.

Note that the peak of the mobility μ is approximately 80 cm²/Vs in FIGS. 21A to 21C, approximately 60 cm²/Vs in FIGS. 22A to 22C, and approximately 40 cm²/Vs in FIGS. 23A to 23C; thus, the peak of the mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA, which is required in a memory element and the like, at a gate voltage of around 1 V.

In this embodiment, a transistor whose channel formation region is in an oxide semiconductor containing In, Sn, and Zn as main components will be described.

A transistor in which an oxide semiconductor including In, Sn, and Zn as main components is used as a channel formation region can have favorable characteristics by depositing the oxide semiconductor while heating a substrate or by performing heat treatment after an oxide semiconductor film is formed. Note that a main component refers to an element included in a composition at 5 atomic % or more.

By intentionally heating the substrate after deposition of the oxide semiconductor film including In, Sn, and Zn as main components, the field-effect mobility of the transistor can be improved. Further, the threshold voltage of the transistor can be positively shifted to make the transistor normally off.

Figure 25A:
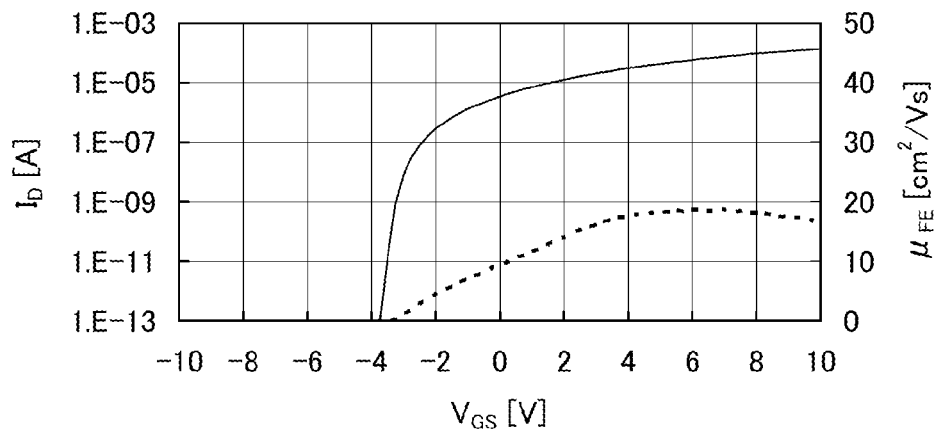
FIGS. 25A to 25C are graphs each showing the characteristics of a transistor having an oxide semiconductor film.
Figure 25B:
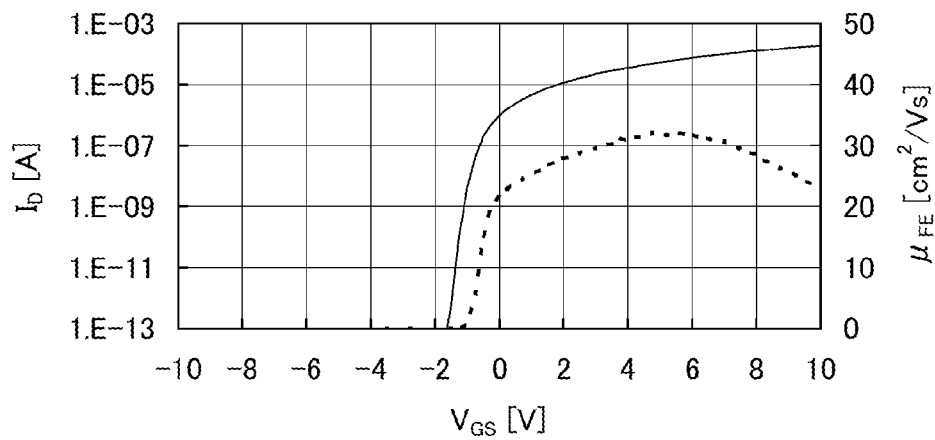
Figure 25C:
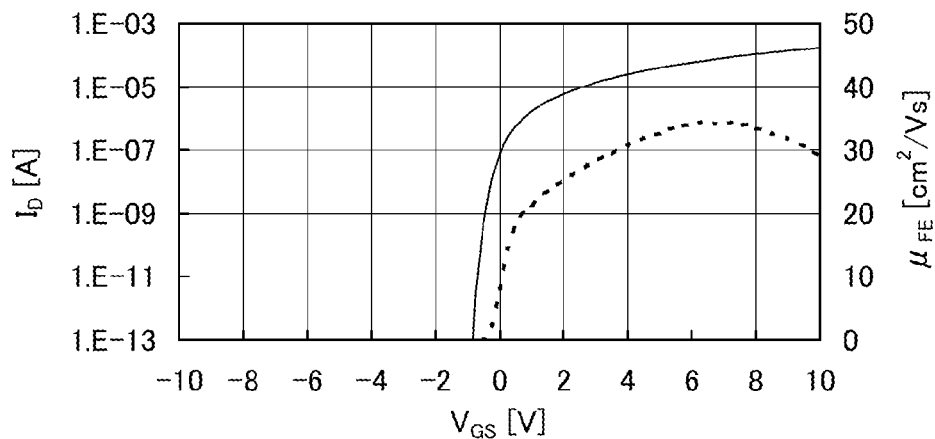

As an example, FIGS. 25A to 25C each show characteristics of a transistor in which an oxide semiconductor film including In, Sn, and Zn as main components and having a channel length L of 3 μm and a channel width W of 10 μm, and a gate insulating film with a thickness of 100 nm are used. Note that $V_d$ was set to 10 V.

FIG. 25A shows characteristics of a transistor whose oxide semiconductor film including In, Sn, and Zn as main components was formed by a sputtering method without heating a substrate intentionally. The field-effect mobility of the transistor is 18.8 cm$^2$/Vsec. On the other hand, when the oxide semiconductor film including In, Sn, and Zn as main components is formed while heating the substrate intentionally, the field-effect mobility can be improved. FIG. 25B shows characteristics of a transistor whose oxide semiconductor film including In, Sn, and Zn as main components was formed while heating a substrate at 200° C. The field-effect mobility of the transistor is 32.2 cm$^2$/Vsec.

The field-effect mobility can be further improved by performing heat treatment after formation of the oxide semiconductor film including In, Sn, and Zn as main components. FIG. 25C shows characteristics of a transistor whose oxide semiconductor film including In, Sn, and Zn as main components was deposited by sputtering at 200° C. and then subjected to heat treatment at 650° C. The field-effect mobility of the transistor is 34.5 cm$^2$/Vsec.

The intentional heating of the substrate is expected to have an effect of reducing moisture taken into the oxide semiconductor film during the deposition by sputtering. Further, the heat treatment after deposition enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor can be crystallized by being highly purified by removal of impurities from the oxide semiconductor. In the case of using such a highly purified non-single-crystal oxide semiconductor, ideally, a peak of a field-effect mobility exceeding 100 cm$^2$/Vsec is expected to be realized.

The oxide semiconductor including In, Sn, and Zn as main components may be crystallized in the following manner: oxygen ions are implanted into the oxide semiconductor, hydrogen, a hydroxyl group, and/or moisture included in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during deposition and/or the heat treatment after the deposition contributes not only to improving field-effect mobility but also to making the transistor normally off. In a transistor in which an oxide semiconductor film that includes In, Sn, and Zn as main components and is formed without heating a substrate intentionally is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 25A and 25B.

Note that the threshold voltage can also be controlled by changing the ratio of In, Sn, and Zn; when the composition ratio of In, Sn, and Zn is 2:1:3, a normally-off transistor is expected to be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When deposition or heat treatment is performed at a high temperature, the transistor can be normally off.

By intentionally heating the substrate during deposition and/or by performing heat treatment after the deposition, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after deposition of an oxide semiconductor film.

First, $V_{gs}$-$I_d$ characteristics of the transistors were measured at a substrate temperature of 25° C. and $V_{ds}$ of 10 V. Then, the substrate temperature was set to 150° C. and $V_{ds}$ was set to 0.1 V. After that, $V_{gs}$ was set to 20 V so that the intensity of an electric field applied to a gate insulating film was 2 MV/cm, and the condition was kept for one hour. Next, $V_{gs}$ was set to 0 V. Then, $V_{gs}$-$I_d$ characteristics of the transistors were measured at a substrate temperature of 25° C. and $V_{ds}$ of 10 V. This process is called a positive BT test.

In a similar manner, first, $V_{gs}$-$I_d$ characteristics of the transistors were measured at a substrate temperature of 25° C. and $V_{ds}$ of 10 V. Then, the substrate temperature was set at 150° C. and $V_{ds}$ was set to 0.1 V. After that, $V_{gs}$ was set to −20 V so that the intensity of an electric field applied to a gate insulating film was −2 MV/cm, and the condition was kept for one hour. Next, $V_{gs}$ was set to 0 V. Then, $V_{gs}$-$I_d$ characteristics of the transistors were measured at a substrate temperature of 25° C. and $V_{ds}$ of 10 V. This process is called a negative BT test.

Figure 26A:
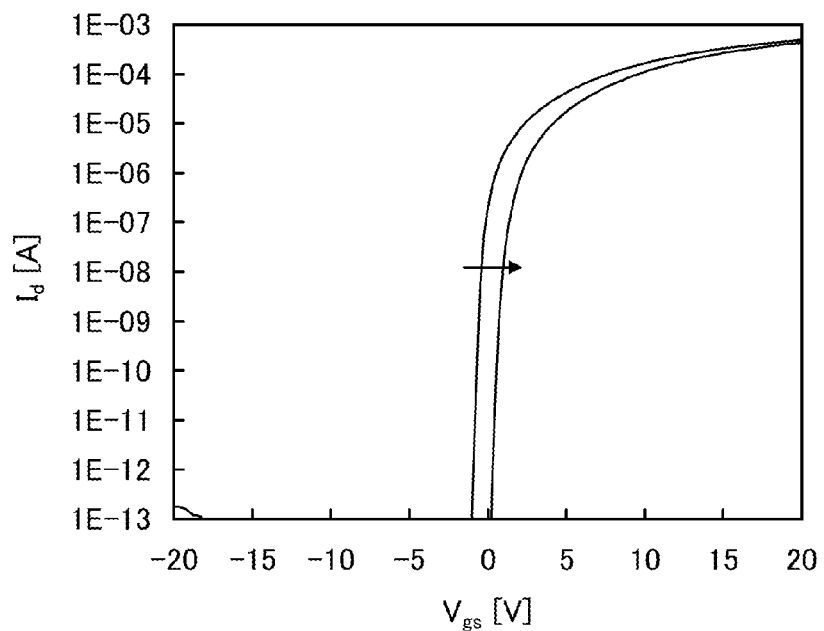
FIGS. 26A and 26B are graphs each showing $V_{gs}$-$I_d$ characteristics of a transistor of Sample 1 that has been subjected to a BT test.
Figure 26B:
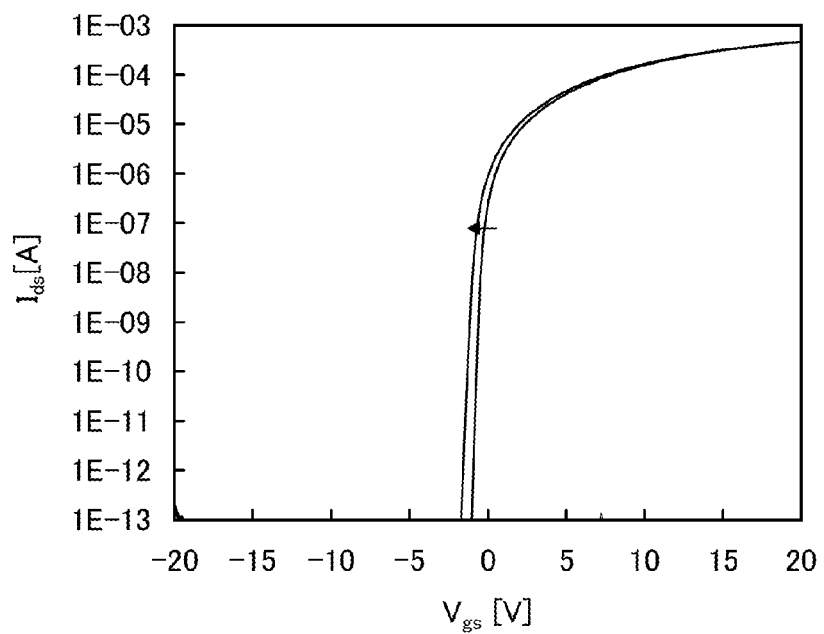
Figure 27A:
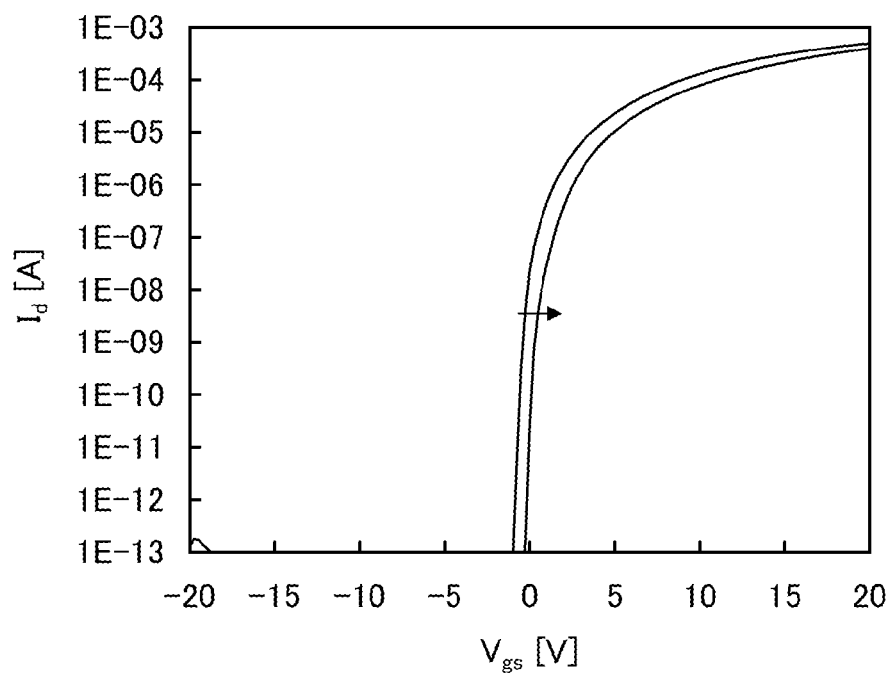
FIGS. 27A and 27B are graphs each showing $V_{gs}$-$I_d$ characteristics of a transistor of Sample 2 that has been subjected to a BT test.
Figure 27B:
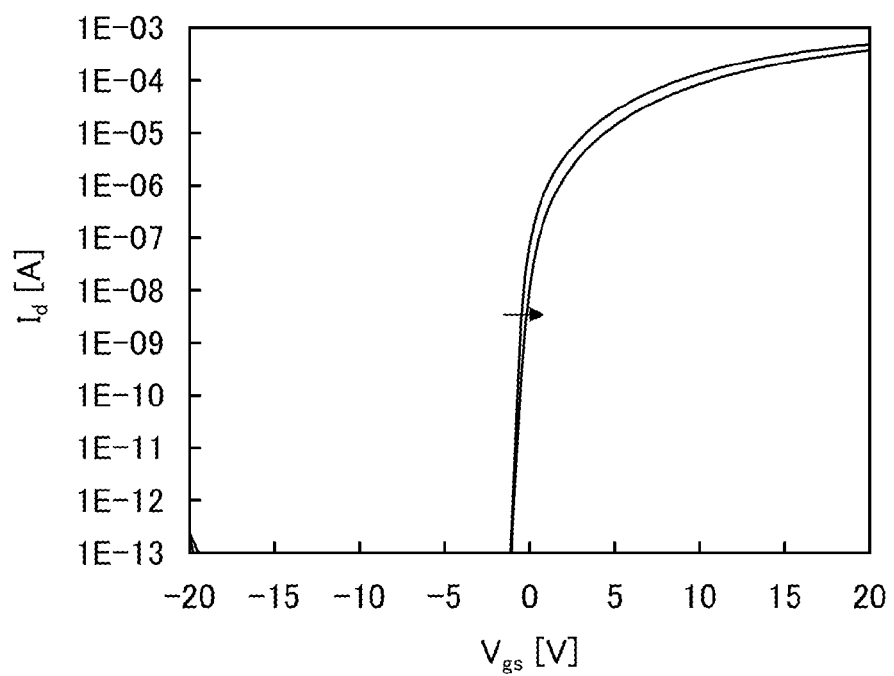

FIGS. 26A and 26B show a result of the positive BT test of Sample 1 and a result of the negative BT test of Sample 1, respectively. FIGS. 27A and 27B show a result of the positive BT test of Sample 2 and a result of the negative BT test of Sample 2, respectively.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability thereof is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a stacked film; however, when excess oxygen is included in the oxide semiconductor by the heat treatment, oxygen deficiency caused constantly can be compensated for with excess oxygen. The excess oxygen is oxygen existing between lattices. When the concentration of excess oxygen is set to higher than or equal to $1\times10^{16}/cm^3$ and lower than or equal to $2\times10^{20}/cm^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target of In:Sn:Zn=1:1:1 [atomic ratio] was used as a target. Note that the substrate heating temperature in deposition was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 28:
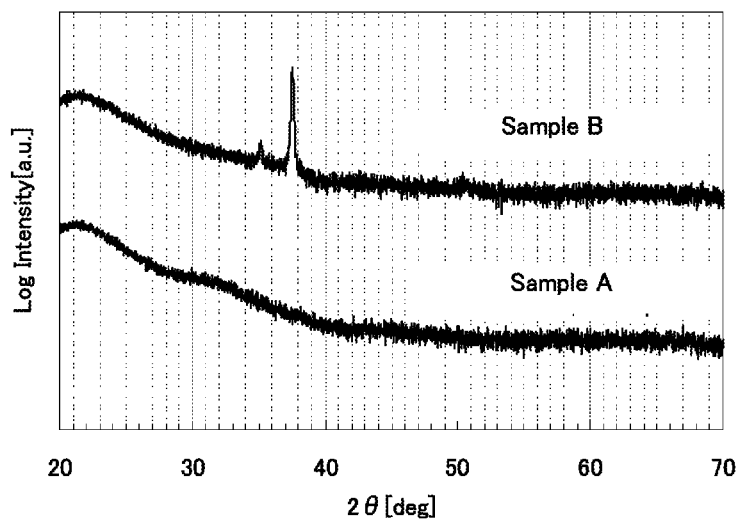
FIG. 28 is a graph showing XRD spectra of Sample A and Sample B.

FIG. 28 shows XRD spectra of Sample A and Sample B. No peak derived from crystal was observed in Sample A, whereas peaks derived from crystal were observed when 28 was around 35 deg. and at 37 deg. to 38 deg. in Sample B.

As described above, by intentionally heating a substrate during deposition of an oxide semiconductor including In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be highly purified by removing hydrogen serving as a donor impurity from the oxide semiconductor, whereby a normally-off transistor can be obtained. The high purification of an oxide semiconductor enables the off-state current of the transistor to be 1 aA/μm or lower. Here, the unit of the off-state current is used to indicate current per micrometer of a channel width.

Figure 29:
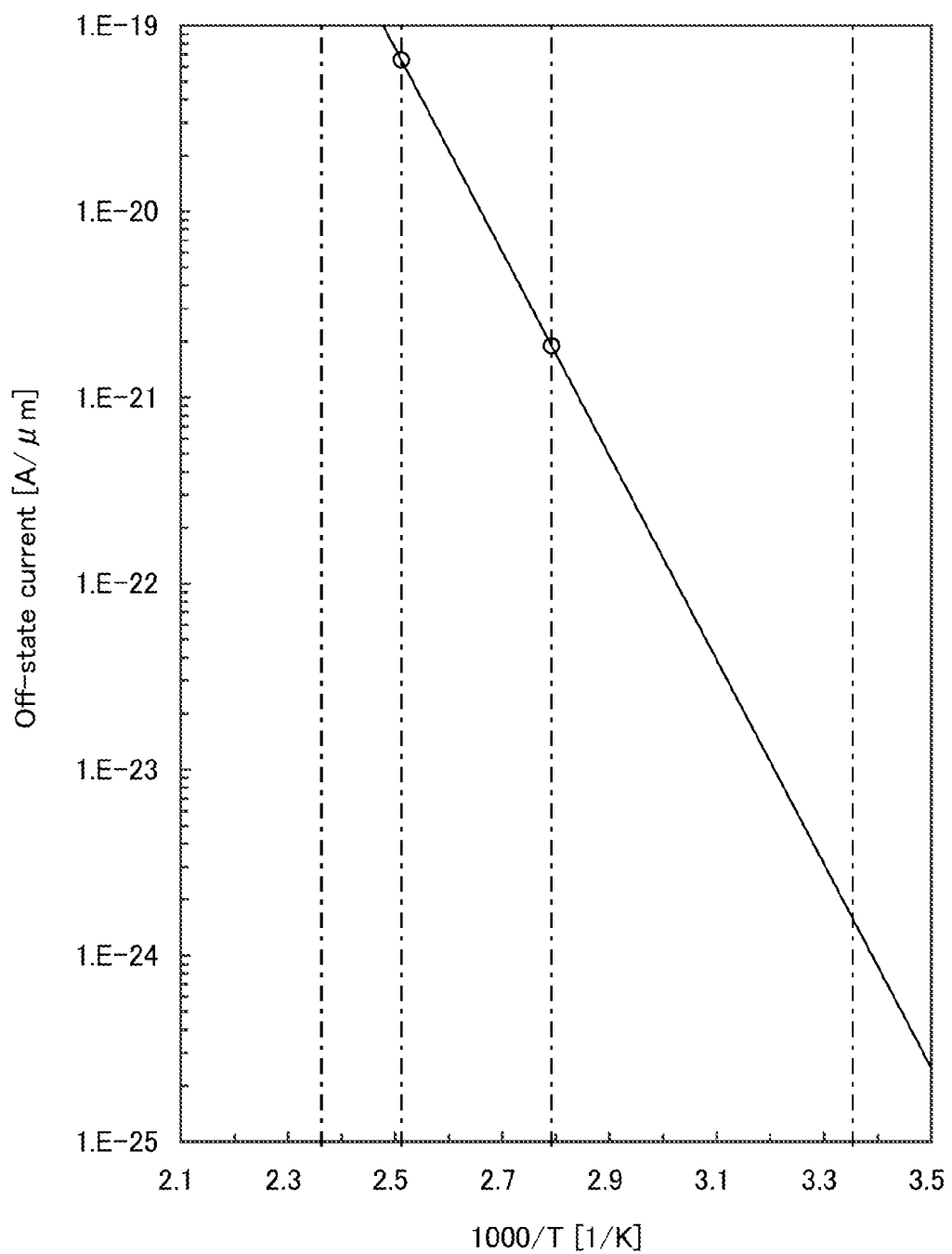
FIG. 29 is a graph showing a relation between the off-state current of a transistor and the substrate temperature in measurement.

FIG. 29 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 29, the off-state current can be 1 aA/μm ($1\times10^{-18}$ A/μm) or lower, 100 zA/μm ($1\times10^{-19}$ A/μm) or lower, and 1 zA/μm ($1\times10^{-21}$ A/μm) or lower when the substrate temperature is 125° C., 85° C., and room temperature (27° C.), respectively. Preferably, the off-state current can be 0.1 aA/μm ($1\times10^{-19}$ A/μm) or lower, 10 zA/μm ($1\times10^{-20}$ A/μm) or lower, and 0.1 zA/μm ($1\times10^{-22}$ A/μm) or lower at 125° C., 85° C., and room temperature, respectively. The above values of off-state currents are clearly much lower than that of the transistor using Si as a semiconductor film.

Note that in order to prevent hydrogen and moisture from being included in the oxide semiconductor film during deposition thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target which is highly purified so as not to include impurities such as hydrogen and moisture. Although it is possible to remove moisture from a film of an oxide semiconductor including In, Sn, and Zn as main components by heat treatment, a film which does not include moisture originally is preferably formed because moisture is released from the oxide semiconductor including In, Sn, and Zn as main components at a higher temperature than from an oxide semiconductor including In, Ga, and Zn as main components.

The relation between the substrate temperature and electric characteristics of a transistor of Sample B, on which heat treatment at 650° C. was performed after formation of the oxide semiconductor film, was evaluated.

The transistor used for the measurement has a channel length L of 3 μm, a channel width W of 10 μm, Lov of 0 μm, and dW of 0 μm. Note that $V_{gs}$ was set to 10 V. Note that the substrate temperature was −40° C., −25° C., 25° C., 75° C., 125° C., and 150° C. Here, in a transistor, the width of a portion where a gate electrode overlaps with one of a pair of electrodes is referred to as Lov, and the width of a portion of the pair of electrodes, which does not overlap with an oxide semiconductor film, is referred to as dW.

Figure 30:
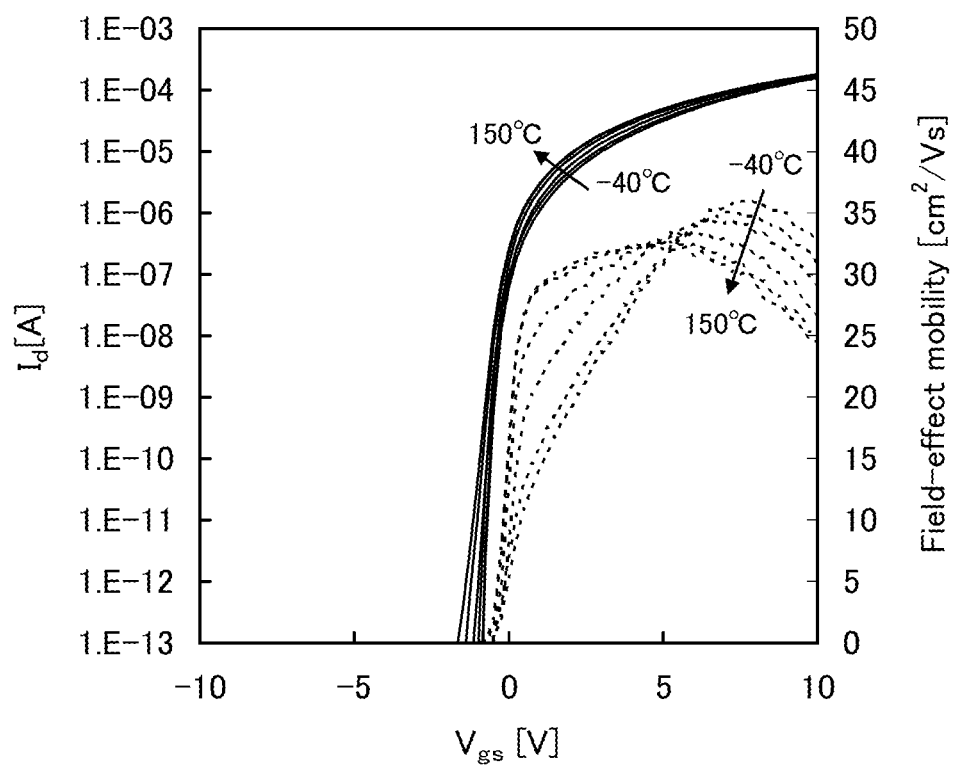
FIG. 30 is a graph showing $V_{gs}$ dependence of $I_d$ and field-effect mobility.
Figure 31A:
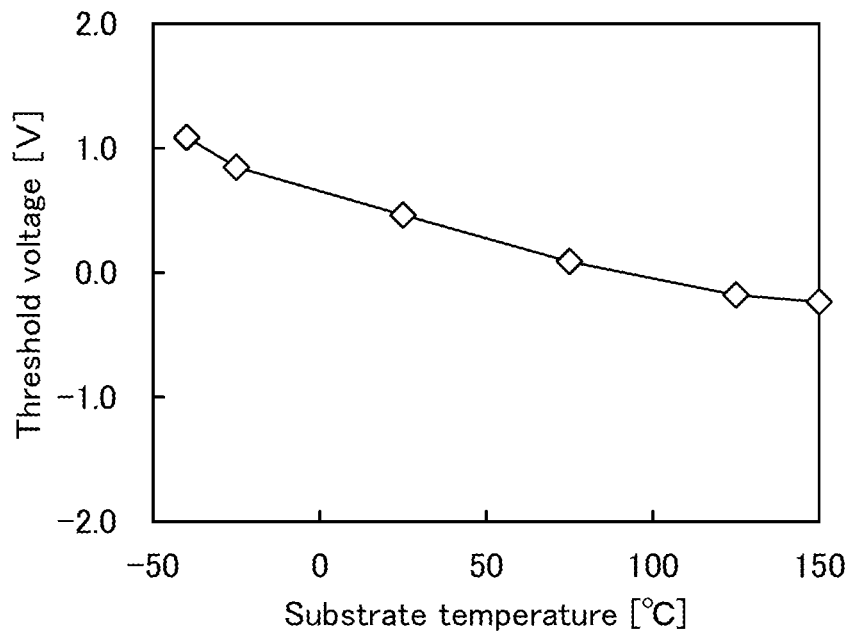
FIG. 31A is a graph showing a relation between substrate temperature and threshold voltage.

FIG. 30 shows the $V_{gs}$ dependence of $I_d$ (a solid line) and field-effect mobility (a dotted line). FIG. 31A shows a relation between the substrate temperature and the threshold voltage, and FIG. 31B shows a relation between the substrate temperature and the field-effect mobility.

From FIG. 31A, it is found that the threshold voltage gets lower as the substrate temperature increases. Note that the threshold voltage is decreased from 1.09 V to −0.23 V in the range from −40° C. to 150° C.

Figure 31B:
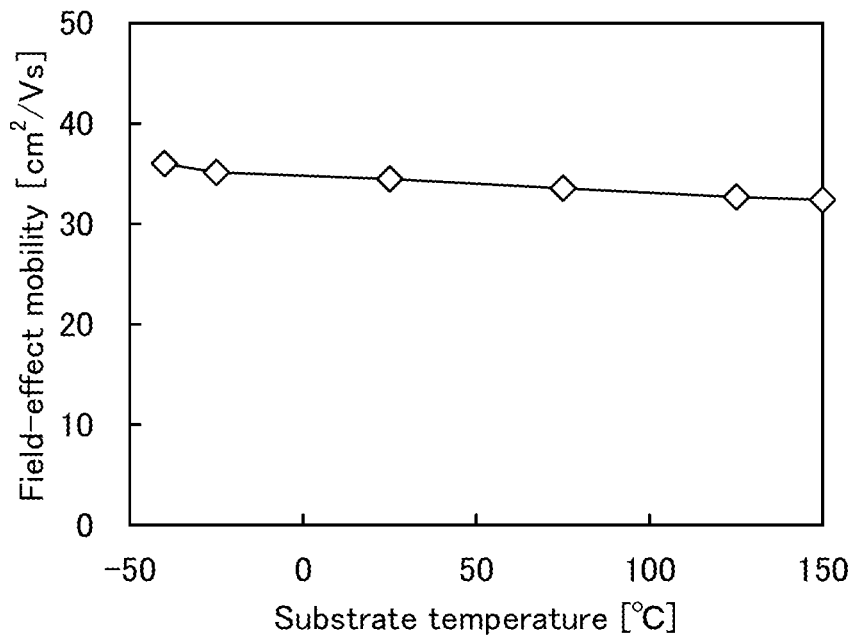
FIG. 31B is a graph showing a relation between substrate temperature and field effect mobility.

From FIG. 31B, it is found that the field-effect mobility gets lower as the substrate temperature increases. Note that the field-effect mobility is decreased from 36 cm$^2$/Vs to 32 cm$^2$/Vs in the range from −40° C. to 150° C. Thus, it is found that variation in electric characteristics is small in the above temperature range.

In a transistor in which such an oxide semiconductor including In, Sn, and Zn as main components is used as a channel formation region, a field-effect mobility of 30 cm²/Vsec or higher, preferably 40 cm²/Vsec or higher, further preferably 60 cm²/Vsec or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electric characteristics can be ensured in a temperature range needed for operation of a transistor. With such characteristics, an integrated circuit having a novel function can be realized without decreasing the operation speed even when a transistor including an oxide semiconductor is also provided in an integrated circuit formed using a Si semiconductor.

Example 1

In this example, an example of a transistor in which an In—Sn—Zn—O film is used as an oxide semiconductor film will be described with reference to FIGS. 32A and 32B and the like.

Figure 32A:
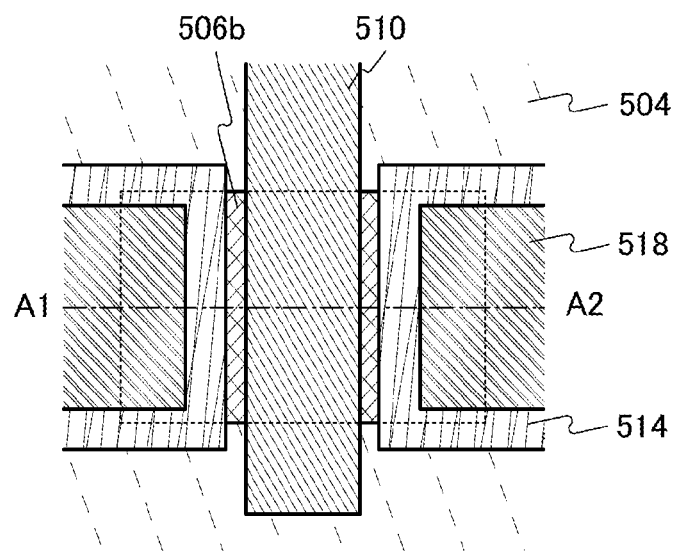
FIGS. 32A and 32B are respectively a top view and a cross-sectional view of a semiconductor device.
Figure 32B:
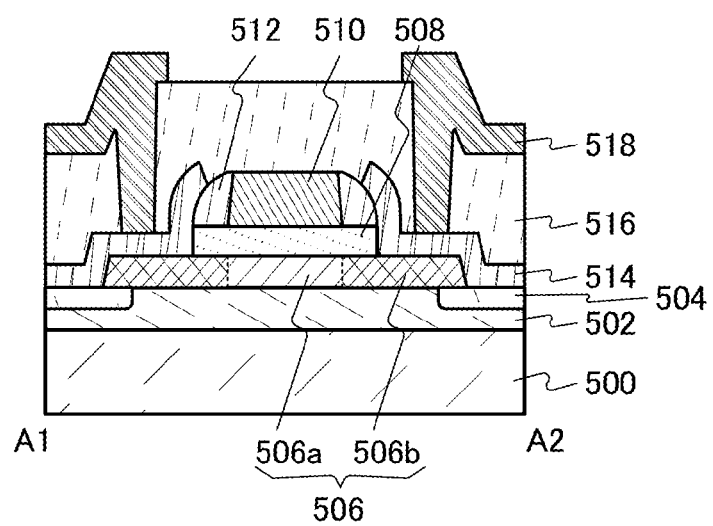

FIGS. 32A and 32B are a top view and a cross-sectional view of a coplanar transistor having a top-gate top-contact structure. FIG. 32A is the top view of the transistor. FIG. 32B illustrates a cross-sectional view along dashed-dotted line A1-A2 in FIG. 32A.

The transistor illustrated in FIG. 32B includes a substrate 500; a base insulating film 502 provided over the substrate 500; a protective insulating film 504 provided in the periphery of the base insulating film 502; an oxide semiconductor film 506 provided over the base insulating film 502 and the protective insulating film 504 and including a high-resistance region 506a and low-resistance regions 506b; a gate insulating film 508 provided over the oxide semiconductor film 506; a gate electrode 510 provided to overlap with the oxide semiconductor film 506 with the gate insulating film 508 positioned therebetween; a sidewall insulating film 512 provided in contact with a side surface of the gate electrode 510; a pair of electrodes 514 provided in contact with at least the low-resistance regions 506b; an interlayer insulating film 516 provided to cover at least the oxide semiconductor film 506, the gate electrode 510, and the pair of electrodes 514; and a wiring 518 provided to be connected to at least one of the pair of electrodes 514 through an opening formed in the interlayer insulating film 516.

Although not illustrated, a protective film may be provided to cover the interlayer insulating film 516 and the wiring 518. With the protective film, a minute amount of leakage current generated by surface conduction of the interlayer insulating film 516 can be reduced and thus the off-state current of the transistor can be reduced.

Example 2

In this example, another example of a transistor in which an In—Sn—Zn—O film is used as an oxide semiconductor film will be described.

Figure 33A:
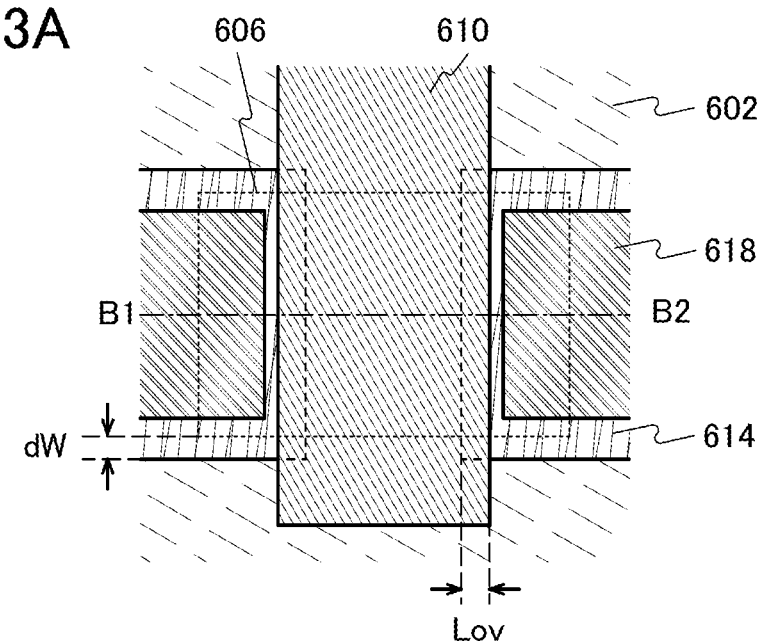
FIGS. 33A and 33B are respectively a top view and a cross-sectional view of a semiconductor device.
Figure 33B:
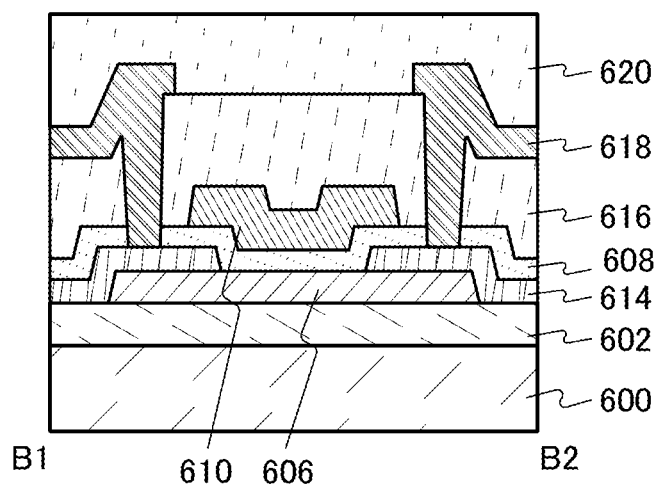

FIGS. 33A and 33B are a top view and a cross-sectional view which illustrate a structure of a transistor fabricated in this embodiment. FIG. 33A is the top view of the transistor. FIG. 33B is a cross-sectional view along dashed-dotted line B1-B2 in FIG. 33A.

The transistor illustrated in FIG. 33B includes a substrate 600; a base insulating film 602 provided over the substrate 600; an oxide semiconductor film 606 provided over the base insulating film 602; a pair of electrodes 614 in contact with the oxide semiconductor film 606; a gate insulating film 608 provided over the oxide semiconductor film 606 and the pair of electrodes 614; a gate electrode 610 provided to overlap with the oxide semiconductor film 606 with the gate insulating film 608 positioned therebetween; an interlayer insulating film 616 provided to cover the gate insulating film 608 and the gate electrode 610; wirings 618 connected to the pair of electrodes 614 through openings formed in the interlayer insulating film 616; and a protective film 620 provided to cover the interlayer insulating film 616 and the wirings 618.

As the substrate 600, a glass substrate can be used. As the base insulating film 602, a silicon oxide film can be used. As the oxide semiconductor film 606, an In—Sn—Zn—O film can be used. As the pair of electrodes 614, a tungsten film can be used. As the gate insulating film 608, a silicon oxide film can be used. The gate electrode 610 can have a layered structure of a tantalum nitride film and a tungsten film. The interlayer insulating film 616 can have a layered structure of a silicon oxynitride film and a polyimide film. The wirings 618 can each have a layered structure in which a titanium film, an aluminum film, and a titanium film are formed in this order. As the protective film 620, a polyimide film can be used.

Note that in the transistor having the structure illustrated in FIG. 33A, the width of a portion where the gate electrode 610 overlaps with one of the pair of electrodes 614 is referred to as Lov. Similarly, the width of a portion of the pair of electrodes 614, which does not overlap with the oxide semiconductor film 606, is referred to as d W.

This application is based on Japanese Patent Application serial no. 2011-027114 filed with Japan Patent Office on Feb. 10, 2011, and Japanese Patent Application serial No. 2011-113252 filed with Japan Patent Office on May 20, 2011, the entire contents of which are hereby incorporated by reference.

What is claimed is:

1. A semiconductor device comprising:
a volatile memory section; and
a nonvolatile memory section comprising:
    a first transistor;
    a second transistor; and
    a reset circuit,
wherein a gate of the second transistor is electrically connected to one of a source and a drain of the first transistor, and
wherein the reset circuit is configured to input an electrical potential which turns off the second transistor to the gate of the second transistor.

2. The semiconductor device according to claim 1,
wherein the volatile memory section is configured to hold a data signal, and
wherein the nonvolatile memory section is configured to hold the data signal while supply of power to the semiconductor device is stopped.

3. The semiconductor device according to claim 1, further comprising a selector circuit,
wherein a data input terminal of the volatile memory section is electrically connected to a data input terminal of the nonvolatile memory section,
wherein a data output terminal of the volatile memory section and a data output terminal of the nonvolatile memory section are electrically connected to the selector circuit, and
wherein the data input terminal of the nonvolatile memory section is electrically connected to the other of the source and the drain of the first transistor.

4. The semiconductor device according to claim 3, further comprising a third transistor and a fourth transistor,
wherein a gate of the third transistor is electrically connected to a gate of the fourth transistor,
wherein one of a source and a drain of the third transistor is electrically connected to one of a source and a drain of the second transistor,
wherein the other of the source and the drain of the third transistor is electrically connected to one of a source and a drain of the fourth transistor,
wherein the other of the source and the drain of the third transistor is electrically connected to the data output terminal of the nonvolatile memory section,
wherein a first control signal is inputted to the gate of the third transistor and the gate of the fourth transistor, and
wherein a second control signal is inputted to the gate of the first transistor.

5. The semiconductor device according to claim 1, further comprising a capacitor,
wherein the capacitor is electrically connected to the gate of the second transistor.

6. The semiconductor device according to claim 1, wherein the nonvolatile memory section is configured to hold a data signal between the one of the source and the drain of the first transistor and the gate of the second transistor while supply of power to the semiconductor device is stopped.

7. The semiconductor device according to claim 4, further comprising a switching circuit,
wherein the switching circuit is configured to break electrical continuity between the data input terminal of the nonvolatile memory section and the other of the source and the drain of the first transistor.

8. The semiconductor device according to claim 7, wherein the switching circuit comprises a logic circuit supplied with the first control signal and the second control signal, and an analog switch turned on or off by the logic circuit.

9. The semiconductor device according to claim 4, wherein the reset circuit comprises a logic circuit supplied with the first control signal and the second control signal, and an analog switch turned on or off by the logic circuit.

10. The semiconductor device according to claim 4,
wherein the selector circuit comprises a logic circuit supplied with the first control signal and the second control signal, a first analog switch and a second analog switch.

11. The semiconductor device according to claim 1, wherein the first transistor comprises a channel formation region comprising an oxide semiconductor.

12. The semiconductor device according to claim 1, wherein the second transistor comprises a channel formation region comprising silicon.

13. The semiconductor device according to claim 1, wherein the second transistor forms a layered structure with the first transistor.

14. A signal processing unit comprising:
the semiconductor device according to claim 1; and
an arithmetic unit transmitting and receiving data to/from the semiconductor device.

15. A semiconductor device comprising:
a flip-flop circuit;
a selector circuit;
a first transistor;
a second transistor;
a third transistor;
a fourth transistor;
a first switch; and
a second switch,
wherein an input terminal of the flip-flop circuit is electrically connected to one of a source and a drain of the first transistor through the first switch,
wherein an output terminal of the flip-flop circuit is electrically connected to the selector circuit,
wherein the other of the source and the drain of the first transistor is electrically connected to a gate of the second transistor,
wherein a gate of the third transistor is electrically connected to a gate of the fourth transistor,
wherein one of a source and a drain of the third transistor is electrically connected to one of a source and a drain of the second transistor,
wherein the other of the source and the drain of the third transistor is electrically connected to one of a source and a drain of the fourth transistor,
wherein the other of the source and the drain of the third transistor is electrically connected to the selector circuit, and
wherein the one of the source and the drain of the first transistor is electrically connected to the other of the source and the drain of the second transistor through the second switch.

16. The semiconductor device according to claim 15, further comprising a capacitor,
wherein the capacitor is electrically connected to the gate of the second transistor.

17. The semiconductor device according to claim 15,
wherein a data signal is input to the input terminal of the flip-flop circuit,
wherein a first control signal is input to the gate of the third transistor and the gate of the fourth transistor,
wherein a second control signal is input to the gate of the first transistor,
wherein the first switch is controlled by the first control signal and the second control signal, and
wherein the second switch is controlled by the first control signal and the second control signal.

18. The semiconductor device according to claim 15,
wherein the first transistor comprises a channel formation region comprising an oxide semiconductor.

19. The semiconductor device according to claim 15, wherein the second transistor comprises a channel formation region comprising silicon.

20. The semiconductor device according to claim 15, wherein the second transistor forms a layered structure with the first transistor.

21. A central processing unit comprising:
the semiconductor device according to claim 15, and
an arithmetic logic unit transmitting and receiving data to/from the semiconductor device.

* * * * *